US011189595B2

(12) United States Patent
Chau et al.

(10) Patent No.: US 11,189,595 B2
(45) Date of Patent: Nov. 30, 2021

(54) PACKAGE-ON-PACKAGE ASSEMBLY WITH WIRE BOND VIAS

(71) Applicant: Invensas Corporation, San Jose, CA (US)

(72) Inventors: Ellis Chau, San Jose, CA (US); Reynaldo Co, Santa Cruz, CA (US); Roseann Alatorre, San Jose, CA (US); Philip Damberg, Cupertino, CA (US); Wei-Shun Wang, Palo Alto, CA (US); Se Young Yang, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/999,601

(22) Filed: Aug. 21, 2020

(65) Prior Publication Data

US 2021/0035948 A1 Feb. 4, 2021

Related U.S. Application Data

(60) Continuation of application No. 15/699,288, filed on Sep. 8, 2017, now Pat. No. 10,756,049, which is a (Continued)

(51) Int. Cl.

*H01L 23/00* (2006.01)
*H01L 23/31* (2006.01)

(Continued)

(52) U.S. Cl.

CPC .......... *H01L 24/85* (2013.01); *H01L 21/4853* (2013.01); *H01L 21/56* (2013.01);

(Continued)

(58) Field of Classification Search

CPC ........................................................ H01L 24/85

See application file for complete search history.

(56) References Cited

U.S. PATENT DOCUMENTS 2,230,663 A 2/1941 Alden
3,289,452 A 12/1966 Koellner (Continued)

FOREIGN PATENT DOCUMENTS

CN 1352804 A 6/2002
CN 1641832 A 7/2005

(Continued)

OTHER PUBLICATIONS

"EE Times Asia" [online]. [Retrieved Aug. 5, 2010]. Retrieved from internet. <http://www.eetasia.com/ART_8800428222_480300_nt_dec52276.HTM>, 4 pages.

(Continued)

*Primary Examiner* — Yu-Hsi D Sun

(74) *Attorney, Agent, or Firm* — Lerner, David, Littenberg, Krumholz & Mentlik, LLP

(57) ABSTRACT

A microelectronic package includes a substrate having a first surface. A microelectronic element overlies the first surface. Electrically conductive elements are exposed at the first surface of the substrate, at least some of which are electrically connected to the microelectronic element. The package includes wire bonds having bases bonded to respective ones of the conductive elements and ends remote from the substrate and remote from the bases. The ends of the wire bonds are defined on tips of the wire bonds, and the wire bonds define respective first diameters between the bases and the tips thereof. The tips have at least one dimension that is smaller than the respective first diameters of the wire bonds. A dielectric encapsulation layer covers portions of the wire bonds, and unencapsulated portions of the wire bonds are defined by portions of the wire bonds, including the ends, are uncovered by the encapsulation layer.

20 Claims, 32 Drawing Sheets

1235
1246

Related U.S. Application Data continuation of application No. 14/718,719, filed on May 21, 2015, now Pat. No. 9,761,558, which is a division of application No. 13/795,811, filed on Mar. 12, 2013, now Pat. No. 9,041,227, which is a continuation of application No. 13/404,408, filed on Feb. 24, 2012, now Pat. No. 9,105,483.

(60) Provisional application No. 61/547,930, filed on Oct. 17, 2011.

(51) Int. Cl.

| | |
|---|---|
| ***H01L 23/498*** | (2006.01) |
| ***H01L 21/56*** | (2006.01) |
| ***H01L 25/10*** | (2006.01) |
| ***H01L 25/00*** | (2006.01) |
| ***H01L 23/495*** | (2006.01) |
| ***H01L 21/48*** | (2006.01) |
| ***H01L 23/367*** | (2006.01) |
| ***H01L 23/433*** | (2006.01) |
| *H01L 25/065* | (2006.01) |
| *H05K 3/34* | (2006.01) |

(52) U.S. Cl.

CPC ...... *H01L 23/3128* (2013.01); *H01L 23/3677* (2013.01); *H01L 23/4334* (2013.01); *H01L 23/49517* (2013.01); *H01L 23/49811* (2013.01); *H01L 23/49816* (2013.01); *H01L 24/06* (2013.01); *H01L 24/43* (2013.01); *H01L 24/78* (2013.01); *H01L 25/105* (2013.01); *H01L 25/50* (2013.01); *H01L 21/565* (2013.01); *H01L 23/3114* (2013.01); *H01L 24/16* (2013.01); *H01L 24/45* (2013.01); *H01L 24/48* (2013.01); *H01L 24/49* (2013.01); *H01L 24/73* (2013.01); *H01L 25/0655* (2013.01); *H01L 25/0657* (2013.01); *H01L 2224/0401* (2013.01); *H01L 2224/05599* (2013.01); *H01L 2224/131* (2013.01); *H01L 2224/16145* (2013.01); *H01L 2224/16225* (2013.01); *H01L 2224/16227* (2013.01); *H01L 2224/32145* (2013.01); *H01L 2224/32225* (2013.01); *H01L 2224/32245* (2013.01); *H01L 2224/45015* (2013.01); *H01L 2224/4554* (2013.01); *H01L 2224/45124* (2013.01); *H01L 2224/45144* (2013.01); *H01L 2224/45147* (2013.01); *H01L 2224/45565* (2013.01); *H01L 2224/4824* (2013.01); *H01L 2224/48091* (2013.01); *H01L 2224/48145* (2013.01); *H01L 2224/48227* (2013.01); *H01L 2224/48245* (2013.01); *H01L 2224/48247* (2013.01); *H01L 2224/48997* (2013.01); *H01L 2224/49171* (2013.01); *H01L 2224/73204* (2013.01); *H01L 2224/73207* (2013.01); *H01L 2224/73253* (2013.01); *H01L 2224/73257* (2013.01); *H01L 2224/73265* (2013.01); *H01L 2224/78301* (2013.01); *H01L 2224/851* (2013.01); *H01L 2224/8518* (2013.01); *H01L 2224/85399* (2013.01); *H01L 2224/85951* (2013.01); *H01L 2224/85986* (2013.01); *H01L 2225/0651* (2013.01); *H01L 2225/06506* (2013.01); *H01L 2225/06513* (2013.01); *H01L 2225/06517* (2013.01); *H01L 2225/06558* (2013.01); *H01L 2225/06562* (2013.01); *H01L 2225/06565* (2013.01); *H01L 2225/06568* (2013.01); *H01L 2225/1023* (2013.01); *H01L 2225/1029* (2013.01); *H01L 2225/1052* (2013.01); *H01L 2225/1058* (2013.01); *H01L 2225/1088* (2013.01); *H01L 2225/1094* (2013.01); *H01L 2924/00011* (2013.01); *H01L 2924/00012* (2013.01); *H01L 2924/00014* (2013.01); *H01L 2924/01013* (2013.01); *H01L 2924/01028* (2013.01); *H01L 2924/01029* (2013.01); *H01L 2924/01047* (2013.01); *H01L 2924/01049* (2013.01); *H01L 2924/12042* (2013.01); *H01L 2924/1431* (2013.01); *H01L 2924/1434* (2013.01); *H01L 2924/15311* (2013.01); *H01L 2924/15331* (2013.01); *H01L 2924/1715* (2013.01); *H01L 2924/181* (2013.01); *H01L 2924/1815* (2013.01); *H01L 2924/19107* (2013.01); *H01L 2924/3511* (2013.01); *H05K 3/3436* (2013.01); *H05K 2201/1053* (2013.01); *H05K 2201/10515* (2013.01); *Y10T 29/49149* (2015.01); *Y10T 29/49151* (2015.01)

(56) References Cited

U.S. PATENT DOCUMENTS

| | | | |
|---|---|---|---|
| 3,358,897 | A | 12/1967 | Christensen |
| 3,430,835 | A | 3/1969 | Grable et al. |
| 3,623,649 | A | 11/1971 | Keisling |
| 3,795,037 | A | 3/1974 | Luttmer |
| 3,900,153 | A | 8/1975 | Beerwerth et al. |
| 4,067,104 | A | 1/1978 | Tracy |
| 4,072,816 | A | 2/1978 | Gedney et al. |
| 4,213,556 | A | 7/1980 | Persson et al. |
| 4,327,860 | A | 5/1982 | Kirshenboin et al. |
| 4,422,568 | A | 12/1983 | Elles et al. |
| 4,437,604 | A | 3/1984 | Razon et al. |
| 4,604,644 | A | 8/1986 | Beckham et al. |
| 4,642,889 | A | 2/1987 | Grabbe |
| 4,667,267 | A | 5/1987 | Hernandez et al. |
| 4,695,870 | A | 9/1987 | Patraw |
| 4,716,049 | A | 12/1987 | Patraw |
| 4,725,692 | A | 2/1988 | Ishii et al. |
| 4,771,930 | A | 9/1988 | Gillotti et al. |
| 4,793,814 | A | 12/1988 | Zifcak et al. |
| 4,804,132 | A | 2/1989 | DiFrancesco |
| 4,845,354 | A | 7/1989 | Gupta et al. |
| 4,902,600 | A | 2/1990 | Tamagawa et al. |
| 4,924,353 | A | 5/1990 | Patraw |
| 4,925,083 | A | 5/1990 | Farassat et al. |
| 4,955,523 | A | 9/1990 | Carlommagno et al. |
| 4,975,079 | A | 12/1990 | Beaman et al. |
| 4,982,265 | A | 1/1991 | Watanabe et al. |
| 4,998,885 | A | 3/1991 | Beaman |
| 4,999,472 | A | 3/1991 | Neinast et al. |
| 5,067,007 | A | 11/1991 | Otsuka et al. |
| 5,067,382 | A | 11/1991 | Zimmerman et al. |
| 5,083,697 | A | 1/1992 | Difrancesco |
| 5,095,187 | A | 3/1992 | Gliga |
| 5,133,495 | A | 7/1992 | Angulas et al. |
| 5,138,438 | A | 8/1992 | Masayuki et al. |
| 5,148,265 | A | 9/1992 | Khandros et al. |
| 5,148,266 | A | 9/1992 | Khandros et al. |
| 5,186,381 | A | 2/1993 | Kim |
| 5,189,505 | A | 2/1993 | Bartelink |
| 5,196,726 | A | 3/1993 | Nishiguchi et al. |
| 5,203,075 | A | 4/1993 | Angulas et al. |
| 5,214,308 | A | 5/1993 | Nishiguchi et al. |
| 5,220,489 | A | 6/1993 | Barreto et al. |
| 5,222,014 | A | 6/1993 | Lin |
| 5,238,173 | A | 8/1993 | Ura et al. |
| 5,241,454 | A | 8/1993 | Ameen et al. |
| 5,241,456 | A | 8/1993 | Marcinkiewicz et al. |
| 5,316,788 | A | 5/1994 | Dibble et al. |
| 5,340,771 | A | 8/1994 | Rostoker |
| 5,346,118 | A | 9/1994 | Degani et al. |
| 5,371,654 | A | 12/1994 | Beaman et al. |
| 5,397,997 | A | 3/1995 | Tuckerman et al. |
| 5,438,224 | A | 8/1995 | Papageorge et al. |

(56) References Cited

U.S. PATENT DOCUMENTS 5,455,390 A 10/1995 DiStefano et al.
5,468,995 A 11/1995 Higgins, III
5,476,211 A 12/1995 Khandros
5,494,667 A 2/1996 Uchida et al.
5,495,667 A 3/1996 Farnworth et al.
5,518,964 A 5/1996 DiStefano et al.
5,531,022 A 7/1996 Beaman et al.
5,536,909 A 7/1996 DiStefano et al.
5,541,567 A 7/1996 Fogel et al.
5,571,428 A 11/1996 Nishimura et al.
5,578,869 A 11/1996 Hoffman et al.
5,608,265 A 3/1997 Kitano et al.
5,615,824 A 4/1997 Fjelstad et al.
5,616,952 A 4/1997 Nakano et al.
5,635,846 A 6/1997 Beaman et al.
5,656,550 A 8/1997 Tsuji et al.
5,659,952 A 8/1997 Kovac et al.
5,679,977 A 10/1997 Khandros et al.
5,688,716 A 11/1997 DiStefano et al.
5,718,361 A 2/1998 Braun et al.
5,726,493 A 3/1998 Yamashita et al.
5,731,709 A 3/1998 Pastore et al.
5,736,780 A 4/1998 Murayama
5,736,785 A 4/1998 Chiang et al.
5,766,987 A 6/1998 Mitchell et al.
5,787,581 A 8/1998 DiStefano et al.
5,801,441 A 9/1998 DiStefano et al.
5,802,699 A 9/1998 Fjelstad et al.
5,811,982 A 9/1998 Beaman et al.
5,821,763 A 10/1998 Beaman et al.
5,830,389 A 11/1998 Capote et al.
5,831,836 A 11/1998 Long et al.
5,839,191 A 11/1998 Economy et al.
5,854,507 A 12/1998 Miremadi et al.
5,874,781 A 2/1999 Fogal et al.
5,898,991 A 5/1999 Fogel et al.
5,908,317 A 6/1999 Heo
5,912,505 A 6/1999 Itoh et al.
5,948,533 A 9/1999 Gallagher et al.
5,953,624 A 9/1999 Bando et al.
5,971,253 A 10/1999 Gilleo et al.
5,973,391 A 10/1999 Bischoff et al.
5,977,618 A 11/1999 DiStefano et al.
5,977,640 A 11/1999 Bertin et al.
5,980,270 A 11/1999 Fjelstad et al.
5,989,936 A 11/1999 Smith et al.
5,994,152 A 11/1999 Khandros et al.
6,000,126 A 12/1999 Pai
6,002,168 A 12/1999 Bellaar et al.
6,032,359 A 3/2000 Carroll
6,038,136 A 3/2000 Weber
6,052,287 A 4/2000 Palmer et al.
6,054,337 A 4/2000 Solberg
6,054,756 A 4/2000 DiStefano et al.
6,077,380 A 6/2000 Hayes et al.
6,117,694 A 9/2000 Smith et al.
6,121,676 A 9/2000 Solberg
6,124,546 A 9/2000 Hayward et al.
6,133,072 A 10/2000 Fjelstad
6,145,733 A 11/2000 Streckfuss et al.
6,157,080 A 12/2000 Tamaki et al.
6,158,647 A 12/2000 Chapman et al.
6,164,523 A 12/2000 Fauty et al.
6,168,965 B1 1/2001 Malinovich et al.
6,177,636 B1 1/2001 Fjelstad
6,180,881 B1 1/2001 Isaak
6,194,250 B1 2/2001 Melton et al.
6,194,291 B1 2/2001 DiStefano et al.
6,202,297 B1 3/2001 Faraci et al.
6,206,273 B1 3/2001 Beaman et al.
6,208,024 B1 3/2001 DiStefano
6,211,572 B1 4/2001 Fjelstad et al.
6,211,574 B1 4/2001 Tao et al.
6,215,670 B1 4/2001 Khandros
6,218,728 B1 4/2001 Kimura
6,225,688 B1 5/2001 Kim et al.
6,238,949 B1 5/2001 Nguyen et al.
6,258,625 B1 7/2001 Brofman et al.
6,260,264 B1 7/2001 Chen et al.
6,262,482 B1 7/2001 Shiraishi et al.
6,268,662 B1 7/2001 Test et al.
6,295,729 B1 10/2001 Beaman et al.
6,300,780 B1 10/2001 Beaman et al.
6,303,997 B1 10/2001 Lee et al.
6,313,528 B1 11/2001 Solberg
6,316,838 B1 11/2001 Ozawa et al.
6,329,224 B1 12/2001 Nguyen et al.
6,332,270 B2 12/2001 Beaman et al.
6,334,247 B1 1/2002 Beaman et al.
6,358,627 B2 3/2002 Benenati et al.
6,362,520 B2 3/2002 DiStefano
6,362,525 B1 3/2002 Rahim
6,376,769 B1 4/2002 Chung
6,388,333 B1 5/2002 Taniguchi et al.
6,395,199 B1 5/2002 Krassowski et al.
6,399,426 B1 6/2002 Capote et al.
6,407,448 B2 6/2002 Chun
6,407,456 B1 6/2002 Ball
6,410,431 B2 6/2002 Bertin et al.
6,413,850 B1 7/2002 Ooroku et al.
6,439,450 B1 8/2002 Chapman et al.
6,458,411 B1 10/2002 Goossen et al.
6,469,260 B2 10/2002 Horiuchi et al.
6,469,373 B2 10/2002 Funakura et al.
6,472,743 B2 10/2002 Huang et al.
6,476,503 B1 11/2002 Imamura et al.
6,476,506 B1 11/2002 O'Connor et al.
6,476,583 B2 11/2002 McAndrews
6,486,545 B1 11/2002 Glenn et al.
6,489,182 B2 12/2002 Kwon
6,489,676 B2 12/2002 Taniguchi et al.
6,495,914 B1 12/2002 Sekine et al.
6,507,104 B2 1/2003 Ho et al.
6,509,639 B1 1/2003 Lin
6,514,847 B1 2/2003 Ohsawa et al.
6,515,355 B1 2/2003 Jiang et al.
6,522,018 B1 2/2003 Tay et al.
6,526,655 B2 3/2003 Beaman et al.
6,531,784 B1 3/2003 Shim et al.
6,538,336 B1 3/2003 Secker et al.
6,545,228 B2 4/2003 Hashimoto
6,550,666 B2 4/2003 Chew et al.
6,555,918 B2 4/2003 Masuda et al.
6,560,117 B2 5/2003 Moon
6,563,205 B1 5/2003 Fogal et al.
6,563,217 B2 5/2003 Corisis et al.
6,573,458 B1 6/2003 Matsubara et al.
6,578,754 B1 6/2003 Tung
6,581,276 B2 6/2003 Chung
6,581,283 B2 6/2003 Sugiura et al.
6,624,653 B1 9/2003 Cram
6,630,730 B2 10/2003 Grigg
6,639,303 B2 10/2003 Siniaguine
6,647,310 B1 11/2003 Yi et al.
6,650,013 B2 11/2003 Yin et al.
6,653,170 B1 11/2003 Lin
6,684,007 B2 1/2004 Yoshimura et al.
6,686,268 B2 2/2004 Farnworth
6,687,988 B1 2/2004 Sugiura et al.
6,693,363 B2 2/2004 Tay et al.
6,696,305 B2 2/2004 Kung et al.
6,699,730 B2 3/2004 Kim et al.
6,708,403 B2 3/2004 Beaman et al.
6,720,783 B2 4/2004 Satoh et al.
6,730,544 B1 5/2004 Yang
6,733,711 B2 5/2004 Durocher et al.
6,734,539 B2 5/2004 Degani et al.
6,734,542 B2 5/2004 Nakatani et al.
6,740,980 B2 5/2004 Hirose
6,740,981 B2 5/2004 Hosomi
6,741,085 B1 5/2004 Khandros et al.
6,746,894 B2 6/2004 Fee et al.
6,754,407 B2 6/2004 Chakravorty et al.
6,756,252 B2 6/2004 Nakanishi

(56) References Cited

U.S. PATENT DOCUMENTS 6,756,663 B2 6/2004 Shiraishi et al.
6,759,738 B1 7/2004 Fallon et al.
6,762,078 B2 7/2004 Shin et al.
6,765,287 B1 7/2004 Lin
6,774,317 B2 8/2004 Fjelstad
6,774,467 B2 8/2004 Horiuchi et al.
6,774,473 B1 8/2004 Shen
6,774,494 B2 8/2004 Arakawa
6,777,787 B2 8/2004 Shibata
6,777,797 B2 8/2004 Egawa
6,778,406 B2 8/2004 Eldridge et al.
6,780,746 B2 8/2004 Kinsman et al.
6,787,926 B2 9/2004 Chen et al.
6,790,757 B1 9/2004 Chittipeddi et al.
6,800,941 B2 10/2004 Lee et al.
6,812,575 B2 11/2004 Furusawa
6,815,257 B2 11/2004 Yoon et al.
6,825,552 B2 11/2004 Light et al.
6,828,668 B2 12/2004 Smith et al.
6,844,619 B2 1/2005 Tago
6,856,235 B2 2/2005 Fjelstad
6,864,166 B1 3/2005 Yin et al.
6,867,499 B1 3/2005 Tabrizi
6,874,910 B2 4/2005 Sugimoto et al.
6,897,565 B2 5/2005 Pflughaupt et al.
6,900,530 B1 5/2005 Tsai
6,902,869 B2 6/2005 Appelt et al.
6,902,950 B2 6/2005 Ma et al.
6,906,408 B2 6/2005 Cloud et al.
6,908,785 B2 6/2005 Kim
6,909,181 B2 6/2005 Aiba et al.
6,917,098 B1 7/2005 Yamunan
6,930,256 B1 8/2005 Huemoeller et al.
6,933,598 B2 8/2005 Kamezos
6,933,608 B2 8/2005 Fujisawa
6,939,723 B2 9/2005 Basceri et al.
6,946,380 B2 9/2005 Takahashi
6,951,773 B2 10/2005 Ho et al.
6,962,282 B2 11/2005 Manansala
6,962,864 B1 11/2005 Jeng et al.
6,977,440 B2 12/2005 Pflughaupt et al.
6,979,599 B2 12/2005 Silverbrook
6,987,032 B1 1/2006 Fan et al.
6,989,122 B1 1/2006 Pham et al.
7,009,297 B1 3/2006 Chiang et al.
7,017,794 B2 3/2006 Nosaka
7,021,521 B2 4/2006 Sakurai et al.
7,045,884 B2 5/2006 Standing
7,051,915 B2 5/2006 Mutaguchi
7,052,935 B2 5/2006 Pai et al.
7,053,477 B2 5/2006 Karnezos et al.
7,053,485 B2 5/2006 Bang et al.
7,061,079 B2 6/2006 Weng et al.
7,061,097 B2 6/2006 Yokoi
7,067,911 B1 6/2006 Lin et al.
7,071,028 B2 7/2006 Koike et al.
7,071,547 B2 7/2006 Kang et al.
7,071,573 B1 7/2006 Lin
7,078,788 B2 7/2006 Vu et al.
7,078,822 B2 7/2006 Dias et al.
7,095,105 B2 8/2006 Cherukuri et al.
7,112,520 B2 9/2006 Lee et al.
7,115,986 B2 10/2006 Moon et al.
7,119,427 B2 10/2006 Kim
7,121,891 B2 10/2006 Cherian
7,138,722 B2 11/2006 Miyamoto et al.
7,170,185 B1 1/2007 Hogerton et al.
7,176,043 B2 2/2007 Haba et al.
7,176,506 B2 2/2007 Beroz et al.
7,176,559 B2 2/2007 Ho et al.
7,185,426 B1 3/2007 Hiner et al.
7,187,072 B2 3/2007 Fukutomi et al.
7,190,061 B2 3/2007 Lee
7,198,980 B2 4/2007 Jiang et al.
7,198,987 B1 4/2007 Warren et al.
7,205,670 B2 4/2007 Oyama
7,215,033 B2 5/2007 Lee et al.
7,216,794 B2 5/2007 Lange et al.
7,225,538 B2 6/2007 Eldridge et al.
7,227,095 B2 6/2007 Roberts et al.
7,229,906 B2 6/2007 Babinetz et al.
7,233,057 B2 6/2007 Hussa
7,242,081 B1 7/2007 Lee
7,246,431 B2 7/2007 Bang et al.
7,256,069 B2 8/2007 Akram et al.
7,259,445 B2 8/2007 Lau et al.
7,262,124 B2 8/2007 Fujisawa
7,262,506 B2 8/2007 Mess et al.
7,268,421 B1 9/2007 Lin
7,276,785 B2 10/2007 Bauer et al.
7,276,799 B2 10/2007 Lee et al.
7,287,322 B2 10/2007 Mathieu et al.
7,290,448 B2 11/2007 Shirasaka et al.
7,294,920 B2 11/2007 Chen et al.
7,294,928 B2 11/2007 Bang et al.
7,298,033 B2 11/2007 Yoo
7,301,770 B2 11/2007 Campbell et al.
7,307,348 B2 12/2007 Wood et al.
7,321,164 B2 1/2008 Hsu
7,323,767 B2 1/2008 James et al.
7,327,038 B2 2/2008 Kwon et al.
7,342,803 B2 3/2008 Inagaki et al.
7,344,917 B2 3/2008 Gautham
7,345,361 B2 3/2008 Mallik et al.
7,355,289 B2 4/2008 Hess et al.
7,365,416 B2 4/2008 Kawabata et al.
7,368,924 B2 5/2008 Beaman et al.
7,371,676 B2 5/2008 Hembree
7,372,151 B1 5/2008 Fan et al.
7,378,726 B2 5/2008 Punzalan et al.
7,390,700 B2 6/2008 Gerber et al.
7,391,105 B2 6/2008 Yeom
7,391,121 B2 6/2008 Otremba
7,416,107 B2 8/2008 Chapman et al.
7,425,758 B2 9/2008 Corisis et al.
7,453,157 B2 11/2008 Haba et al.
7,456,091 B2 11/2008 Kuraya et al.
7,456,495 B2 11/2008 Pohl et al.
7,459,348 B2 12/2008 Saeki
7,462,936 B2 12/2008 Haba et al.
7,476,608 B2 1/2009 Craig et al.
7,476,962 B2 1/2009 Kim
7,485,562 B2 2/2009 Chua et al.
7,485,969 B2 2/2009 Corisis et al.
7,495,179 B2 2/2009 Kubota et al.
7,495,342 B2 2/2009 Beaman et al.
7,495,644 B2 2/2009 Hirakata
7,504,284 B2 3/2009 Ye et al.
7,504,716 B2 3/2009 Abbott
7,517,733 B2 4/2009 Camacho et al.
7,527,505 B2 5/2009 Murata
7,528,474 B2 5/2009 Lee
7,535,090 B2 5/2009 Furuyama et al.
7,537,962 B2 5/2009 Jang et al.
7,538,565 B1 5/2009 Beaman et al.
7,547,624 B2 6/2009 Tanaka
7,550,836 B2 6/2009 Chou et al.
7,560,360 B2 7/2009 Cheng et al.
7,564,116 B2 7/2009 Ahn et al.
7,576,415 B2 8/2009 Cha et al.
7,576,439 B2 8/2009 Craig et al.
7,578,422 B2 8/2009 Lange et al.
7,582,963 B2 9/2009 Gerber et al.
7,589,394 B2 9/2009 Kawano
7,592,638 B2 9/2009 Kim
7,595,548 B2 9/2009 Shirasaka et al.
7,605,479 B2 10/2009 Mohammed
7,612,638 B2 11/2009 Chung et al.
7,619,901 B2 11/2009 Eichelberger et al.
7,621,436 B2 11/2009 Mii et al.
7,625,781 B2 12/2009 Beer
7,629,695 B2 12/2009 Yoshimura et al.
7,633,154 B2 12/2009 Dai et al.
7,633,765 B1 12/2009 Scanlan et al.

(56) References Cited

U.S. PATENT DOCUMENTS 7,642,133 B2 1/2010 Wu et al.
7,646,102 B2 1/2010 Boon
7,659,612 B2 2/2010 Hembree et al.
7,659,617 B2 2/2010 Kang et al.
7,663,226 B2 2/2010 Cho et al.
7,670,940 B2 3/2010 Mizukoshi et al.
7,671,457 B1 3/2010 Hiner et al.
7,671,459 B2 3/2010 Corisis et al.
7,675,152 B2 3/2010 Gerber et al.
7,677,429 B2 3/2010 Chapman et al.
7,682,960 B2 3/2010 Wen
7,682,962 B2 3/2010 Hembree
7,683,460 B2 3/2010 Heitzer et al.
7,683,482 B2 3/2010 Nishida et al.
7,692,931 B2 4/2010 Chong et al.
7,696,631 B2 4/2010 Beaulieu et al.
7,706,144 B2 4/2010 Lynch
7,709,968 B2 5/2010 Damberg et al.
7,719,122 B2 5/2010 Tsao et al.
7,723,839 B2 5/2010 Yano et al.
7,728,443 B2 6/2010 Hembree
7,737,545 B2 6/2010 Fjelstad et al.
7,750,483 B1 7/2010 Lin et al.
7,757,385 B2 7/2010 Hembree
7,759,782 B2 7/2010 Haba et al.
7,777,238 B2 8/2010 Nishida et al.
7,777,328 B2 8/2010 Enomoto
7,777,351 B1 8/2010 Berry et al.
7,780,064 B2 8/2010 Wong et al.
7,781,877 B2 8/2010 Jiang et al.
7,795,717 B2 9/2010 Goller
7,800,233 B2 9/2010 Kawano et al.
7,807,512 B2 10/2010 Lee et al.
7,808,093 B2 10/2010 Kagaya et al.
7,808,439 B2 10/2010 Yang et al.
7,817,229 B2 10/2010 Sakamoto et al.
7,830,000 B2 11/2010 Eichelberger et al.
7,834,464 B2 11/2010 Meyer et al.
7,838,334 B2 11/2010 Yu et al.
7,842,541 B1 11/2010 Rusli et al.
7,850,087 B2 12/2010 Hwang et al.
7,851,259 B2 12/2010 Kim
7,855,462 B2 12/2010 Boon et al.
7,855,464 B2 12/2010 Shikano
7,857,190 B2 12/2010 Takahashi et al.
7,859,033 B2 12/2010 Brady
7,863,090 B2 1/2011 Eichelberger et al.
7,868,445 B2 1/2011 Kohl et al.
7,872,335 B2 1/2011 Khan et al.
7,876,180 B2 1/2011 Uchimura
7,880,290 B2 2/2011 Park
7,892,889 B2 2/2011 Howard et al.
7,898,083 B2 3/2011 Castro
7,901,989 B2 3/2011 Haba et al.
7,902,644 B2 3/2011 Huang et al.
7,902,652 B2 3/2011 Seo et al.
7,910,385 B2 3/2011 Kweon et al.
7,911,805 B2 3/2011 Haba
7,919,846 B2 4/2011 Hembree
7,919,871 B2 4/2011 Moon et al.
7,923,295 B2 4/2011 Shim et al.
7,923,304 B2 4/2011 Choi et al.
7,928,552 B1 4/2011 Cho et al.
7,932,170 B1 4/2011 Huemoeller et al.
7,934,313 B1 5/2011 Lin et al.
7,939,934 B2 5/2011 Haba et al.
7,943,436 B2 5/2011 McElvain
7,944,034 B2 5/2011 Gerber et al.
7,956,456 B2 6/2011 Gurrum et al.
7,960,843 B2 6/2011 Hedler et al.
7,964,956 B1 6/2011 Bet-Shliemoun
7,967,062 B2 6/2011 Campbell et al.
7,974,099 B2 7/2011 Grajcar
7,977,597 B2 7/2011 Roberts et al.
7,990,711 B1 8/2011 Andry et al.
7,994,622 B2 8/2011 Mohammed et al.
8,004,074 B2 8/2011 Mori et al.
8,004,093 B2 8/2011 Oh et al.
8,008,121 B2 8/2011 Choi et al.
8,012,797 B2 9/2011 Shen et al.
8,017,437 B2 9/2011 Yoo et al.
8,017,452 B2 9/2011 Ishihara et al.
8,018,033 B2 9/2011 Moriya
8,018,065 B2 9/2011 Lam
8,020,290 B2 9/2011 Sheats
8,021,907 B2 9/2011 Pagaila et al.
8,035,213 B2 10/2011 Lee et al.
8,039,316 B2 10/2011 Chi et al.
8,039,960 B2 10/2011 Lin
8,039,970 B2 10/2011 Yamamori et al.
8,048,479 B2 11/2011 Hedler et al.
8,053,814 B2 11/2011 Chen et al.
8,053,879 B2 11/2011 Lee et al.
8,053,906 B2 11/2011 Chang et al.
8,058,101 B2 11/2011 Haba et al.
8,063,475 B2 11/2011 Choi et al.
8,071,424 B2 12/2011 Haba et al.
8,071,431 B2 12/2011 Hoang et al.
8,071,470 B2 12/2011 Khor et al.
8,076,765 B2 12/2011 Chen et al.
8,076,770 B2 12/2011 Kagaya et al.
8,080,445 B1 12/2011 Pagaila
8,084,867 B2 12/2011 Tang et al.
8,092,734 B2 1/2012 Jiang et al.
8,093,697 B2 1/2012 Haba et al.
8,106,498 B2 1/2012 Shin et al.
8,115,283 B1 2/2012 Bolognia et al.
8,119,516 B2 2/2012 Endo
8,120,054 B2 2/2012 Seo et al.
8,120,186 B2 2/2012 Yoon
8,138,584 B2 3/2012 Wang et al.
8,143,141 B2 3/2012 Sugiura et al.
8,143,710 B2 3/2012 Cho
8,158,888 B2 4/2012 Shen et al.
8,169,065 B2 5/2012 Kohl et al.
8,174,119 B2 5/2012 Pendse
8,183,682 B2 5/2012 Dijkstra et al.
8,183,684 B2 5/2012 Nakazato
8,193,034 B2 6/2012 Pagaila et al.
8,194,411 B2 6/2012 Leung et al.
8,198,716 B2 6/2012 Periaman et al.
8,207,604 B2 6/2012 Haba et al.
8,213,184 B2 7/2012 Knickerbocker
8,217,502 B2 7/2012 Ko
8,225,982 B2 7/2012 Pirkle et al.
8,232,141 B2 * 7/2012 Choi .................. H01L 23/3121 438/110
8,237,257 B2 8/2012 Yang
8,258,010 B2 9/2012 Pagaila et al.
8,258,015 B2 9/2012 Chow et al.
8,263,435 B2 9/2012 Choi et al.
8,264,091 B2 9/2012 Cho et al.
8,269,335 B2 9/2012 Osumi
8,278,746 B2 10/2012 Ding et al.
8,288,854 B2 10/2012 Weng et al.
8,293,580 B2 10/2012 Kim et al.
8,299,368 B2 10/2012 Endo
8,304,900 B2 * 11/2012 Jang ........................ H01L 25/50 257/733
8,314,492 B2 11/2012 Egawa
8,315,060 B2 11/2012 Morikita et al.
8,318,539 B2 11/2012 Cho et al.
8,319,338 B1 11/2012 Berry et al.
8,324,020 B2 12/2012 Eichelberger et al.
8,324,633 B2 12/2012 McKenzie et al.
8,330,272 B2 12/2012 Haba
8,349,735 B2 1/2013 Pagaila et al.
8,354,297 B2 1/2013 Pagaila et al.
8,362,620 B2 1/2013 Pagani
8,372,741 B1 2/2013 Co et al.
8,384,199 B2 2/2013 Eichelberger et al.
8,390,108 B2 3/2013 Cho et al.
8,390,117 B2 3/2013 Shimizu et al.
8,395,259 B2 3/2013 Eun

(56) References Cited

U.S. PATENT DOCUMENTS 8,399,972 B2 3/2013 Hoang et al.
8,404,520 B1 3/2013 Chau et al.
8,409,922 B2 4/2013 Camacho et al.
8,415,704 B2 4/2013 Ivanov et al.
8,419,442 B2 4/2013 Horikawa et al.
8,420,430 B2 4/2013 Chiu et al.
8,435,899 B2 5/2013 Miyata et al.
8,450,839 B2 5/2013 Corisis et al.
8,474,133 B2 7/2013 Eichelberger et al.
8,476,115 B2 7/2013 Choi et al.
8,476,770 B2 7/2013 Shao et al.
8,482,111 B2 7/2013 Haba
8,487,421 B2 7/2013 Sato et al.
8,492,201 B2 7/2013 Pagaila et al.
8,502,387 B2 8/2013 Choi et al.
8,507,297 B2 8/2013 Pan et al.
8,508,045 B2 8/2013 Khan et al.
8,518,746 B2 8/2013 Pagaila et al.
8,520,396 B2 8/2013 Schmidt et al.
8,525,214 B2 9/2013 Lin et al.
8,525,314 B2 9/2013 Haba et al.
8,525,318 B1 9/2013 Kim et al.
8,533,941 B2 9/2013 Eichelberger et al.
8,552,556 B1 10/2013 Kim et al.
8,558,379 B2 10/2013 Kwon
8,558,392 B2 10/2013 Chua et al.
8,564,119 B2 10/2013 Eichelberger et al.
8,564,141 B2 10/2013 Lee et al.
8,567,051 B2 10/2013 Val
8,569,892 B2 10/2013 Mori et al.
8,580,607 B2 11/2013 Haba
8,590,145 B2 11/2013 Eichelberger et al.
8,598,717 B2 12/2013 Masuda
8,618,646 B2 12/2013 Sasaki et al.
8,618,659 B2 12/2013 Sato et al.
8,624,374 B2 1/2014 Ding et al.
8,633,059 B2 1/2014 Do et al.
8,637,991 B2 1/2014 Haba
8,642,393 B1 2/2014 Yu et al.
8,646,508 B2 2/2014 Kawada
8,653,626 B2 2/2014 Lo et al.
8,653,668 B2 2/2014 Uno et al.
8,653,676 B2 2/2014 Kim et al.
8,659,164 B2 2/2014 Haba
8,664,780 B2 3/2014 Han et al.
8,669,646 B2 3/2014 Tabatabai et al.
8,670,261 B2 3/2014 Crisp et al.
8,680,662 B2 3/2014 Haba et al.
8,680,677 B2 3/2014 Wyland
8,680,684 B2 3/2014 Haba et al.
8,685,792 B2 4/2014 Chow et al.
8,686,570 B2 4/2014 Semmelmeyer et al.
8,697,492 B2 4/2014 Haba et al.
8,723,307 B2 5/2014 Jiang et al.
8,728,865 B2 5/2014 Haba et al.
8,729,714 B1 5/2014 Meyer
8,742,576 B2 6/2014 Thacker et al.
8,742,597 B2 6/2014 Nickerson et al.
8,766,436 B2 7/2014 DeLucca et al.
8,772,152 B2 7/2014 Co et al.
8,772,817 B2 7/2014 Yao
8,785,245 B2 7/2014 Kim
8,791,575 B2 7/2014 Oganesian et al.
8,791,580 B2 7/2014 Park et al.
8,796,135 B2 8/2014 Oganesian et al.
8,796,846 B2 8/2014 Lin et al.
8,802,494 B2 8/2014 Lee et al.
8,810,031 B2 8/2014 Chang et al.
8,811,055 B2 8/2014 Yoon
8,816,404 B2 8/2014 Kim et al.
8,816,505 B2 8/2014 Mohammed et al.
8,835,228 B2 9/2014 Mohammed
8,836,136 B2 9/2014 Chau et al.
8,836,140 B2 9/2014 Ma et al.
8,836,147 B2 9/2014 Uno et al.
8,841,765 B2 9/2014 Haba et al.
8,846,521 B2 9/2014 Sugizaki
8,847,376 B2 9/2014 Oganesian et al.
8,853,558 B2 10/2014 Gupta et al.
8,878,353 B2 11/2014 Haba et al.
8,881,086 B2 11/2014 McElvain
8,884,416 B2 11/2014 Lee et al.
8,893,380 B2 11/2014 Kim et al.
8,907,466 B2 12/2014 Haba
8,907,500 B2 12/2014 Haba et al.
8,912,651 B2 12/2014 Yu et al.
8,916,781 B2 12/2014 Haba et al.
8,922,005 B2 12/2014 Hu et al.
8,923,004 B2 12/2014 Low et al.
8,927,337 B2 1/2015 Haba et al.
8,937,309 B2 1/2015 England et al.
8,940,630 B2 1/2015 Damberg et al.
8,940,636 B2 1/2015 Pagaila et al.
8,946,757 B2 2/2015 Mohammed et al.
8,948,712 B2 2/2015 Chen et al.
8,963,339 B2 2/2015 He et al.
8,970,049 B2 3/2015 Karnezos
8,975,726 B2 3/2015 Chen et al.
8,978,247 B2 3/2015 Yang et al.
8,981,559 B2 3/2015 Hsu et al.
8,987,132 B2 3/2015 Gruber et al.
8,988,895 B2 3/2015 Mohammed et al.
8,993,376 B2 3/2015 Camacho et al.
9,006,031 B2 4/2015 Camacho et al.
9,012,263 B1 4/2015 Mathew et al.
9,041,227 B2 5/2015 Chau et al.
9,054,095 B2 6/2015 Pagaila
9,082,763 B2 7/2015 Yu et al.
9,093,435 B2 7/2015 Sato et al.
9,095,074 B2 7/2015 Haba et al.
9,105,483 B2 8/2015 Chau et al.
9,105,552 B2 8/2015 Yu et al.
9,117,811 B2 8/2015 Zohni
9,123,664 B2 9/2015 Haba
9,128,123 B2 9/2015 Liu et al.
9,136,254 B2 9/2015 Zhao et al.
9,142,586 B2 9/2015 Wang et al.
9,153,562 B2 10/2015 Haba et al.
9,167,710 B2 10/2015 Mohammed et al.
9,171,790 B2 10/2015 Yu et al.
9,177,832 B2 11/2015 Camacho
9,196,586 B2 11/2015 Chen et al.
9,196,588 B2 11/2015 Leal
9,209,081 B2 12/2015 Lim et al.
9,214,434 B1 12/2015 Kim et al.
9,224,647 B2 12/2015 Koo et al.
9,224,717 B2 12/2015 Sato et al.
9,258,922 B2 2/2016 Chen et al.
9,263,394 B2 2/2016 Uzoh et al.
9,263,413 B2 2/2016 Mohammed
9,299,670 B2 3/2016 Yap et al.
9,318,449 B2 4/2016 Hasch et al.
9,318,452 B2 4/2016 Chen et al.
9,324,696 B2 4/2016 Choi et al.
9,330,945 B2 5/2016 Song et al.
9,349,706 B2 5/2016 Co et al.
9,362,161 B2 6/2016 Chi et al.
9,378,982 B2 6/2016 Lin et al.
9,379,074 B2 6/2016 Uzoh et al.
9,379,078 B2 6/2016 Yu et al.
9,401,338 B2 7/2016 Magnus et al.
9,405,064 B2 8/2016 Herbsommer et al.
9,412,661 B2 8/2016 Lu et al.
9,418,940 B2 8/2016 Hoshino et al.
9,418,971 B2 8/2016 Chen et al.
9,437,459 B2 9/2016 Carpenter et al.
9,443,797 B2 9/2016 Marimuthu et al.
9,449,941 B2 9/2016 Tsai et al.
9,461,025 B2 10/2016 Yu et al.
9,484,331 B2 11/2016 Paek et al.
9,496,152 B2 11/2016 Cho et al.
9,502,390 B2 11/2016 Caskey et al.
9,508,622 B2 11/2016 Higgins, III
9,559,088 B2 1/2017 Gonzalez et al.

(56) References Cited

U.S. PATENT DOCUMENTS 9,570,382 B2 2/2017 Haba
9,583,456 B2 2/2017 Uzoh et al.
9,601,454 B2 3/2017 Zhao et al.
9,653,428 B1 5/2017 Hiner et al.
9,653,442 B2 5/2017 Yu et al.
9,659,877 B2 5/2017 Bakalski et al.
9,663,353 B2 5/2017 Ofner et al.
9,685,365 B2 6/2017 Mohammed
9,735,084 B2 8/2017 Katkar et al.
9,788,466 B2 10/2017 Chen
9,812,402 B2 11/2017 Awujoola et al.
9,842,798 B2 12/2017 Marimuthu et al.
9,859,203 B2 1/2018 Kim et al.
9,871,599 B2 1/2018 Chen et al.
10,079,225 B2 9/2018 Lin et al.
10,115,671 B2 10/2018 Shenoy et al.
10,115,678 B2 10/2018 Awujoola et al.
10,181,457 B2 1/2019 Prabhu et al.
10,529,636 B2 1/2020 Katkar
2001/0002607 A1 6/2001 Sugiura et al.
2001/0006252 A1 7/2001 Kim et al.
2001/0007370 A1 7/2001 Distefano
2001/0021541 A1 9/2001 Akram et al.
2001/0028114 A1 10/2001 Hosomi
2001/0040280 A1 11/2001 Funakura et al.
2001/0042925 A1 11/2001 Yamamoto et al.
2001/0045012 A1 11/2001 Beaman et al.
2001/0048151 A1 12/2001 Chun
2002/0014004 A1 2/2002 Beaman et al.
2002/0027257 A1 3/2002 Kinsman et al.
2002/0066952 A1 6/2002 Taniguchi et al.
2002/0096787 A1 7/2002 Fjelstad
2002/0113308 A1 8/2002 Huang et al.
2002/0117330 A1 8/2002 Eldridge et al.
2002/0125556 A1 9/2002 Oh et al.
2002/0125571 A1 9/2002 Corisis et al.
2002/0153602 A1 10/2002 Tay et al.
2002/0164838 A1 11/2002 Moon et al.
2002/0171152 A1 11/2002 Miyazaki
2002/0185735 A1 12/2002 Sakurai et al.
2002/0190738 A1 12/2002 Beaman et al.
2003/0002770 A1 1/2003 Chakravorty et al.
2003/0006494 A1 1/2003 Lee et al.
2003/0048108 A1 3/2003 Beaman et al.
2003/0057544 A1 3/2003 Nathan et al.
2003/0068906 A1 4/2003 Light et al.
2003/0094666 A1 5/2003 Clayton et al.
2003/0094685 A1 5/2003 Shiraishi et al.
2003/0094700 A1 5/2003 Aiba et al.
2003/0106213 A1 6/2003 Beaman et al.
2003/0107118 A1 6/2003 Pflughaupt et al.
2003/0124767 A1 7/2003 Lee et al.
2003/0162378 A1 8/2003 Mikami
2003/0164540 A1 9/2003 Lee et al.
2003/0234277 A1 12/2003 Dias et al.
2004/0014309 A1 1/2004 Nakanishi
2004/0036164 A1 2/2004 Koike et al.
2004/0038447 A1 2/2004 Corisis et al.
2004/0041757 A1 3/2004 Yang et al.
2004/0075164 A1 4/2004 Pu et al.
2004/0090756 A1 5/2004 Ho et al.
2004/0110319 A1 6/2004 Fukutomi et al.
2004/0119152 A1 6/2004 Kamezos et al.
2004/0124518 A1 7/2004 Kamezos
2004/0148773 A1 8/2004 Beaman et al.
2004/0152292 A1 8/2004 Babinetz et al.
2004/0160751 A1 8/2004 Inagaki et al.
2004/0164426 A1 8/2004 Pai et al.
2004/0188499 A1 9/2004 Nosaka
2004/0262728 A1 12/2004 Sterrett et al.
2004/0262734 A1 12/2004 Yoo
2005/0017369 A1 1/2005 Clayton et al.
2005/0035440 A1 2/2005 Mohammed
2005/0062173 A1 3/2005 Vu et al.
2005/0062492 A1 3/2005 Beaman et al.
2005/0082664 A1 4/2005 Funaba et al.
2005/0095835 A1 5/2005 Humpston et al.
2005/0116326 A1 6/2005 Haba et al.
2005/0121764 A1 6/2005 Mallik et al.
2005/0133916 A1 6/2005 Kamezos
2005/0133932 A1 6/2005 Pohl et al.
2005/0140265 A1 6/2005 Hirakata
2005/0146008 A1 7/2005 Miyamoto et al.
2005/0151235 A1 7/2005 Yokoi
2005/0151238 A1 7/2005 Yamunan
2005/0161814 A1 7/2005 Mizukoshi et al.
2005/0173805 A1 8/2005 Damberg et al.
2005/0173807 A1 8/2005 Zhu et al.
2005/0176233 A1 8/2005 Joshi et al.
2005/0181544 A1 8/2005 Haba et al.
2005/0181655 A1 8/2005 Haba et al.
2005/0212109 A1 9/2005 Cherukur et al.
2005/0253213 A1 11/2005 Jiang et al.
2005/0266672 A1 12/2005 Jeng et al.
2005/0285246 A1 12/2005 Haba et al.
2006/0087013 A1 4/2006 Hsieh
2006/0088957 A1 4/2006 Saeki
2006/0118641 A1 6/2006 Hwang et al.
2006/0139893 A1 6/2006 Yoshimura et al.
2006/0166397 A1 7/2006 Lau et al.
2006/0197220 A1 9/2006 Beer
2006/0216868 A1 9/2006 Yang et al.
2006/0228825 A1 10/2006 Hembree
2006/0255449 A1 11/2006 Lee et al.
2006/0278682 A1 12/2006 Lange et al.
2006/0278970 A1 12/2006 Yano et al.
2007/0010086 A1 1/2007 Hsieh
2007/0013067 A1 1/2007 Nishida et al.
2007/0015353 A1 1/2007 Craig et al.
2007/0026662 A1 2/2007 Kawano et al.
2007/0035015 A1 2/2007 Hsu
2007/0045803 A1 3/2007 Ye et al.
2007/0045862 A1 3/2007 Corisis et al.
2007/0080360 A1 4/2007 Mirsky et al.
2007/0090524 A1 4/2007 Abbott
2007/0126091 A1 6/2007 Wood et al.
2007/0145563 A1 6/2007 Punzalan et al.
2007/0148822 A1 6/2007 Haba et al.
2007/0164457 A1 7/2007 Yamaguchi et al.
2007/0181989 A1 8/2007 Corisis et al.
2007/0190747 A1 8/2007 Humpston et al.
2007/0235850 A1 10/2007 Gerber et al.
2007/0235856 A1 10/2007 Haba et al.
2007/0238289 A1 10/2007 Tanaka
2007/0241437 A1 10/2007 Kagaya et al.
2007/0246819 A1 10/2007 Hembree et al.
2007/0254406 A1 11/2007 Lee
2007/0271781 A9 11/2007 Beaman et al.
2007/0290325 A1 12/2007 Wu et al.
2008/0006942 A1 1/2008 Park et al.
2008/0017968 A1 1/2008 Choi et al.
2008/0023805 A1 1/2008 Howard et al.
2008/0029849 A1 2/2008 Hedler et al.
2008/0032519 A1 2/2008 Murata
2008/0042265 A1 2/2008 Merilo et al.
2008/0047741 A1 2/2008 Beaman et al.
2008/0048309 A1 2/2008 Corisis et al.
2008/0048690 A1 2/2008 Beaman et al.
2008/0048691 A1 2/2008 Beaman et al.
2008/0048697 A1 2/2008 Beaman et al.
2008/0054434 A1 3/2008 Kim
2008/0073769 A1 3/2008 Wu et al.
2008/0073771 A1 3/2008 Seo et al.
2008/0076208 A1 3/2008 Wu et al.
2008/0100316 A1 5/2008 Beaman et al.
2008/0100317 A1 5/2008 Beaman et al.
2008/0100318 A1 5/2008 Beaman et al.
2008/0100324 A1 5/2008 Beaman et al.
2008/0105984 A1 5/2008 Lee
2008/0106281 A1 5/2008 Beaman et al.
2008/0106282 A1 5/2008 Beaman et al.
2008/0106283 A1 5/2008 Beaman et al.
2008/0106284 A1 5/2008 Beaman et al.
2008/0106285 A1 5/2008 Beaman et al.

(56) References Cited

U.S. PATENT DOCUMENTS

2008/0106291 A1 5/2008 Beaman et al.
2008/0106872 A1 5/2008 Beaman et al.
2008/0110667 A1 5/2008 Ahn et al.
2008/0111568 A1 5/2008 Beaman et al.
2008/0111569 A1 5/2008 Beaman et al.
2008/0111570 A1 5/2008 Beaman et al.
2008/0112144 A1 5/2008 Beaman et al.
2008/0112145 A1 5/2008 Beaman et al.
2008/0112146 A1 5/2008 Beaman et al.
2008/0112147 A1 5/2008 Beaman et al.
2008/0112148 A1 5/2008 Beaman et al.
2008/0112149 A1 5/2008 Beaman et al.
2008/0116912 A1 5/2008 Beaman et al.
2008/0116913 A1 5/2008 Beaman et al.
2008/0116914 A1 5/2008 Beaman et al.
2008/0116915 A1 5/2008 Beaman et al.
2008/0116916 A1 5/2008 Beaman et al.
2008/0117611 A1 5/2008 Beaman et al.
2008/0117612 A1 5/2008 Beaman et al.
2008/0117613 A1 5/2008 Beaman et al.
2008/0121879 A1 5/2008 Beaman et al.
2008/0123310 A1 5/2008 Beaman et al.
2008/0129319 A1 6/2008 Beaman et al.
2008/0129320 A1 6/2008 Beaman et al.
2008/0132094 A1 6/2008 Beaman et al.
2008/0156518 A1 7/2008 Honer et al.
2008/0164595 A1 7/2008 Wu et al.
2008/0169544 A1 7/2008 Tanaka et al.
2008/0169548 A1 7/2008 Baek
2008/0211084 A1 9/2008 Chow et al.
2008/0217708 A1 9/2008 Reisner et al.
2008/0230887 A1 9/2008 Sun et al.
2008/0246126 A1 10/2008 Bowles et al.
2008/0277772 A1 11/2008 Groenhuis et al.
2008/0280393 A1 11/2008 Lee et al.
2008/0284001 A1 11/2008 Mori et al.
2008/0284045 A1 11/2008 Gerber et al.
2008/0303132 A1 12/2008 Mohammed et al.
2008/0303153 A1 12/2008 Oi et al.
2008/0308305 A1 12/2008 Kawabe
2008/0315385 A1 12/2008 Gerber et al.
2009/0008796 A1 1/2009 Eng et al.
2009/0014876 A1 1/2009 Youn et al.
2009/0026609 A1 1/2009 Masuda
2009/0032913 A1 2/2009 Haba
2009/0039523 A1 2/2009 Jiang et al.
2009/0045497 A1 2/2009 Kagaya et al.
2009/0050994 A1 2/2009 Ishihara et al.
2009/0079094 A1 3/2009 Lin
2009/0085185 A1 4/2009 Byun et al.
2009/0085205 A1 4/2009 Sugizaki
2009/0091009 A1 4/2009 Corisis et al.
2009/0091022 A1 4/2009 Meyer et al.
2009/0102063 A1 4/2009 Lee et al.
2009/0104736 A1 4/2009 Haba et al.
2009/0115044 A1 5/2009 Hoshino et al.
2009/0115047 A1 5/2009 Haba et al.
2009/0121351 A1 5/2009 Endo
2009/0127686 A1 5/2009 Yang et al.
2009/0128176 A1 5/2009 Beaman et al.
2009/0140415 A1 6/2009 Furuta
2009/0146301 A1 6/2009 Shimizu et al.
2009/0146303 A1 6/2009 Kwon
2009/0160065 A1 6/2009 Haba et al.
2009/0166664 A1 7/2009 Park et al.
2009/0166873 A1 7/2009 Fang et al.
2009/0189288 A1 7/2009 Beaman et al.
2009/0194829 A1 8/2009 Chung et al.
2009/0206461 A1 8/2009 Yoon
2009/0212418 A1 8/2009 Gurrum et al.
2009/0212442 A1 8/2009 Chow et al.
2009/0236700 A1 9/2009 Moriya
2009/0236753 A1 9/2009 Moon et al.
2009/0239336 A1 9/2009 Lee et al.
2009/0256229 A1 10/2009 Ishikawa et al.
2009/0260228 A1 10/2009 Val
2009/0261466 A1 10/2009 Pagaila et al.
2009/0302445 A1 12/2009 Pagaila et al.
2009/0315579 A1 12/2009 Beaman et al.
2009/0316378 A1 12/2009 Haba et al.
2010/0000775 A1 1/2010 Shen et al.
2010/0003822 A1 1/2010 Miyata et al.
2010/0006963 A1 1/2010 Brady
2010/0007009 A1 1/2010 Chang et al.
2010/0007026 A1 1/2010 Shikano
2010/0025835 A1 2/2010 Oh et al.
2010/0032822 A1 2/2010 Liao et al.
2010/0044860 A1 2/2010 Haba et al.
2010/0052135 A1 3/2010 Shim et al.
2010/0052187 A1 3/2010 Lee et al.
2010/0072588 A1 3/2010 Yang
2010/0078789 A1 4/2010 Choi et al.
2010/0078795 A1 4/2010 Dekker et al.
2010/0087035 A1 4/2010 Yoo et al.
2010/0090330 A1 4/2010 Nakazato
2010/0109138 A1 5/2010 Cho
2010/0117212 A1 5/2010 Corisis et al.
2010/0133675 A1 6/2010 Yu et al.
2010/0148360 A1 6/2010 Lin et al.
2010/0148374 A1 6/2010 Castro
2010/0171205 A1 7/2010 Chen et al.
2010/0193937 A1 8/2010 Nagamatsu et al.
2010/0200981 A1 8/2010 Huang et al.
2010/0213560 A1 8/2010 Wang et al.
2010/0216281 A1 8/2010 Pagaila et al.
2010/0224975 A1 9/2010 Shin et al.
2010/0232119 A1 9/2010 Schmidt et al.
2010/0232129 A1 9/2010 Haba et al.
2010/0237471 A1 9/2010 Pagaila et al.
2010/0246141 A1 9/2010 Leung et al.
2010/0258955 A1 10/2010 Miyagawa et al.
2010/0289142 A1 11/2010 Shim et al.
2010/0314748 A1* 12/2010 Hsu .................... H01L 23/3128 257/693
2010/0320585 A1 12/2010 Jiang et al.
2010/0327419 A1 12/2010 Muthukumar et al.
2011/0042699 A1 2/2011 Park et al.
2011/0057308 A1 3/2011 Choi et al.
2011/0068453 A1 3/2011 Cho et al.
2011/0068478 A1 3/2011 Pagaila et al.
2011/0115081 A1 5/2011 Osumi
2011/0140259 A1 6/2011 Cho et al.
2011/0147911 A1 6/2011 Kohl et al.
2011/0156249 A1 6/2011 Chang et al.
2011/0157834 A1 6/2011 Wang
2011/0175213 A1 7/2011 Mori et al.
2011/0209908 A1 9/2011 Lin et al.
2011/0215472 A1 9/2011 Chandrasekaran
2011/0220395 A1 9/2011 Cho et al.
2011/0223721 A1 9/2011 Cho et al.
2011/0237027 A1 9/2011 Kim et al.
2011/0241192 A1 10/2011 Ding et al.
2011/0241193 A1 10/2011 Ding et al.
2011/0272449 A1 11/2011 Pirkle et al.
2011/0272798 A1 11/2011 Lee et al.
2012/0001336 A1 1/2012 Zeng et al.
2012/0007232 A1 1/2012 Haba
2012/0015481 A1 1/2012 Kim
2012/0018885 A1 1/2012 Lee et al.
2012/0020026 A1 1/2012 Oganesian et al.
2012/0025365 A1 2/2012 Haba
2012/0034777 A1 2/2012 Pagaila et al.
2012/0043655 A1 2/2012 Khor et al.
2012/0056312 A1 3/2012 Pagaila et al.
2012/0061814 A1 3/2012 Camacho et al.
2012/0063090 A1 3/2012 Hsiao et al.
2012/0080787 A1 4/2012 Shah et al.
2012/0086111 A1 4/2012 Iwamoto et al.
2012/0086130 A1 4/2012 Sasaki et al.
2012/0104595 A1 5/2012 Haba et al.
2012/0104624 A1 5/2012 Choi et al.
2012/0119380 A1 5/2012 Haba
2012/0126431 A1 5/2012 Kim et al.
2012/0145442 A1 6/2012 Gupta et al.

(56) References Cited

U.S. PATENT DOCUMENTS

2012/0146235 A1 6/2012 Choi et al.
2012/0153444 A1 6/2012 Haga et al.
2012/0184116 A1 7/2012 Pawlikowski et al.
2012/0280374 A1 11/2012 Choi et al.
2012/0280386 A1 11/2012 Sato et al.
2012/0286432 A1 11/2012 Do et al.
2012/0305916 A1 12/2012 Liu et al.
2012/0326337 A1 12/2012 Camacho et al.
2013/0001797 A1 1/2013 Choi et al.
2013/0032944 A1 2/2013 Sato et al.
2013/0037802 A1 2/2013 England et al.
2013/0040423 A1 2/2013 Tung et al.
2013/0049218 A1 2/2013 Gong et al.
2013/0049221 A1 2/2013 Han et al.
2013/0069222 A1 3/2013 Camacho
2013/0082399 A1 4/2013 Kim et al.
2013/0087915 A1 4/2013 Warren et al.
2013/0093087 A1 4/2013 Chau et al.
2013/0093088 A1 4/2013 Chau et al.
2013/0093091 A1 4/2013 Ma et al.
2013/0095610 A1 4/2013 Chau et al.
2013/0105979 A1 5/2013 Yu et al.
2013/0134588 A1 5/2013 Yu et al.
2013/0153646 A1 6/2013 Ho
2013/0182402 A1 7/2013 Chen et al.
2013/0200524 A1 8/2013 Han et al.
2013/0200533 A1 8/2013 Chau et al.
2013/0234317 A1 9/2013 Chen et al.
2013/0241083 A1 9/2013 Yu et al.
2013/0256847 A1 10/2013 Park et al.
2013/0313716 A1 11/2013 Mohammed
2013/0323409 A1 12/2013 Read et al.
2014/0021605 A1 1/2014 Yu et al.
2014/0035892 A1 2/2014 Shenoy et al.
2014/0036454 A1 2/2014 Caskey et al.
2014/0103527 A1 4/2014 Marimuthu et al.
2014/0124949 A1 5/2014 Paek et al.
2014/0175657 A1 6/2014 Oka et al.
2014/0220744 A1 8/2014 Damberg et al.
2014/0225248 A1 8/2014 Henderson et al.
2014/0239479 A1 8/2014 Start
2014/0239490 A1 8/2014 Wang
2014/0264945 A1 9/2014 Yap et al.
2014/0312503 A1 10/2014 Seo
2015/0017765 A1 1/2015 Co et al.
2015/0043190 A1 2/2015 Mohammed et al.
2015/0044823 A1 2/2015 Mohammed
2015/0076714 A1 3/2015 Haba et al.
2015/0130054 A1 5/2015 Lee et al.
2015/0340305 A1 11/2015 Lo
2015/0380376 A1 12/2015 Mathew et al.
2016/0043813 A1 2/2016 Chen et al.
2016/0225692 A1 8/2016 Kim et al.
2017/0117231 A1 4/2017 Awujoola et al.
2017/0229432 A1 8/2017 Lin et al.

FOREIGN PATENT DOCUMENTS

CN 1877824 A 12/2006
CN 101409241 A 4/2009
CN 101449375 A 6/2009
CN 101675516 A 3/2010
CN 101819959 A 9/2010
CN 102324418 A 1/2012
DE 102009001461 A1 9/2010
EP 920058 6/1999
EP 1449414 A1 8/2004
EP 2234158 A1 9/2010
JP S51050661 5/1976
JP 59189069 10/1984
JP 61125062 A 6/1986
JP S62158338 A 7/1987
JP 62226307 10/1987
JP 1012769 A 1/1989
JP 6471162 3/1989
JP H04346436 A 12/1992
JP H06204399 A 7/1994
JP 06268015 A 9/1994
JP H06268101 A 9/1994
JP H06333931 A 12/1994
JP 07122787 A 5/1995
JP 09505439 5/1997
JP H1065054 A 3/1998
JP H10135220 A 5/1998
JP H10135221 A 5/1998
JP 1118364 1/1999
JP 11074295 A 3/1999
JP 11135663 A 5/1999
JP H11145323 A 5/1999
JP 11251350 A 9/1999
JP H11260856 A 9/1999
JP 11317476 11/1999
JP 2000156461 A 6/2000
JP 2000323516 A 11/2000
JP 3157134 B2 4/2001
JP 2001196407 A 7/2001
JP 2001326236 A 11/2001
JP 2002050871 A 2/2002
JP 2002289769 A 10/2002
JP 2003122611 A 4/2003
JP 2003174124 A 6/2003
JP 2003197668 A 7/2003
JP 2003307897 A 10/2003
JP 2003318327 A 11/2003
JP 2004031754 A 1/2004
JP 200447702 2/2004
JP 2004048048 A 2/2004
JP 2004172157 A 6/2004
JP 2004200316 A 7/2004
JP 2004281514 A 10/2004
JP 2004319892 A 11/2004
JP 2004327855 A 11/2004
JP 2004327856 A 11/2004
JP 2004343030 A 12/2004
JP 2005011874 A 1/2005
JP 2005033141 A 2/2005
JP 2005093551 A 4/2005
JP 2003377641 A 6/2005
JP 2005142378 A 6/2005
JP 2005175019 A 6/2005
JP 2003426392 A 7/2005
JP 2005183880 A 7/2005
JP 2005183923 A 7/2005
JP 2005203497 A 7/2005
JP 2005302765 A 10/2005
JP 2006108588 A 4/2006
JP 2006186086 A 7/2006
JP 2006344917 12/2006
JP 2007123595 A 5/2007
JP 2007194436 A 8/2007
JP 2007208159 A 8/2007
JP 2007234845 A 9/2007
JP 2007287922 A 11/2007
JP 2007335464 A 12/2007
JP 200834534 A 2/2008
JP 2008166439 A 7/2008
JP 2008171938 A 7/2008
JP 2008235378 A 10/2008
JP 2008251794 A 10/2008
JP 2008277362 A 11/2008
JP 2008306128 A 12/2008
JP 2009004650 A 1/2009
JP 2009044110 A 2/2009
JP 2009506553 2/2009
JP 2009508324 A 2/2009
JP 2009064966 A 3/2009
JP 2009088254 A 4/2009
JP 2009111384 A 5/2009
JP 2009528706 A 8/2009
JP 2009260132 A 11/2009
JP 2010103129 A 5/2010
JP 2010135671 A 6/2010
JP 2010192928 A 9/2010
JP 2010199528 A 9/2010

(56) References Cited

FOREIGN PATENT DOCUMENTS

| | | | |
|---|---|---|---|
| JP | 2010206007 | A | 9/2010 |
| JP | 2011514015 | A | 4/2011 |
| JP | 2011166051 | A | 8/2011 |
| KR | 100265563 | | 9/2000 |
| KR | 20010061849 | A | 7/2001 |
| KR | 20010094894 | A | 11/2001 |
| KR | 100393102 | | 7/2002 |
| KR | 20020058216 | A | 7/2002 |
| KR | 20060064291 | A | 6/2006 |
| KR | 20070058680 | A | 6/2007 |
| KR | 20080020069 | A | 3/2008 |
| KR | 100865125 | B1 | 10/2008 |
| KR | 20080094251 | A | 10/2008 |
| KR | 20080108908 | A | 12/2008 |
| KR | 100886100 | B1 | 2/2009 |
| KR | 20090033605 | A | 4/2009 |
| KR | 20090123680 | A | 12/2009 |
| KR | 20100033012 | A | 3/2010 |
| KR | 20100050750 | A | 5/2010 |
| KR | 20100062315 | A | 6/2010 |
| KR | 101011863 | B1 | 1/2011 |
| KR | 20120075855 | A | 7/2012 |
| KR | 101215271 | B1 | 12/2012 |
| KR | 20130048810 | A | 5/2013 |
| KR | 20150012285 | A | 2/2015 |
| TW | 200539406 | A | 12/2005 |
| TW | 200721327 | A | 6/2007 |
| TW | 200810079 | A | 2/2008 |
| TW | 200849551 | A | 12/2008 |
| TW | 200933760 | A | 8/2009 |
| TW | 201023277 | A | 6/2010 |
| TW | 201250979 | A | 12/2012 |
| TW | I605558 | B | 11/2017 |
| WO | 9615458 | A1 | 5/1996 |
| WO | 0213256 | A1 | 2/2002 |
| WO | 03045123 | A1 | 5/2003 |
| WO | 2004077525 | A2 | 9/2004 |
| WO | 2006050691 | A2 | 5/2006 |
| WO | 2007083351 | A1 | 7/2007 |
| WO | 2007101251 | A2 | 9/2007 |
| WO | 2007116544 | A1 | 10/2007 |
| WO | 2008065896 | A1 | 6/2008 |
| WO | 2008120755 | A1 | 10/2008 |
| WO | 2009096950 | A1 | 8/2009 |
| WO | 2009158098 | A2 | 12/2009 |
| WO | 2010014103 | A1 | 2/2010 |
| WO | 2010041630 | A1 | 4/2010 |
| WO | 2010101163 | A1 | 9/2010 |
| WO | 2012067177 | A1 | 5/2012 |
| WO | 2013059181 | A1 | 4/2013 |
| WO | 2013065895 | A1 | 5/2013 |
| WO | 2014107301 | A1 | 7/2014 |

OTHER PUBLICATIONS

“Wafer Level Stack—WDoD”, [online]. [Retrieved Aug. 5, 2010]. Retrieved from the internet. <http://www.3d-plus.com/techno-wafer-level-stack-wdod.php>, 2 pages.

Bang, U.S. Appl. No. 10/656,534, filed Sep. 5, 2003.

Brochure, “High Performance BVA PoP Package for Mobile Systems,” Invensas Corporation, May 2013, 20 pages.

Brochure, “Invensas BVA PoP for Mobile Computing: 100+ GB/s BVA PoP,” Invensas Corporation, c. 2012, 2 pages.

Brochure, “Invensas BVA PoP for Mobile Computing: Ultra High IO Without TSVs,” Invensas Corporation, Jun. 26, 2012, 4 pages.

Campos et al., “System in Package Solutions Using Fan-Out Wafer Level Packaging Technology,” SEMI Networking Day, Jun. 27, 2013, 31 pages.

Chinese Office Action for Application No. 201180022247.8 dated Apr. 14, 2015.

Chinese Office Action for Application No. 201180022247.8 dated Sep. 16, 2014.

Chinese Office Action for Application No. 201310264264.3 dated May 12, 2015.

Chinese Office Action Search Report for Application No. 2014800551784 dated Jan. 23, 2018, 3 pages.

European Search Results under Rule 164(2)(b) EPC for Application No. 12/712,792 dated Feb. 27, 2018, 2 pages.

Extended European Search Report for Application No. EP13162975 dated Sep. 5, 2013.

Ghaffarian Ph.D., Reza et al., “Evaluation Methodology Guidance for Stack Packages,” Jet Propulsion Laboratory, California Institute of Technology, Pasadena, CA, NASA, Oct. 2009, 44 pages.

IBM et al., “Method of Producing Thin-Film Wirings with Vias,” IBM Technical Disclosure Bulletin, Apr. 1, 1989, IBM Corp., (Thornwood), US-ISSN 0018-8689, vol. 31, No. 11, pp. 209-210, https://priorart.ip.com.

International Preliminary Report on Patentability, Chapter II, for Application No. PCT/US2014/055695 dated Dec. 15, 2015.

International Seach Report for Application No. PCT/US2017/064437 dated Mar. 29, 2018, 5 pages.

International Search Report and Written Opinion for Application No. PCT/US2011/024143 dated Jan. 17, 2012.

International Search Report and Written Opinion for Application No. PCT/US2011/044346 dated May 11, 2012.

International Search Report and Written Opinion for Application No. PCT/US2012/060402 dated Apr. 2, 2013.

International Search Report and Written Opinion for Application No. PCT/US2013/026126 dated Jul. 25, 2013.

International Search Report and Written Opinion for Application No. PCT/US2013/041981 dated Nov. 13, 2013.

International Search Report and Written Opinion for Application No. PCT/US2013/052883 dated Oct. 21, 2013.

International Search Report and Written Opinion for Application No. PCT/US2013/053437 dated Nov. 25, 2013.

International Search Report and Written Opinion for Application No. PCT/US2013/075672 dated Apr. 22, 2014.

International Search Report and Written Opinion for Application No. PCT/US2014/014181 dated Jun. 13, 2014.

International Search Report and Written Opinion for Application No. PCT/US2014/050125 dated Feb. 4, 2015.

International Search Report and Written Opinion for Application No. PCT/US2014/050148 dated Feb. 9, 2015.

International Search Report and Written Opinion for Application No. PCT/US2014/055695 dated Mar. 20, 2015.

International Search Report and Written Opinion for Application No. PCT/US2015/011715 dated Apr. 20, 2015.

International Search Report and Written Opinion for PCT/US2011/060551 dated Apr. 18, 2012.

International Search Report and Written Opinion PCT/US2011/044342 dated May 7, 2012.

International Search Report Application No. PCT/US2011/024143, dated Sep. 14, 2011.

International Search Report for Application No. PCT/US2015/032679, dated Nov. 11, 2015, 2 pages.

International Search Report for Application No. PCT/US2016/056402, dated Jan. 31, 2017, 3 pages.

International Search Report for Application No. PCT/US2016/056526, dated Jan. 20, 2017, 3 pages.

International Search Report for Application No. PCT/US2016/068297, dated Apr. 17, 2017, 3 pages.

International Search Report, PCT/US2005/039716, dated Apr. 5, 2006.

Japanese Office Action for Application No. 2013-509325 dated Oct. 18, 2013.

Japanese Office Action for Application No. 2013-520776 dated Apr. 21, 2015.

Japanese Office Action for Application No. 2013-520777 dated May 22, 2015.

Jin, Yonggang et al., “STM 3D-IC Package and 3D eWLB Development,” STMicroelectronics Singapore/STMicroelectronics France May 21, 2010.

Kim et al., “Application of Through Mold Via (TMV) as PoP base package”, Electronic Components and Technology Conference, 2008. ECTC 2008. 58th. IEEE, 2008, 6 pages.

(56) References Cited

OTHER PUBLICATIONS

Korean Office Action for Application No. 10-2011-0041843 dated Jun. 20, 2011.
Korean Office Action for Application No. 2014-7025992 dated Feb. 5, 2015.
Korean Search Report KR10-2011-0041843 dated Feb. 24, 2011.
Meiser S, "Klein und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
NTK HTCC Package General Design Guide, Communication Media Components Group, NGK Spark Plug Co., Ltd., Komaki, Aichi, Japan, Apr. 2010, 32 pages.
Office Action for Taiwan Application No. 100125521 dated Dec. 20, 2013.
Office Action from Taiwan for Application No. 100125522 dated Jan. 27, 2014.
Office Action from U.S. Appl. No. 12/769,930 dated May 5, 2011.
Partial International Search Report for Application No. PCT/US2012/060402 dated Feb. 21, 2013.
Partial International Search Report for Application No. PCT/US2013/026126 dated Jun. 17, 2013.
Partial International Search Report for Application No. PCT/US2013/075672 dated Mar. 12, 2014.
Partial International Search Report for Application No. PCT/US2014/014181 dated May 8, 2014.
Partial International Search Report for Application No. PCT/US2015/032679, dated Sep. 4, 2015, 2 pages.
Partial International Search Report for Application No. PCT/US2015/033004 dated Sep. 9, 2015.
Partial International Search Report from Invitation to Pay Additional Fees for Application No. PCT/US2012/028738 dated Jun. 6, 2012.
Redistributed Chip Package (RCP) Technology, Freescale Semiconductor, 2005, 6 pages.
Search Report from Korean Patent Applicatin No. 10-2010-0113271 dated Jan. 12, 2011.
Taiwanese Office Action for Application No. 102106326 dated Sep. 18, 2015.
Taiwanese Office Action for Application No. 100140428 dated Jan. 26, 2015.
Taiwanese Office Action for Application No. 100141695 dated Mar. 19, 2014.
Taiwanese Office Action for Application No. 101138311 dated Jun. 27, 2014.
Taiwanese Office Action for Application No. 103103350 dated Mar. 21, 2016.
Taiwanese Search Report for Application No. TW105128420 dated Sep. 26, 2017.
U.S. Appl. No. 13/477,532 filed May 22, 2012.
Written Opinion for Application No. PCT/US2014/050125 dated Jul. 15, 2015.
Yoon, PhD, Seung Wook, "Next Generation Wafer Level Packaging Solution for 3D integration," May 2010, STATS ChipPAC LTD.

* cited by examiner 742
741
740
732B 738D
751
736

738B
732B
736

738A
732A
728
730
739
736
750
712

738D
732D
728
744
736
746
752
751

A
B
C
800
801
802
804
806
808
810
812
814
816
818
820
822
838

A
B
C
D
E
804
806
1022A
1016
1014A
1036
1038
1010
1018
1026
1024
1020
1022

3800
3802
3804
3806
3808
3810
3812
3814
3816
3820
3822
38
28

PACKAGE-ON-PACKAGE ASSEMBLY WITH WIRE BOND VIAS

CROSS-REFERENCE TO RELATED APPLICATIONS

This application is a continuation of U.S. patent application Ser. No. 15/699,288, filed Sep. 8, 2017, which is a continuation of U.S. patent application Ser. No. 14/718,719, filed May 21, 2015, now U.S. Pat. No. 9,761,558, which is a divisional of U.S. patent application Ser. No. 13/795,811, filed Mar. 12, 2013, now U.S. Pat. No. 9,041,227, which is a continuation of U.S. patent application Ser. No. 13/404,408, filed Feb. 24, 2012, now U.S. Pat. No. 9,105,483, which claims the benefit of the filing date of U.S. Provisional Application 61/547,930, filed Oct. 17, 2011, the disclosures of which are incorporated by reference herein.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

Despite all of the above-described advances in the art, still further improvements in making and testing microelectronic packages would be desirable.

SUMMARY OF THE INVENTION

An aspect of the present disclosure relates to a microelectronic package including a substrate having a first region and a second region. The substrate also has a first surface and a second surface remote from the first surface. At least one microelectronic element overlies the first surface within the first region. The package also includes electrically conductive elements exposed at the first surface of the substrate within the second region. At least some of the conductive elements are electrically connected to the at least one microelectronic element. The package further includes wire bonds having bases bonded to respective ones of the conductive elements and ends remote from the substrate and remote from the bases. The ends of the wire bonds are defined on tips of the wire bonds, and the wire bonds define respective first diameters between the bases and the tips thereof. The tips have at least one dimension that is smaller than the respective first diameters of the wire bonds. A dielectric encapsulation layer extends from at least one of the first or second surfaces and covers portions of the wire bonds such that covered portions of the wire bonds are separated from one another by the encapsulation layer. The encapsulation layer overlies at least the second region of the substrate, and unencapsulated portions of the wire bonds, including the ends thereof, are defined by portions of the wire bonds that are uncovered by the encapsulation layer.

In an example, at least some of the tips can further define centroids which are offset in a radial direction from axes of cylindrical portions of the wire bonds. In another example, the tips can further have a second dimension that is smaller than the first diameter. In any of such examples, the tips can include a bonding tool mark thereon. In particular, tips can include a first side and a second side, the bonding tool mark being at least on the first side of the tips.

A first one of the wire bonds can be adapted for carrying a first signal electric potential and a second one of the wire bonds can be adapted for simultaneously carrying a second signal electric potential different from the first signal electric potential.

Each wire bond can have an edge surface extending between the base and the end thereof. In such an example the unencapsulated portions of the wire bonds can be defined by the ends of the wire bonds and portions of edge surfaces adjacent the ends that are uncovered by the encapsulation layer. The portions of the edge surfaces adjacent the ends that are uncovered by the encapsulation layer can extend through the tips.

An end of at least one of the wire bonds can be displaced in a direction parallel to the first surface of the substrate from its base by at least a distance equal to one of: a minimum pitch between adjacent conductive elements of the plurality of conductive elements, and 100 microns. In a particular example, at least one of the wire bonds can include at least one bend between the base thereof and the unencapsulated portion thereof. In another example, the bases of the wire bonds can be disposed at positions in a first pattern having a first minimum pitch between respective adjacent bases of the plurality of wire bonds, and the unencapsulated portions of the wire bonds can be disposed at positions in a second pattern having a second minimum pitch between respective adjacent unencapsulated portions of wire bonds of the plurality of wire bonds. In such an example, the second minimum pitch can be greater than the first pitch.

Another aspect of the present disclosure relates to a microelectronic package including a substrate having a first region and a second region. The substrate has a first surface and a second surface remote from the first surface. At least one microelectronic element overlies the first surface within the first region. Electrically conductive elements are exposed at the first surface of the substrate within the second region, at least some of which are electrically connected to the at least one microelectronic element. The package also includes wire bonds having bases bonded to respective ones of the conductive elements and ends remote from the substrate and remote from the bases. The wire bonds further include bonding tool marks adjacent the ends. A dielectric encapsulation layer extends from at least one of the first or second surfaces and covers portions of the wire bonds such that covered portions of the wire bonds are separated from one another by the encapsulation layer. The encapsulation layer overlies at least the second region of the substrate, and unencapsulated portions of the wire bonds are defined by portions of the wire bonds that are uncovered by the encapsulation layer. The unencapsulated portions include the ends.

The ends of at least some of the wire bonds can be defined on tips of the wire bonds. In such an example, the wire bonds can define first diameters between the bases and the tips, and the tips can have at least one dimension that is smaller than the first diameter. The tips can further have a second dimension that is smaller than the first diameter. In a further example, the bonding tool mark can be located on the tip of the wire bond. The tips can include a first side and a second side thereof, and the bonding tool mark can be at least on the first side of the tip.

An end of at least one of the wire bonds can be displaced in a direction parallel to the first surface of the substrate from its base by at least a distance equal to one of: a minimum pitch between adjacent conductive elements of the plurality of conductive elements, and 100 microns.

Another aspect of the present disclosure relates to a method of making a microelectronic package. The method includes forming a plurality of wire bonds on an in-process unit including a substrate having a first surface and a second surface remote therefrom and a plurality of conductive elements exposed at the first surface. The formation of the wire bonds includes joining a metal wire to a respective one of the conductive elements to form a base of the wire bond, and feeding a predetermined length of the wire out of a capillary of a bonding tool. The wire segment is then severed at least by pressing the wire segment into contact with a secondary surface using the capillary so as to form an end of the wire bond remote from the base, an edge surface of the wire bond extending between the base and the end. The method further includes forming a dielectric encapsulation layer on the in-process unit. The encapsulation layer is formed so as to at least partially cover the first surface and portions of the wire bonds such that unencapsulated portions of the wire bonds are defined by at least ends of the wire bonds that are uncovered by the encapsulation layer.

The method can further include mounting a microelectronic element to the substrate such that the method electrically interconnects the microelectronic element with at least some of the conductive elements.

In an example of the present method, joining the metal wire segment to the respective one of the conductive elements can be done by ball-bonding. Further, the formation of at least some of the wire bonds can further include forming a bend in the wire segment before the severing step.

The step of severing can forms tips of the wire bonds on which the ends are defined. In such an example, the wire bonds can define first diameters between the bases and the tips, and the tips can have at least one dimension that is smaller than the first diameter. The tips can further be formed having a second dimension that is smaller than the first diameter. The step of severing can form at least one bonding tool mark on the tips of the wire bonds. Further, the step of severing can form the tips such that the tips includes a first side and a second side, the bonding tool mark being at least on the first side of the tips.

DETAILED DESCRIPTION

Figure 1:
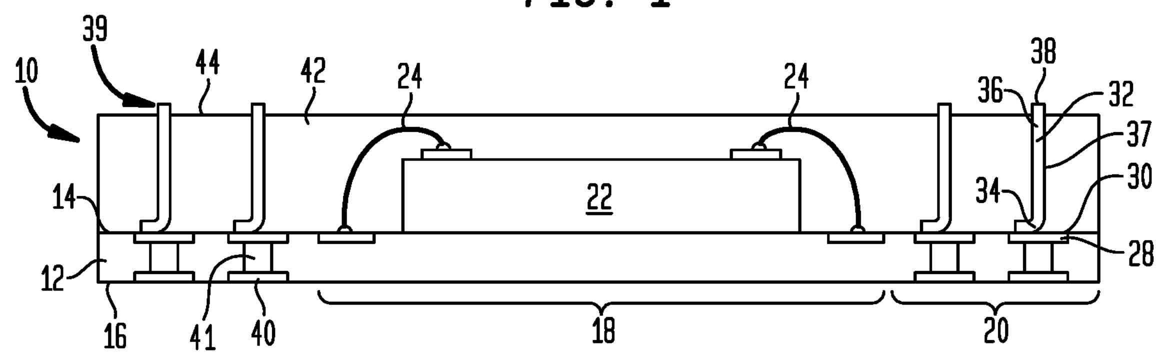
FIG. 1 is sectional view depicting a microelectronic package according to an embodiment of the invention.

Turning now to the figures, where similar numeric references are used to indicate similar features, there is shown in FIG. 1 a microelectronic assembly 10 according to an embodiment of the present invention. The embodiment of FIG. 1 is a microelectronic assembly in the form of a packaged microelectronic element such as a semiconductor chip assembly that is used in computer or other electronic applications.

The microelectronic assembly 10 of FIG. 1 includes a substrate 12 having a first surface 14 and a second surface 16. The substrate 12 typically is in the form of a dielectric element, which is substantially flat. The dielectric element may be sheet-like and may be thin. In particular embodiments, the dielectric element can include one or more layers of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials. The substrate may be a substrate of a package having terminals for further electrical interconnection with a circuit panel, e.g., a circuit board. Alternatively, the substrate can be a circuit panel or circuit board. In one example thereof, the substrate can be a module board of a dual-inline memory module ("DIMM"). In yet another variation, the substrate can be a microelectronic element such as may be or include a semiconductor chip embodying a plurality of active devices, e.g., in form of an integrated circuit or otherwise.

The first surface 14 and second surface 16 are preferably substantially parallel to each other and are spaced apart at a distance perpendicular to the surfaces 14,16 defining the thickness of the substrate 12. The thickness of substrate 12 is preferably within a range of generally acceptable thicknesses for the present application. In an embodiment, the distance between the first surface 14 and the second surface 16 is between about 25 and 500 ||m. For purposes of this discussion, the first surface 14 may be described as being positioned opposite or remote from second surface 16. Such a description, as well as any other description of the relative position of elements used herein that refers to a vertical or horizontal position of such elements is made for illustrative purposes only to correspond with the position of the elements within the Figures, and is not limiting.

In a preferred embodiment, substrate 12 is considered as divided into a first region 18 and a second region 20. The first region 18 lies within the second region 20 and includes a central portion of the substrate 12 and extends outwardly therefrom. The second region 20 substantially surrounds the first region 18 and extends outwardly therefrom to the outer edges of the substrate 12. In this embodiment, no specific characteristic of the substrate itself physically divides the two regions; however, the regions are demarked for purposes of discussion herein with respect to treatments or features applied thereto or contained therein.

A microelectronic element 22 can be mounted to first surface 14 of substrate 12 within first region 18. Microelectronic element 22 can be a semiconductor chip or another comparable device. In the embodiment of FIG. 1, microelectronic element 22 is mounted to first surface 14 in what is known as a conventional or "face-up" fashion. In such an embodiment, wire leads 24 can be used to electrically connect microelectronic element 22 to some of a plurality of conductive elements 28 exposed at first surface 14. Wire leads 24 can also be joined to traces (not shown) or other conductive features within substrate 12 that are, in turn, connected to conductive elements 28.

Conductive elements 28 include respective "contacts" or pads 30 that are exposed at the first surface 14 of substrate 12. As used in the present description, when an electrically conductive element is described as being "exposed at" the surface of another element having dielectric structure, it indicates that the electrically conductive structure is available for contact with a theoretical point moving in a direction perpendicular to the surface of the dielectric structure toward the surface of the dielectric structure from outside the dielectric structure. Thus, a terminal or other conductive structure that is exposed at a surface of a dielectric structure may project from such surface; may be flush with such surface; or may be recessed relative to such surface and exposed through a hole or depression in the dielectric. The conductive elements 28 can be flat, thin elements in which pad 30 is exposed at first surface 14 of substrate 12. In one embodiment, conductive elements 28 can be substantially circular and can be interconnected between each other or to microelectronic element 22 by traces (not shown). Conductive elements 28 can be formed at least within second region 20 of substrate 12. Additionally, in certain embodiments, conductive elements 28 can also be formed within first region 18. Such an arrangement is particularly useful when mounting microelectronic element 122 (FIG. 3) to substrate 112 in what is known as a "flip-chip" configuration, where contacts on the microelectronic element 122 can be connected to conductive elements 128 within first region 118 by solder bumps 126 or the like that are positioned beneath microelectronic element 122. In an embodiment, conductive elements 28 are formed from a solid metal material such as copper, gold, nickel, or other materials that are acceptable for such an application, including various alloys including one or more of copper, gold, nickel or combinations thereof.

At least some of conductive elements 28 can be interconnected to corresponding second conductive elements 40, such as conductive pads, exposed at second surface 16 of substrate 12. Such an interconnection can be completed using vias 41 formed in substrate 12 that can be lined or filled with conductive metal that can be of the same material as conductive elements 28 and 40. Optionally, conductive elements 40 can be further interconnected by traces on substrate 12.

Microelectronic assembly 10 further includes a plurality of wire bonds 32 joined to at least some of the conductive elements 28, such as on the pads 30 thereof. Wire bonds 32 are bonded along a portion of the edge surface 37 thereof to the conductive elements 28. Examples of such bonding include stitch bonding, wedge bonding and the like. As will be described in further detail below, a wire bonding tool can be used to stitch-bond a segment of wire extending from a capillary of the wire bonding tool to a conductive element 28 while severing the stitch-bonded end of the wire from a supply of wire in the capillary. The wire bonds are stitch-bonded to the conductive elements 28 at their respective "bases" 34. Hereinafter, the "base" 34 of such stitch-bonded wire bond 32 refers to the portion of the wire bond which forms a joint with the conductive element 28. Alternatively, wire bonds can be joined to at least some of the conductive elements using ball bonds, examples of which are shown and described in co-pending, commonly assigned U.S. patent application, the entire disclosure of which is incorporated by reference herein.

The incorporation of various forms of edge bonds, as described herein, can allow for conductive elements 28 to be non-solder-mask-defined ("NSMD") type conductive elements. In packages using other types of connections to conductive elements, for example solder balls or the like, the conductive elements are solder-mask defined. That is the conductive elements are exposed in openings formed in a solder mask material layer. In such an arrangement, the solder mask layer can partially overlie the conductive elements or can contact the conductive elements along an edge thereof. By contrast, a NSMD conductive element is one that is not contacted by a solder mask layer. For example, the conductive element can be exposed on a surface of a substrate that does not have a solder mask layer or, if present, a solder mask layer on the surface can have an opening with edges spaced away from the conductive element. Such NSMD conductive elements can also be formed in shapes that are not round. Solder-mask defined pads can often be round when intended to be used to bond to an element via a solder mass, which forms a generally round profile on such a surface. When using, for example, an edge bond to attach to a conductive element, the bond profile itself is not round, which can allow for a non-round conductive element. Such non-round conductive elements can be, for example oval, rectangular, or of a rectangular shape with rounded corners. They can further be configured to be longer in the direction of the edge bond to accommodate the bond, while being shorter in the direction of the wire bond's 32 width. This can allow for a finer pitch at the substrate 12 level. In one example, the conductive elements 28 can be between about 10% and 25% larger than the intended size of base 34 in both directions. This can allow for variations in the precision with which the bases 34 are located and for variations in the bonding process.

Figure 23A:
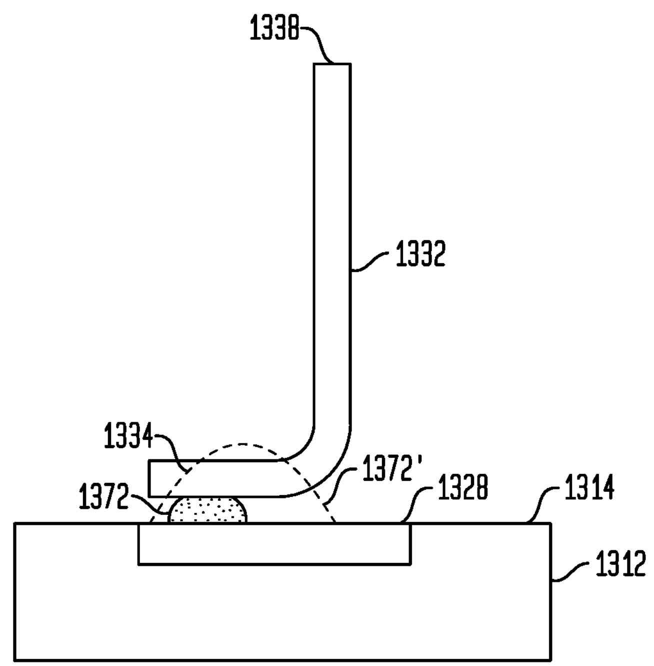
FIGS. 23A and 23B are fragmentary sectional views illustrating wire bonds according to another embodiment.
Figure 23B:
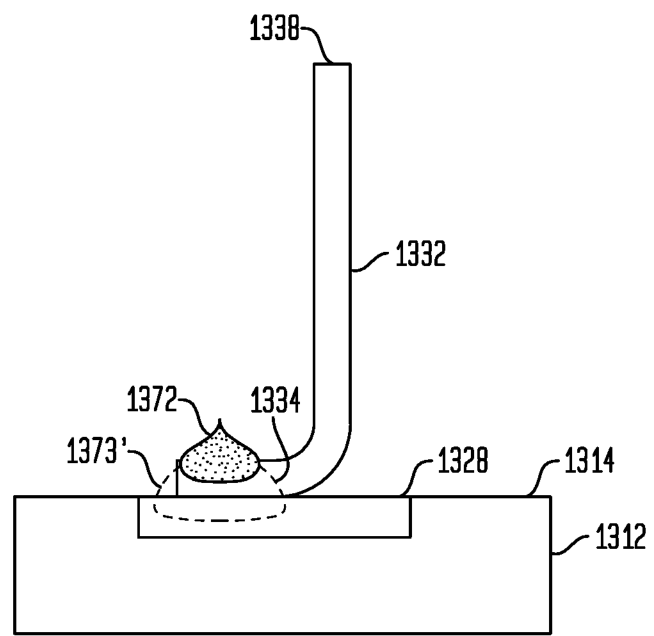

In some embodiments, an edge bonded wire bond, as described above, which can be in the form of a stitch bond, can be combined with a ball bond. As shown in FIG. 23A a ball bond can be formed on a conductive element 1328 at a surface 1314 of a substrate 1312 and a wire bond 1332 can be formed with a base 1334 stitch bonded along a portion of the edge surface to ball bond 1372 and an end surface 1338 remote from the base. In another example, the general size and placement of the ball bond can be as shown at 1372'. In another variation shown in FIG. 23B, a wire bond 1332 can be edge bonded along conductive element 1328, such as by stitch bonding, as described above. A ball bond 1372 can then be formed on top of the base 1334 of wire bond 1332. In one example, the size and placement of the ball bond can be as shown at 1373'. Referring to FIG. 1, each of the wire bonds 32 can extend to a free end 36 remote from the base 34 of such wire bond and remote from substrate 12. The ends 36 of wire bonds 32 are characterized as being free in that they are not electrically connected or otherwise joined to microelectronic element 22 or any other conductive features within microelectronic assembly 10 that are, in turn, connected to microelectronic element 22. In other words, free ends 36 are available for electronic connection, either directly or indirectly as through a solder ball or other features discussed herein, to a conductive feature external to assembly 10. The fact that ends 36 are held in a predetermined position by, for example, encapsulation layer 42 or otherwise joined or electrically connected to another conductive feature does not mean that they are not "free" as described herein, so long as any such feature is not electrically connected to microelectronic element 22. Conversely, base 34 is not free as it is either directly or indirectly electrically connected to microelectronic element 22, as described herein. As shown in FIG. 1, the bases 34 of the wire bonds 32 typically are curved at their stitch bond (or other edge bonded) joints with the respective conductive elements 28. Each wire bond has an edge surface 37 extending between the base 34 thereof and the end 36 of such wire bond. The particular size and shape of base 34 can vary according to the type of material used to form wire bond 32, the desired strength of the connection between wire bond 32 and conductive element 28, or the particular process used to form wire bond 32. Alternative embodiments are possible where wire bonds 32 are additionally or alternatively joined to conductive elements 40 exposed on second surface 16 of substrate 12, extending away therefrom.

Figure 2:
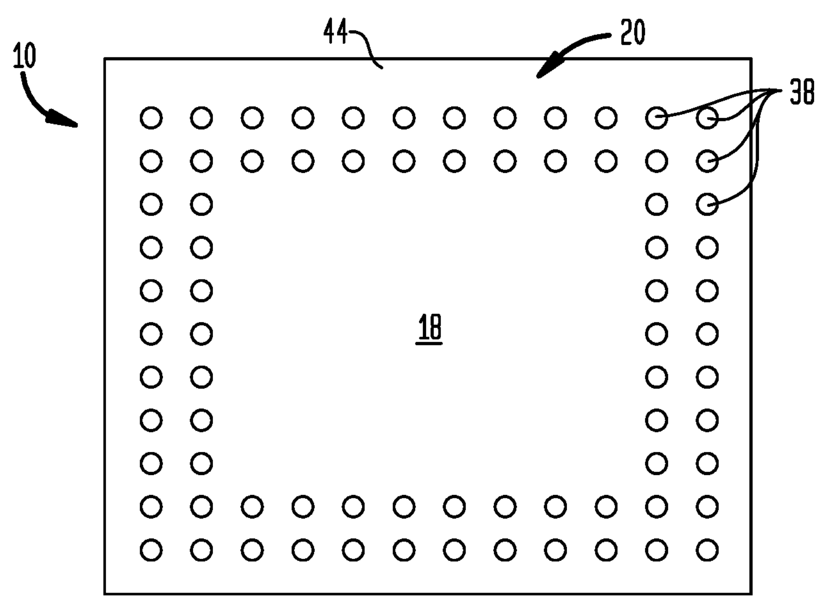
FIG. 2 shows a top plan view of the microelectronic package of FIG. 1.

In a particular example, a first one of the wire bonds 32 may be adapted, i.e., constructed, arranged, or electrically coupled to other circuitry on the substrate for carrying a first signal electric potential, and a second one of the wire bonds 32 may be so adapted for simultaneously carrying a second signal electric potential different from the first signal electric potential. Thus, when a microelectronic package as seen in FIGS. 1 and 2 is energized, the first and second wire bonds can simultaneously carry first and second different signal electric potentials.

Wire bond 32 can be made from a conductive material such as copper, copper alloy or gold. Additionally, wire bonds 32 can be made from combinations of materials, such as from a core of a conductive material, such as copper or aluminum, for example, with a coating applied over the core. The coating can be of a second conductive material, such as aluminum, nickel or the like. Alternatively, the coating can be of an insulating material, such as an insulating jacket.

In particular embodiments, the wire bonds may have a core of primary metal and a metallic finish including a second metal different from the primary metal overlying the primary metal. For example, the wire bonds may have a primary metal core of copper, copper alloy or gold and the metallic finish can include palladium. Palladium can avoid oxidation of a core metal such as copper, and may serve as a diffusion barrier to avoid diffusion a solder-soluble metal such as gold in solder joints between unencapsulated portions 39 of the wire bonds and another component as will be described further below. Thus, in one embodiment, the wire bonds can be formed of palladium-coated copper wire or palladium-coated gold wire which can be fed through the capillary of the wire bonding tool.

Figure 6:
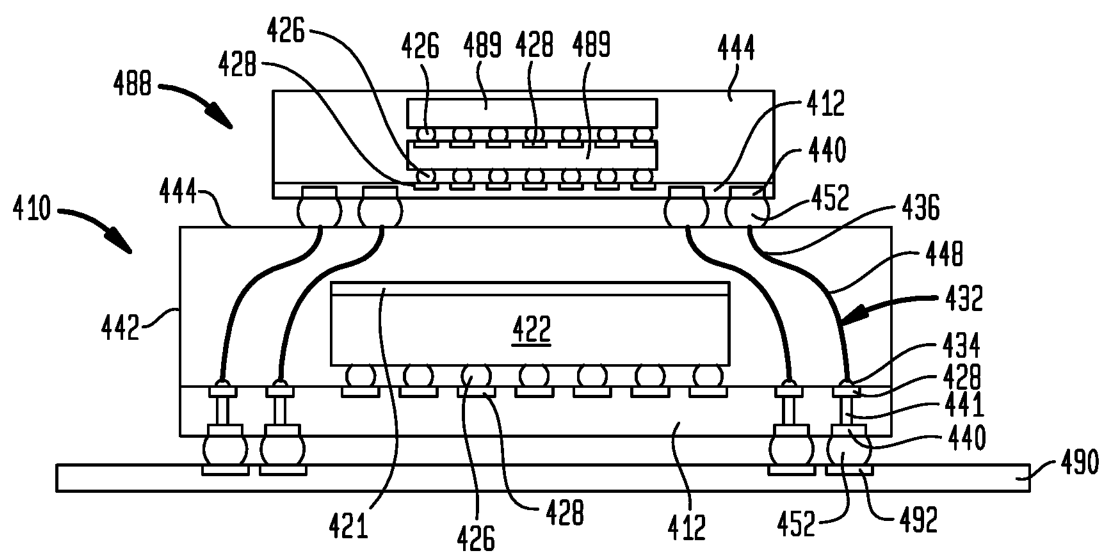
FIG. 6 is a sectional view illustrating a microelectronic assembly including a microelectronic package according to one or more of the foregoing embodiments and an additional microelectronic package and a circuit panel electrically connected thereto.

In an embodiment, the wire used to form wire bonds 32 can have a thickness, i.e., in a dimension transverse to the wire's length, of between about 15 μm and 150 μm. In general, a wire bond is formed on a conductive element, such as conductive element 28, a pad, trace or the like, using specialized equipment that is known in the art. The free end 36 of wire bond 32 has an end surface 38. End surface 38 can form at least a part of a contact in an array formed by respective end surfaces 38 of a plurality of wire bonds 32. FIG. 2 shows an exemplary pattern for such an array of contacts formed by end surfaces 38. Such an array can be formed in an area array configuration, variations of which could be implemented using the structures described herein. Such an array can be used to electrically and mechanically connect the microelectronic assembly 10 to another microelectronic structure, such as to a printed circuit board ("PCB"), or to other packaged microelectronic elements, an example of which is shown in FIG. 6. In such a stacked arrangement, wire bonds 32 and conductive elements 28 and 40 can carry multiple electronic signals therethrough, each having a different signal potential to allow for different signals to be processed by different microelectronic elements in a single stack. Solder masses 52 can be used to interconnect the microelectronic assemblies in such a stack, such as by electronically and mechanically attaching end surfaces 38 to conductive elements 40.

Microelectronic assembly 10 further includes an encapsulation layer 42 formed from a dielectric material. In the embodiment of FIG. 1, encapsulation layer 42 is formed over the portions of first surface 14 of substrate 12 that are not otherwise covered by or occupied by microelectronic element 22, or conductive elements 28. Similarly, encapsulation layer 42 is formed over the portions of conductive elements 28, including pad 30 thereof, that are not otherwise covered by wire bonds 32. Encapsulation layer 42 can also substantially cover microelectronic element 22, wire bonds 32, including the bases 34 and at least a portion of edge surfaces 37 thereof. A portion of wire bonds 32 can remain uncovered by encapsulation layer 42, which can also be referred to as unencapsulated portions 39, thereby making the wire bond available for electrical connection to a feature or element located outside of encapsulation layer 42. In an embodiment, end surfaces 38 of wire bonds 32 remain uncovered by encapsulation layer 42 within major surface 44 of encapsulation layer 42. Other embodiments are possible in which a portion of edge surface 37 is uncovered by encapsulation layer 42 in addition to or as an alternative to having end surface 38 remain uncovered by encapsulation layer 42. In other words, encapsulation layer 42 can cover all of microelectronic assembly 10 from first surface 14 and above, with the exception of a portion of wire bonds 32, such as end surfaces 38, edge surfaces 37 or combinations of the two. In the embodiments shown in the Figures, a surface, such as major surface 44 of encapsulation layer 42 can be spaced apart from first surface 14 of substrate 12 at a distance great enough to cover microelectronic element 22. Accordingly, embodiments of microelectronic assembly 10 in which ends 38 of wire bonds 32 are flush with surface 44, will include wire bonds 32 that are taller than the microelectronic element 22, and any underlying solder bumps for flip chip connection. Other configurations for encapsulation layer 42, however, are possible. For example, the encapsulation layer can have multiple surfaces with varying heights. In such a configuration, the surface 44 within which ends 38 are positioned can be higher or lower than an upwardly facing surface under which microelectronic element 22 is located.

Encapsulation layer 42 serves to protect the other elements within microelectronic assembly 10, particularly wire bonds 32. This allows for a more robust structure that is less likely to be damaged by testing thereof or during transportation or assembly to other microelectronic structures. Encapsulation layer 42 can be formed from a dielectric material with insulating properties such as that described in U.S. Patent App. Pub. No. 2010/0232129, which is incorporated by reference herein.

Figure 3:
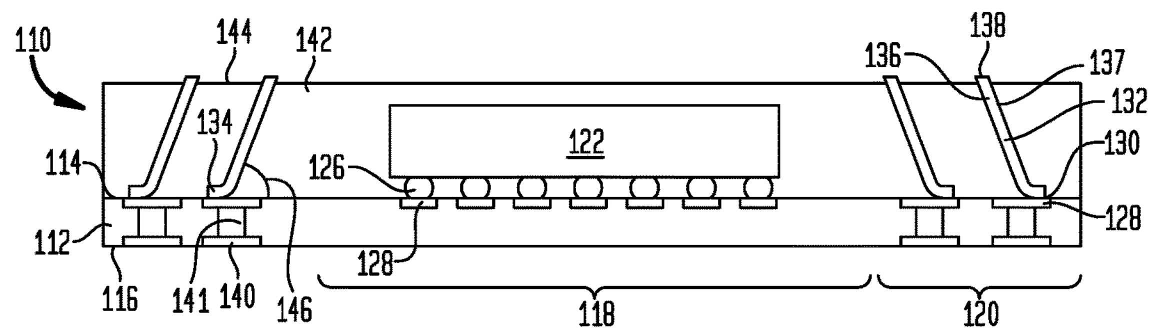
FIG. 3 is a sectional view depicting a microelectronic package according to a variation of the embodiment shown in FIG. 1.

FIG. 3 shows an embodiment of microelectronic assembly 110 having wire bonds 132 with ends 136 that are not positioned directly above the respective bases 134 thereof. That is, considering first surface 114 of substrate 112 as extending in two lateral directions, so as to substantially define a plane, end 136 or at least one of the wire bonds 132 is displaced in at least one of these lateral directions from a corresponding lateral position of base 134 in second region 120. As shown in FIG. 3, wire bonds 132 can be substantially straight along the longitudinal axis thereof, as in the embodiment of FIG. 1, with the longitudinal axis being angled at an angle 146 with respect to first surface 114 of substrate 112. Although the cross-sectional view of FIG. 3 only shows the angle 146 through a first plane perpendicular to first surface 114, wire bond 132 can also be angled with respect to first surface 114 in another plane perpendicular to both that first plane and to first surface 114. Such an angle can be substantially equal to or different than angle 146. That is the displacement of end 136 relative to base 134 can be in two lateral directions and can be by the same or a different distance in each of those directions.

Figure 4:
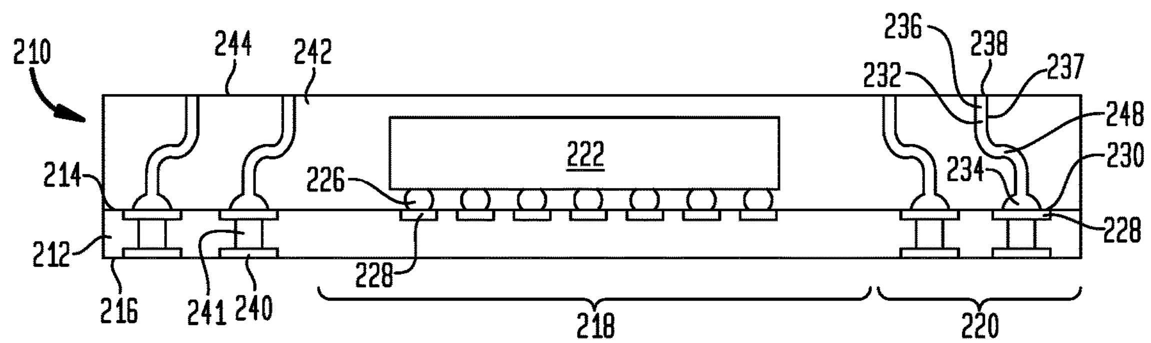
FIG. 4 is a sectional view depicting a microelectronic package according to a variation of the embodiment shown in FIG. 1.
Figure 8:
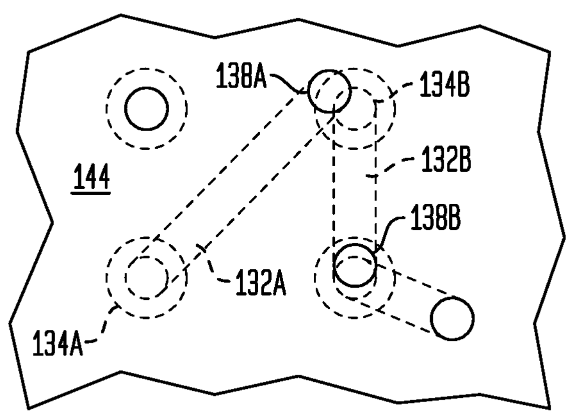
FIG. 8 is a fragmentary top elevation view further illustrating a microelectronic package according to an embodiment of the invention.

In an embodiment, various ones of wire bonds 132 can be displaced in different directions and by different amounts throughout the assembly 110. Such an arrangement allows for assembly 110 to have an array that is configured differently on the level of surface 144 of encapsulation layer 142 compared to on the level of substrate 112. For example, an array can cover a smaller overall area or have a smaller pitch on surface 144 compared to that at first surface 114 of substrate 112. Further, some wire bonds 132 can have ends 136 that are positioned above microelectronic element 122 to accommodate a stacked arrangement of packaged microelectronic elements of different sizes. In another example, wire bonds 132 can be configured such that the end of one wire bond is positioned substantially above the base of a second wire bond, wherein the end of that second wire bond being positioned elsewhere. Such an arrangement can be referred to as changing the relative position of a contact end surface 138 within an array of contacts, compared to the position of a corresponding contact array on second surface 116. In another example, shown in FIG. 8, wire bonds 132 can be configured such that the end surface 138A of one wire bond 132A is positioned substantially above the base 134B of another wire bond 132B, the end surface 138B of that wire bond 132B being positioned elsewhere. Such an arrangement can be referred to as changing the relative position of a contact end surface 138 within an array of contacts, compared to the position of a corresponding contact array on second surface 116. Within such an array, the relative positions of the contact end surfaces can be changed or varied, as desired, depending on the microelectronic assembly's application or other requirements. FIG. 4 shows a further embodiment of a microelectronic subassembly 210 having wire bonds 232 with ends 236 in displaced lateral positions with respect to bases 234. In the embodiment of FIG. 4, the wire bonds 132 achieve this lateral displacement by including a curved portion 248 therein. Curved portion 248 can be formed in an additional step during the wire bond formation process and can occur, for example, while the wire portion is being drawn out to the desired length. This step can be carried out using available wire-bonding equipment, which can include the use of a single machine.

Curved portion 248 can take on a variety of shapes, as needed, to achieve the desired positions of the ends 236 of the wire bonds 232. For example, curved portions 248 can be formed as S-curves of various shapes, such as that which is shown in FIG. 4 or of a smoother form (such as that which is shown in FIG. 5). Additionally, curved portion 248 can be positioned closer to base 234 than to end 236 or vice-versa. Curved portion 248 can also be in the form of a spiral or loop, or can be compound including curves in multiple directions or of different shapes or characters.

Figure 26:
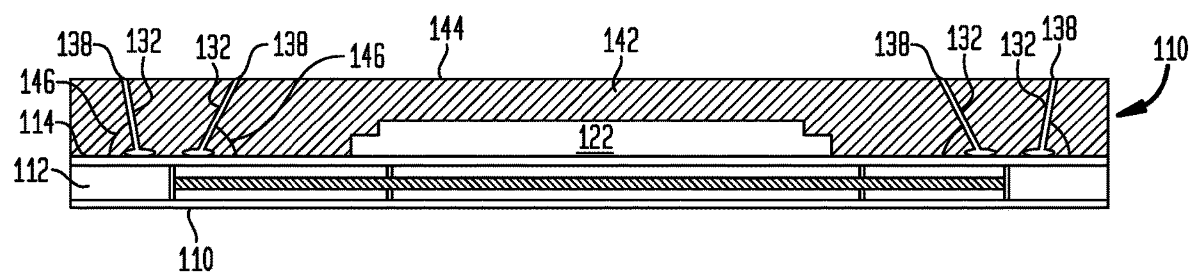
FIG. 26 shows a sectional view of a microelectronic package according to another embodiment.

In a further example shown in FIG. 26, the wire bonds 132 can be arranged such that the bases 134 are arranged in a first pattern having a pitch thereof. The wire bonds 132 can be configured such that the unencapsulated portions thereof 139 including end surfaces 138, can be disposed at positions in a pattern having a minimum pitch between adjacent unencapsulated portions or unencapsulated end surfaces 138 of the wire bonds 132 exposed at the surface 144 of the encapsulation layer 142 that is greater than the minimum pitch between adjacent bases of the plurality of bases 134 and, accordingly, the conductive elements 128 to which the bases are joined). To achieve this, the wire bonds can include portions which extend in one or more angles relative to a normal direction to the conductive elements, such as shown in FIG. 26. In another example, the wire bonds can be curved as shown, for example in FIG. 4, such that the end surfaces 238 are displaced in one or more lateral directions from the bases 134, as discussed above. As further shown in FIG. 26, the conductive elements 128 and the end surfaces 138 can be arranged in respective rows or columns and the lateral displacement of end surfaces 138 at some locations, such as in one row of the ends, from the respective conductive elements on the substrate to which they are joined can be greater than the lateral displacement of the unencapsulated portions at other locations from the respective conductive elements to which they are connected. To achieve this, the wire bonds 132 can, for example be at different angles 146 with respect to the surface 116 of the substrate 112.

Figure 5A:
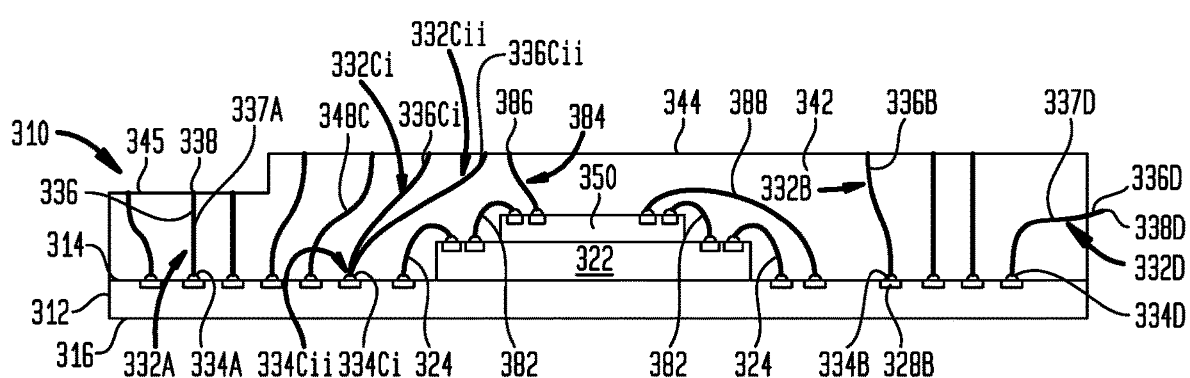
FIG. 5A is a sectional view depicting a microelectronic package according to a variation of the embodiment shown in FIG. 1.

FIG. 5A shows a further exemplary embodiment of a microelectronic package or microelectronic assembly 310 having a combination of wire bonds 332 having various shapes leading to various relative lateral displacements between bases 334 and ends 336. Some of wire bonds 332A are substantially straight with ends 336A positioned above their respective bases 334A, while other wire bonds 332B include a subtle curved portion 348B leading to a somewhat slight relative lateral displacement between end 336B and base 334B. Further, some wire bonds 332C include curved portions 348C having a sweeping shape that result in ends 336C that are laterally displaced from the relative bases 334C at a greater distance than that of ends 336B. FIG. 5 also shows an exemplary pair of such wire bonds 332Ci and 332Cii that have bases 334Ci and 334Cii positioned in the same row of a substrate-level array and ends 336Ci and 336Cii that are positioned in different rows of a corresponding surface-level array. In some cases, the radius of bends in the wire bonds 332Ci, 332Cii can be large such that the curves in the wire bonds may appear continuous. In other cases, the radius of the bends may be relatively small, and the wire bonds may even have straight portions or relatively straight portions between bends in the wire bonds. Moreover, in some cases the unencapsulated portions of the wire bonds can be displaced from their bases by at least one minimum pitch between the contacts 328 of the substrate. In other cases, the unencapsulated portions of the wire bonds can be displaced from their bases by at least 200 microns.

A further variation of a wire bond 332D is shown that is configured to be uncovered by encapsulation layer 342 on a side surface 347 thereof. In the embodiment shown free end 336D is uncovered, however, a portion of edge surface 337D can additionally or alternatively be uncovered by encapsulation layer 342. Such a configuration can be used for grounding of microelectronic assembly 10 by electrical connection to an appropriate feature or for mechanical or electrical connection to other featured disposed laterally to microelectronic assembly 310. Additionally, FIG. 5 shows an area of encapsulation layer 342 that has been etched away, molded, or otherwise formed to define a recessed surface 345 that is positioned closer to substrate 12 than major surface 344. One or more wire bonds, such as wire bond 332A can be uncovered within an area along recessed surface 345. In the exemplary embodiment shown in FIG. 5, end surface 338A and a portion of edge surface 337A are uncovered by encapsulation layer 342. Such a configuration can provide a connection, such as by a solder ball or the like, to another conductive element by allowing the solder to wick along edge surface 337A and join thereto in addition to joining to end surface 338A. Other configurations by which a portion of a wire bond can be uncovered by encapsulation layer 342 along recessed surface 345 are possible, including ones in which the end surfaces are substantially flush with recessed surface 345 or other configurations shown herein with respect to any other surfaces of encapsulation layer 342. Similarly, other configurations by which a portion of wire bond 332D is uncovered by encapsulation layer 342 alongside surface 347 can be similar to those discussed elsewhere herein with respect to the variations of the major surface of the encapsulation layer.

FIG. 5A further shows a microelectronic assembly 310 having two microelectronic elements 322 and 350 in an exemplary arrangement where microelectronic element 350 is stacked, face-up, on microelectronic element 322. In this arrangement, leads 324 are used to electrically connect microelectronic element 322 to conductive features on substrate 312. Various leads are used to electronically connect microelectronic element 350 to various other features of microelectronic assembly 310. For example, lead 380 electrically connects microelectronic element 350 to conductive features of substrate 312, and lead 382 electrically connects microelectronic element 350 to microelectronic element 322. Further, wire bond 384, which can be similar in structure to various ones of wire bonds 332, is used to form a contact surface 386 on the surface 344 of encapsulation layer 342 that electrically connected to microelectronic element 350. This can be used to directly electrically connect a feature of another microelectronic assembly to microelectronic element 350 from above encapsulation layer 342. Such a lead could also be included that is connected to microelectronic element 322, including when such a microelectronic element is present without a second microelectronic element 350 affixed thereon. An opening (not shown) can be formed in encapsulation layer 342 that extends from surface 344 thereof to a point along, for example, lead 380, thereby providing access to lead 380 for electrical connection thereto by an element located above surface 344. A similar opening can be formed over any of the other leads or wire bonds 332, such as over wire bonds 332C at a point away from the ends 336C thereof. In such an embodiment, ends 336C can be positioned beneath surface 344, with the opening providing the only access for electrical connection thereto.

Figure 27A:
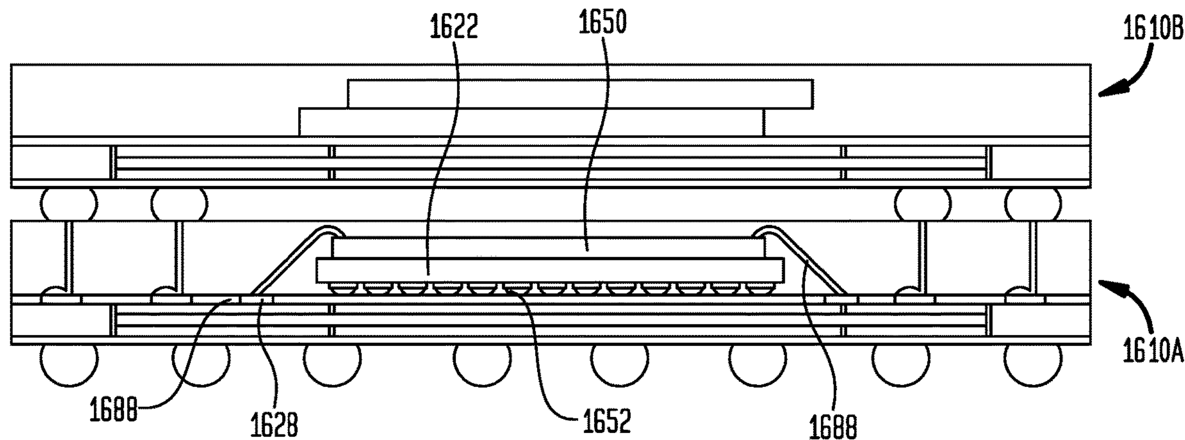
FIGS. 27A-C are sectional views showing examples of embodiments of microelectronic packages according to further embodiments.
Figure 27B:
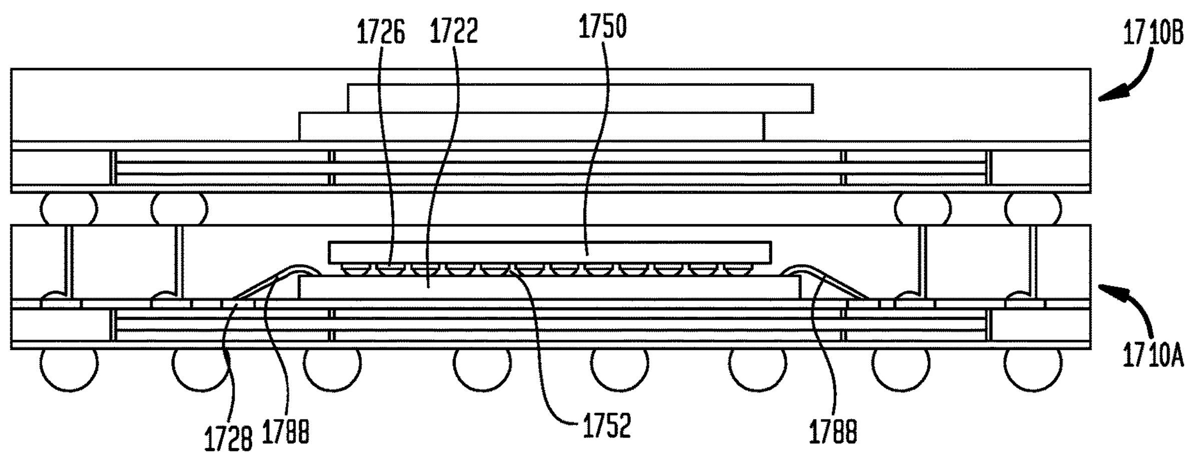
Figure 27C:
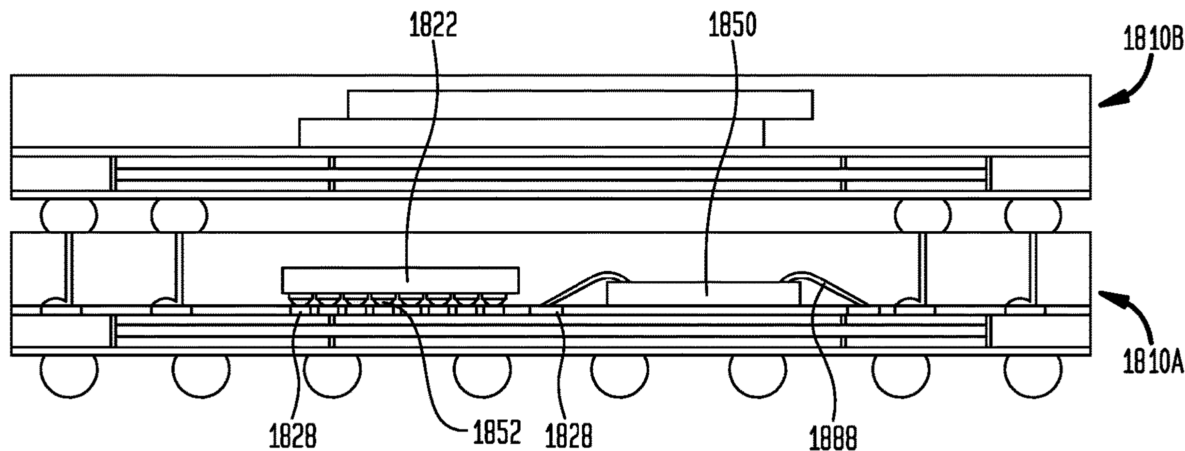

Additional arrangements for microelectronic packages having multiple microelectronic elements are shown in FIGS. 27A-C. These arrangements can be used in connection with the wire bond arrangements shown, for example in FIG. 5A and in the stacked package arrangement of FIG. 6, discussed further below. Specifically, FIG. 27A shows an arrangement of joined microelectronic packages 1610A, 1610B in which a lower microelectronic element 1622 is flip-chip bonded to conductive elements 1628 on a surface of a substrate with conductive masses 1652. The second microelectronic element 1650 can overlie the first microelectronic element 1622 and be face-up connected to additional conductive elements 1628 on the substrate, such as through wire bonds 1688. FIG. 27B shows an arrangement of joined microelectronic packages 1710A, 1710B where a first microelectronic element 1722 is face-up mounted on a surface of a substrate and connected through wire bonds 1788 to conductive elements 1728. Second microelectronic element 1750 can have contacts exposed at a face thereof which face and are joined to corresponding contacts at a face of the first microelectronic element 1722 which faces away from the substrate. through a set of contacts 1726 of the second microelectronic element 1750 which face and are joined to corresponding contacts on the front face of the first microelectronic element 1722 with conductive masses 1752. These contacts of the first microelectronic element 1722 which are joined to corresponding contacts of the second microelectronic element can in turn be connected through circuit patterns of the first microelectronic element 1722 and be connected by wire bonds 1788 to the conductive elements 1728 on the substrate.

FIG. 27C shows an example of joined microelectronic packages 1810A, 1810B in which first and second microelectronic elements 1822, 1850 are spaced apart from one another in a direction along a surface of a substrate. Either one or both of the microelectronic elements (and additional microelectronic elements) can be mounted in face up or flip chip configurations described herein and electrically connected to conductive elements 1828 of the substrate with wire bonds 1888 or conductive masses 1852, respectively. Further, any of the microelectronic elements employed in such an arrangement can be connected to each other through circuit patterns on one or both such microelectronic elements or on the substrate or on both, which electrically connect respective conductive elements 1828 to which the microelectronic elements are electrically connected.

Figure 5B:
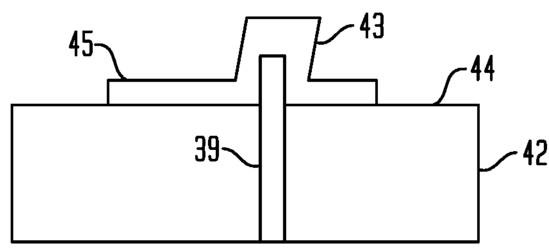
FIG. 5B is a fragmentary sectional view depicting a conductive element formed on an unencapsulated portion of a wire bond according to an embodiment of the invention.

FIG. 5B further illustrates a structure according to a variation of the above-described embodiments in which a second conductive element 43 can be formed in contact with an unencapsulated portion 39 of a wire bond exposed at or projecting above a surface 44 of the encapsulation layer 42, the second conductive element not contacting the first conductive element 28 (FIG. 1). In one embodiment as seen in FIG. 5B, the second conductive element can include a pad 45 extending onto a surface 44 of the encapsulation layer which can provide a surface for joining with a bonding metal or bonding material of a component thereto.

Figure 5C:
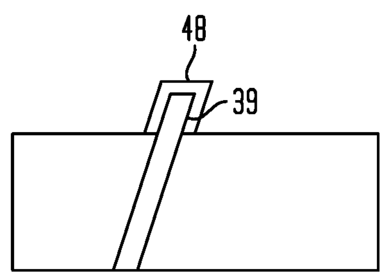
FIG. 5C is a fragmentary sectional view depicting a conductive element formed on an unencapsulated portion of a wire bond according to a variation of that shown in FIG. 5B.

Alternatively, as seen in FIG. 5C, the second conductive element 48 can be a metallic finish selectively formed on the unencapsulated portion 39 of a wire bond. In either case, in one example, the second conductive element 43 or 48 can be formed, such as by plating, of a layer of nickel contacting the unencapsulated portion of the wire bond and overlying a core of the wire bond, and a layer of gold or silver overlying the layer of nickel. In another example, the second conductive element may be a monolithic metal layer consisting essentially of a single metal. In one example, the single metal layer can be nickel, gold, copper, palladium or silver. In another example, the second conductive element 43 or 48 can include or be formed of a conductive paste contacting the unencapsulated portion 39 of the wire bond. For example, stenciling, dispensing, screen printing, controlled spraying, e.g., a process similar to inkjet printing, or transfer molding can be used to form second conductive elements 43 or 48 on the unencapsulated portions 39 of the wire bonds.

Figure 5D:
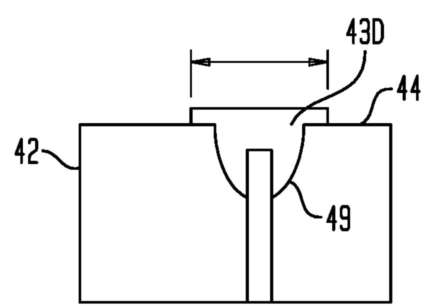
FIG. 5D is a fragmentary sectional view depicting a conductive element formed on an unencapsulated portion of a wire bond according to a variation of that shown in FIG. 5B.

FIG. 5D further illustrates a second conductive element 43D which can be formed of a metal or other electrically conductive material as described for conductive elements 43, 48 above, wherein the second conductive element 43D is formed at least partly within an opening 49 extending into an exterior surface 44 of the encapsulation layer 42. In one example, the opening 49 can be formed by removing a portion of the encapsulation layer after curing or partially curing the encapsulation layer so as to simultaneously expose a portion of the wire bond thereunder which then becomes the unencapsulated portion of the wire bond. For example, the opening 49 can be formed by laser ablation, etching. In another example, a soluble material can be pre-placed at the location of the opening prior to forming the encapsulation layer and the pre-placed material then can be removed after forming the encapsulation layer to form the opening.

Figure 24A:
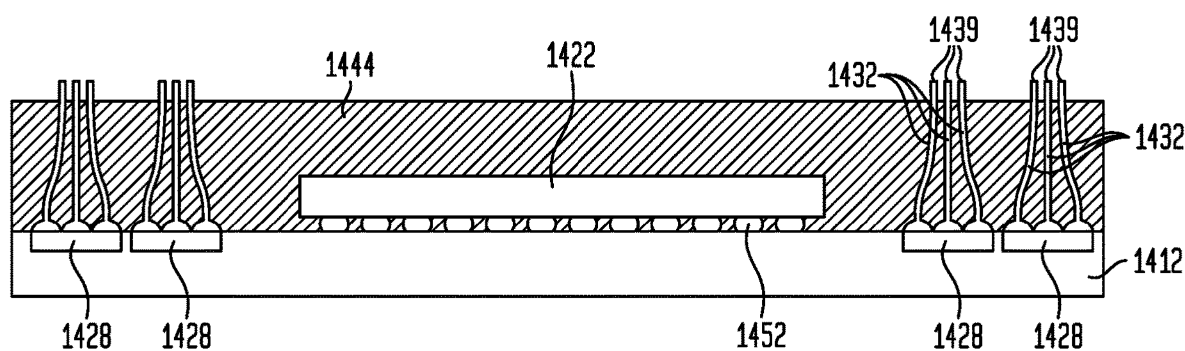
FIGS. 24A and 24B are sectional views of a microelectronic package according to a further embodiment.
Figure 24B:
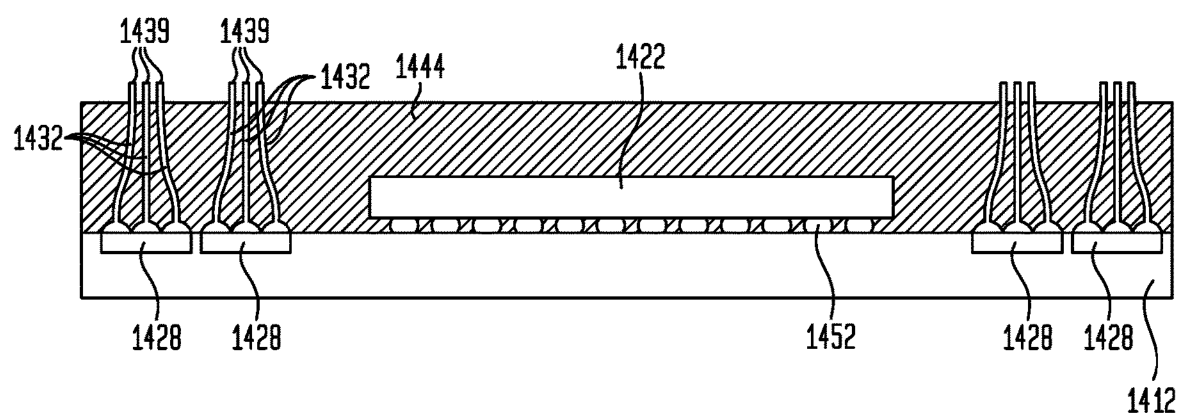

In a further example, as seen in FIGS. 24A-24B, multiple wire bonds 1432 can have bases joined with a single conductive element 1428 at a substrate 1412. Such a group of wire bonds 1432 can be used to make additional connection points over an encapsulation layer for electrical connection with conductive element 1428. The exposed portions 1439 of the commonly-joined wire bonds 1432 can be grouped together on a surface 1444 of the encapsulation layer in an area, for example about the size of conductive element 1428 itself or another area approximating the intended size of a bonding mass for making an external connection with the wire bond 1432 group. As shown, such wire bonds 1432 can be either ball-bonded (FIG. 24A) or edge bonded (FIG. 24B) on conductive element 1428, as described above, or can be bonded to the conductive element as described above with respect to FIG. 23A or 23B or both. A microelectronic element 1422 can be electrically connected to the substrate 1412 with conductive masses 1452.

Figure 25A:
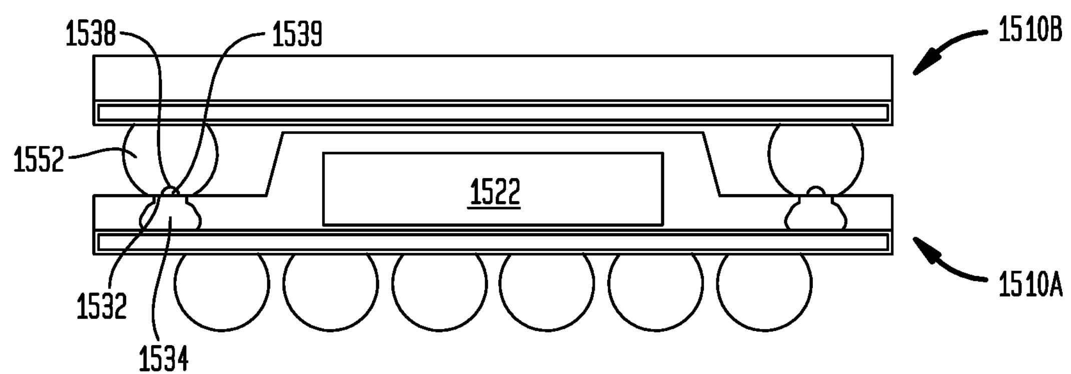
FIGS. 25A and 25B are sectional views of a microelectronic package according to a further embodiment.
Figure 25B:
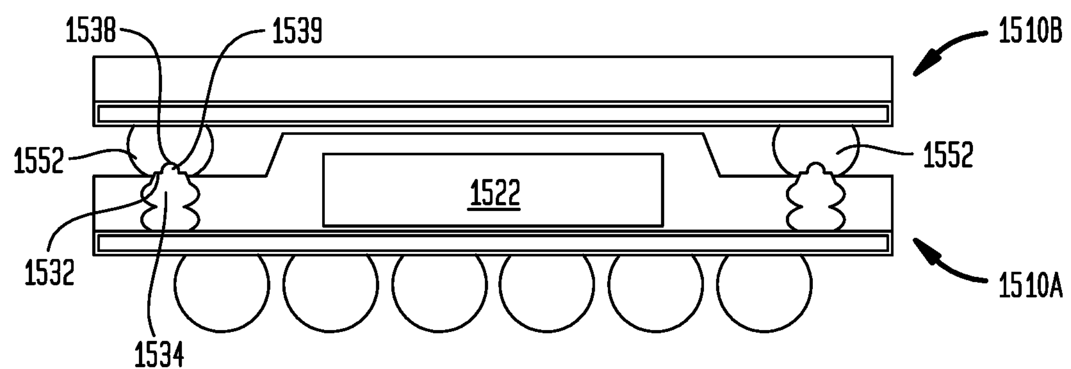

As shown in FIGS. 25A and 25B, ball-bonded wire bonds 1532 can be formed as stud bumps on at least some of the conductive elements 1528. As described herein a stud bump is a ball-bonded wire bond where the segment of wire extending between the base 1534 and the end surface 1538 has a length of at most 300% of the diameter of the ball-bonded base 1534. As in other embodiments, the end surface 1538 and optionally a portion 1539 of the edge surface of the stud bump can be unencapsulated by the encapsulation layer 1542. As shown in FIG. 25B such a stud bump can be formed on top of another stud bump to form, essentially, a base 1534 of a wire bond 1532 made up of the two ball bonds with a wire segment extending therefrom up to the surface of the encapsulation layer 1542. Such wire bonds 1532 can have a height that is less than, for example, the wire bonds described elsewhere in the present disclosure. Accordingly, the encapsulation layer can include a major surface 1544 in an area, for example overlying the microelectronic element 1522 and a minor surface 1545 spaced above the surface 1514 of the substrate 1512 at a height less than that of the major surface 1544. Such arrangements can also be used to form alignment features and to reduce the overall height of a package 1510A employing stud bump type wire bonds as well as other types of wire bonds disclosed herein, while accommodating conductive masses 1552 that can connect the unencapsulated portions 1539 of the wire bonds 1532 with contacts 1543 on another microelectronic package 1510B.

FIG. 6 shows a stacked package of microelectronic packages or microelectronic assemblies 410 and 488. In such an arrangement solder masses 452 electrically and mechanically connect end surfaces 438 wire bonds 432 of assembly 410 to conductive elements or conductive pads 440 of assembly 488. The stacked package can include additional assemblies and can be ultimately attached to contacts 492 on a PCB 490 or the like for use in an electronic device. In such a stacked arrangement, wire bonds 432 and conductive elements 428 can carry multiple electronic signals therethrough, each having a different signal potential to allow for different signals to be processed by different microelectronic elements, such as microelectronic element 422 or microelectronic element 489, in a single stack.

Figure 7:
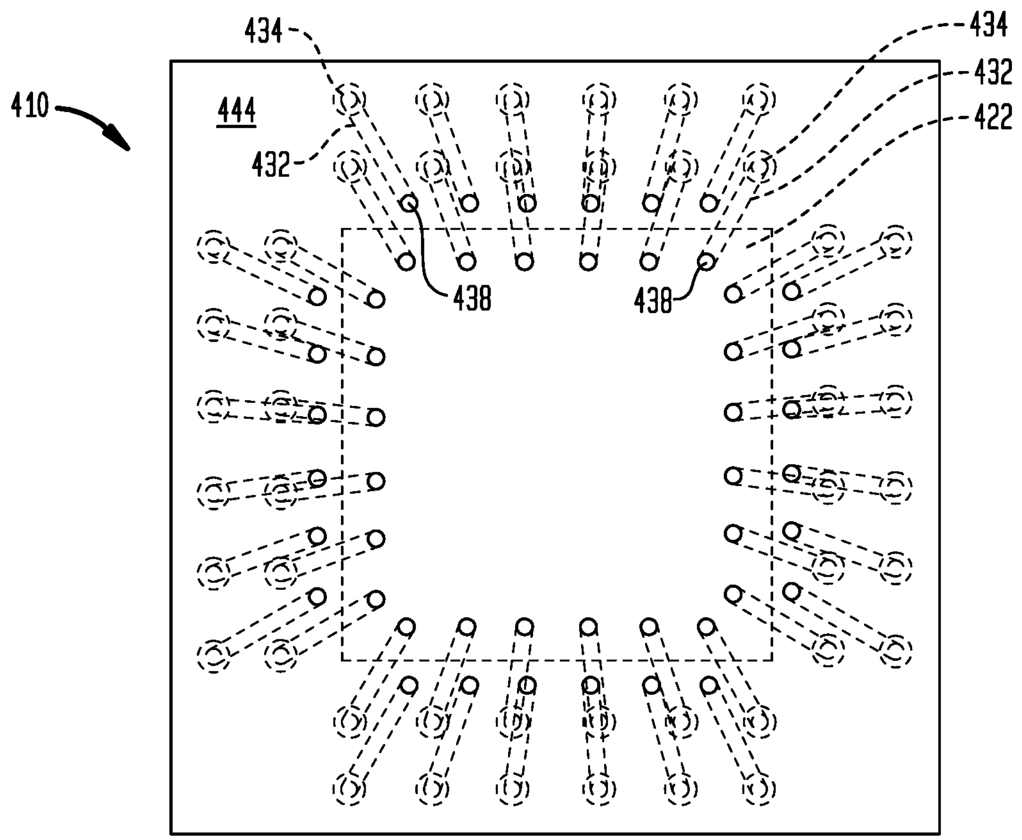
FIG. 7 is a top elevation view illustrating a microelectronic package according to an embodiment of the invention.

In the exemplary configuration in FIG. 6, wire bonds 432 are configured with a curved portion 448 such that at least some of the ends 436 of the wire bonds 432 extend into an area of the encapsulation 442 that overlies a major surface of the microelectronic element 422. Such an area can be defined by the outer periphery of microelectronic element 422 and extending upwardly therefrom to surface 444. An example of such a configuration is shown from a view facing toward the first surface of substrate 412 in FIG. 7, where wire bonds 432 overlie a rear major surface of the microelectronic element 422, which is flip chip bonded at a front face thereof to substrate 412 by conductive masses 426. In another configuration (FIG. 5), the microelectronic element 422 can be mounted face up to the substrate 312, with the front face 325 facing away from the substrate 312 and at least one wire bond 332 overlying the front face of microelectronic element 322. In one embodiment, such wire bond 332 is not electrically connected with microelectronic element 322. A wire bond 332 bonded to substrate 312 may also overlie the front or rear face of microelectronic element 350. The embodiment of microelectronic assembly 410 shown in FIG. 7 is such that conductive elements 428 are arranged in a pattern forming a first array in which the conductive elements 428 are arranged in rows and columns surrounding microelectronic element 422 and may have a predetermined pitch between individual conductive elements 428. Wire bonds 432 are joined to the conductive elements 428 such that the respective bases 434 thereof follow the pattern of the first array as set out by the conductive elements 428. Wire bonds 432 are configured, however, such that the respective ends 436 thereof can be arranged in a different pattern according to a second array configuration. In the embodiment shown the pitch of the second array can be different from, and in some cases finer than that of the first array. However, other embodiments are possible in which the pitch of the second array is greater than the first array, or in which the conductive elements 428 are not positioned in a predetermined array but the ends 436 of the wire bonds 432 are. Further still, conductive elements 428 can be configured in sets of arrays positioned throughout substrate 412 and wire bonds 432 can be configured such that ends 436 are in different sets of arrays or in a single array.

FIG. 6 further shows an insulating layer 421 extending along a surface of microelectronic element 422. Insulating layer 421 can be formed from a dielectric or other electrically insulating material prior to forming the wire bonds. The insulating layer 421 can protect microelectronic element from coming into contact with any of wire bonds 432 that extend thereover. In particular, insulating layer 421 can avoid electrical short circuiting between wire bonds and short circuiting between a wire bond and the microelectronic element 422. In this way, the insulating layer 421 can help avoid malfunction or possible damage due to unintended electrical contact between a wire bond 432 and the microelectronic element 422.

The wire bond configuration shown in FIGS. 6 and 7 can allow for microelectronic assembly 410 to connect to another microelectronic assembly, such as microelectronic assembly 488, in certain instances where the relative sizes of, for example, microelectronic assembly 488 and microelectronic element 422 would not otherwise permit. In the embodiment of FIG. 6 microelectronic assembly 488 is sized such that some of the contact pads 440 are in an array within an area smaller than the area of the front or rear surface of the microelectronic element 422. In a microelectronic assembly having substantially vertical conductive features, such as pillars, in place of wire bonds 432, direct connection between conductive elements 428 and pads 440 would not be possible. However, as shown in FIG. 6, wire bonds 432 having appropriately-configured curved portions 448 can have ends 436 in the appropriate positions to make the necessary electronic connections between microelectronic assembly 410 and microelectronic assembly 488. Such an arrangement can be used to make a stacked package where microelectronic assembly 488 is, for example, a DRAM chip or the like having a predetermined pad array, and wherein microelectronic element 422 is a logic chip configured to control the DRAM chip. This can allow a single type of DRAM chip to be used with several different logic chips of varying sizes, including those which are larger than the DRAM chip because the wire bonds 432 can have ends 436 positioned wherever necessary to make the desired connections with the DRAM chip. In an alternative embodiment, microelectronic package 410 can be mounted on printed circuit board 490 in another configuration, where the unencapsulated ends 436 of wire bonds 432 are electrically connected to contacts 492 of circuit board 490. Further, in such an embodiment, another microelectronic package, such as a modified version of package 488 can be mounted on package 410 by solder masses 452 joined to pads 440.

Figure 9:
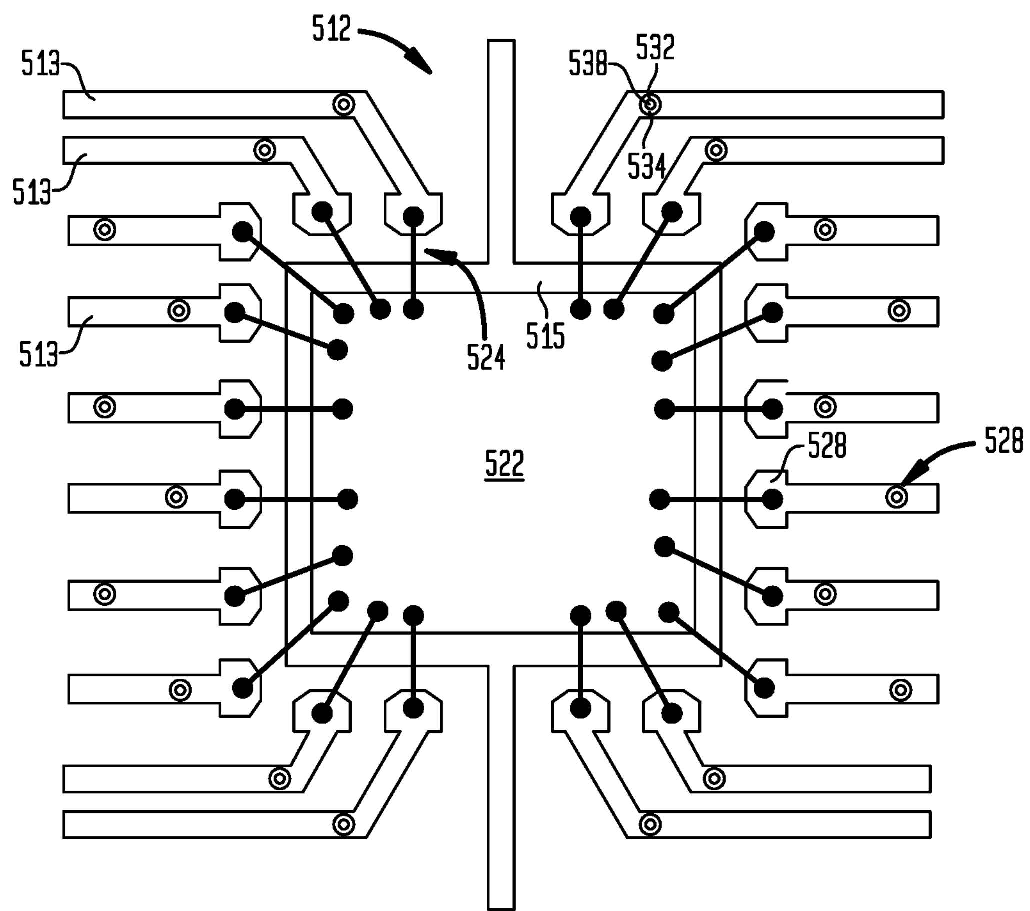
FIG. 9 is a top elevation view illustrating a microelectronic package including a lead frame type substrate according to an embodiment of the invention.
Figure 10:
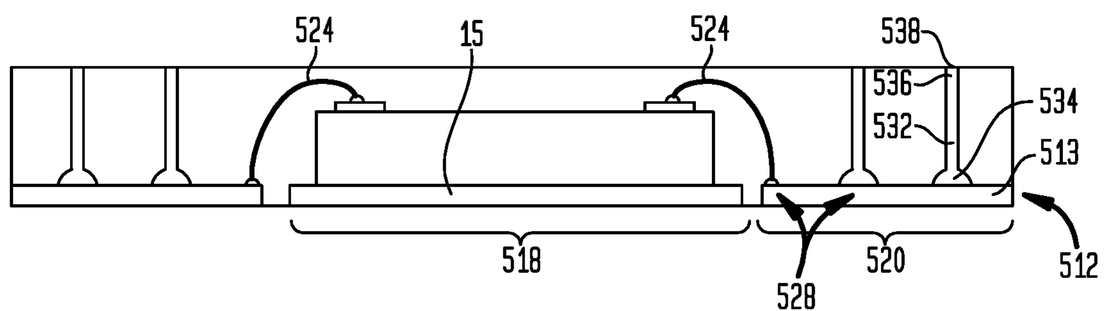
FIG. 10 is a corresponding sectional view of the microelectronic package shown in FIG. 9.

FIGS. 9 and 10 show a further embodiment of a microelectronic assembly in which wire bonds 532 are formed on a lead-frame structure. Examples of lead frame structures are shown and described in U.S. Pat. Nos. 7,176,506 and 6,765,287 the disclosures of which are hereby incorporated by reference herein. In general, a lead frame is a structure formed from a sheet of conductive metal, such as copper, that is patterned into segments including a plurality of leads and can further include a paddle, and a frame. The frame is used to secure the leads and the paddle, if used, during fabrication of the assembly. In an embodiment, a microelectronic element, such as a die or chip, can be joined face-up to the paddle and electrically connected to the leads using wire bonds. Alternatively, the microelectronic element can be mounted directly onto the leads, which can extend under the microelectronic element. In such an embodiment, contacts on the microelectronic element can be electrically connected to respective leads by solder balls or the like. The leads can then be used to form electrical connections to various other conductive structures for carrying an electronic signal potential to and from the microelectronic element. When the assembly of the structure is complete, which can include forming an encapsulation layer thereover, temporary elements of the frame can be removed from the leads and paddle of the lead frame, so as to form individual leads. For purposes of this disclosure, the individual leads 513 and the paddle 515 are considered to be segmented portions of what, collectively, forms a substrate 512 that includes conductive elements 528 in portions that are integrally formed therewith. Further, in this embodiment, paddle 515 is considered to be within first region 518 of substrate 512, and leads 513 are considered to be within second region 520. Wire bonds 524, which are also shown in the elevation view of FIG. 10, connect microelectronic element 522, which is carried on paddle 515, to conductive elements 528 of leads 513. Wire bonds 532 can be further joined at bases 534 thereof to additional conductive elements 528 on leads 513. The encapsulation layer is formed onto the assembly leaving end surfaces 538 of wire bonds 532 uncovered at locations within the major surface of the encapsulation layer. Wire bonds 532 can have additional or alternative portions thereof uncovered by the encapsulation layer in structures that correspond to those described with respect to the other embodiments herein.

Figure 11:
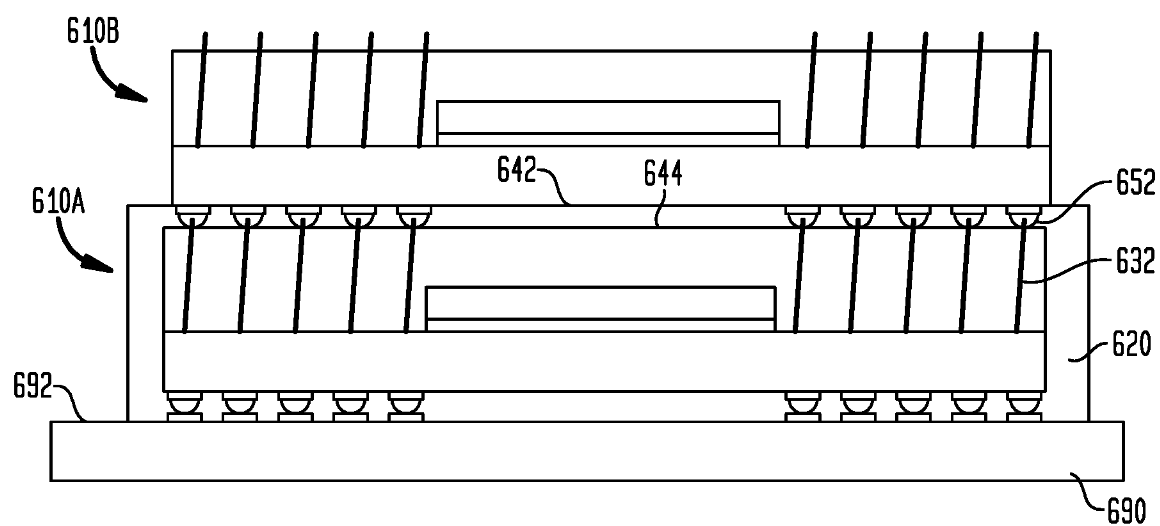
FIG. 11 is a sectional view of a microelectronic assembly including a plurality of microelectronic packages electrically connected together and reinforced with an underfill according to a variation of the embodiment shown in FIG. 6.

FIG. 11 further illustrates use of an underfill 620 for mechanically reinforcing the joints between wire bonds 632 of one package 610A and solder masses 652 of another package 610B mounted thereon. As shown in FIG. 11, although the underfill 620 need only be disposed between confronting surfaces 642, 644 of the packages 610A, 610B, the underfill 620 can contact edge surfaces of package 610A and may contact a first surface 692 of the circuit panel 690 to which the package 610A is mounted. Further, portions of the underfill 620 that extend along the edge surfaces of the packages 610A, 610B, if any, can be disposed at an angle between 0° and 90° relative to a major surface of the circuit panel over which the packages are disposed, and can be tapered from a greater thickness adjacent the circuit panel to a smaller thickness at a height above the circuit panel and adjacent one or more of the packages.

Figure 28A:
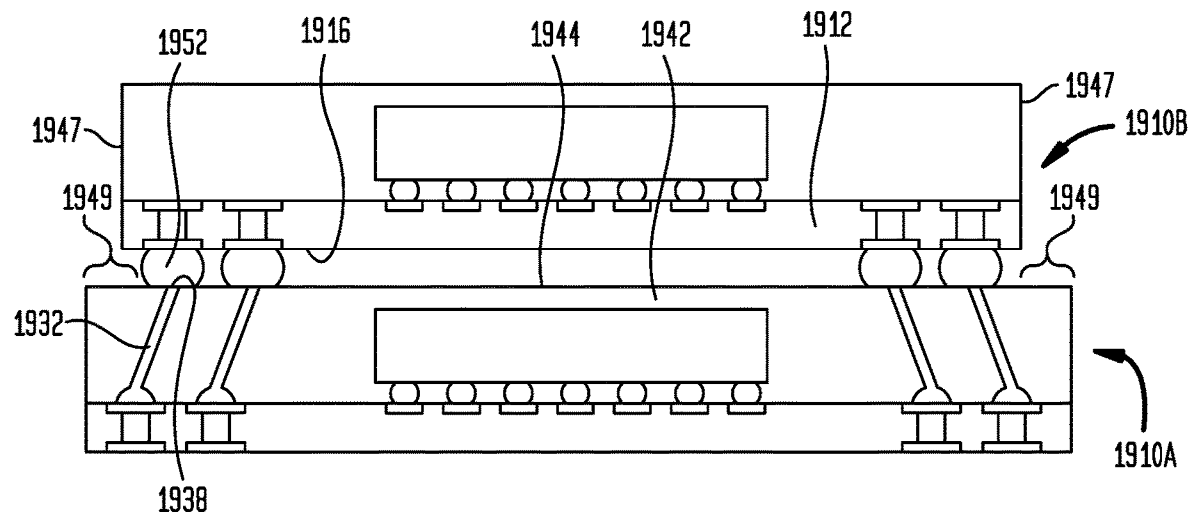
FIGS. 28A-D show various embodiments of microelectronic packages during steps of forming a microelectronic assembly according to an embodiment of the disclosure.
Figure 28B:
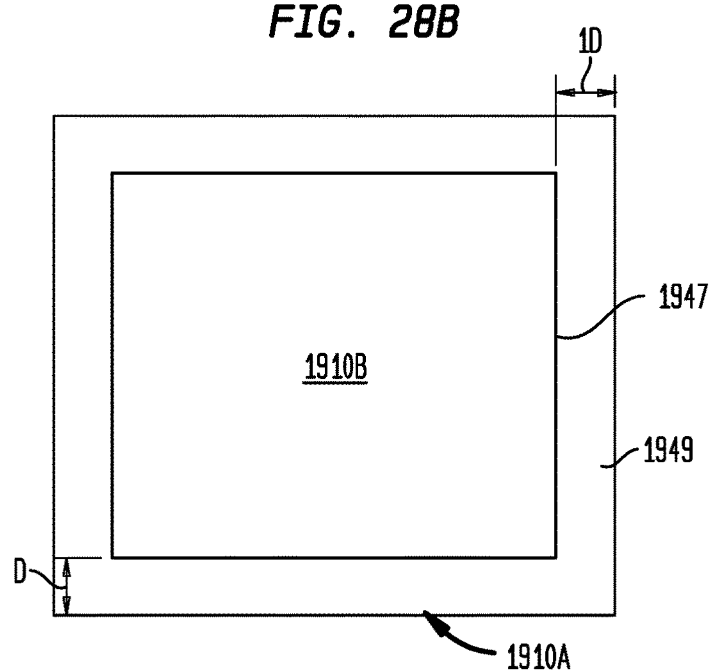
Figure 28C:
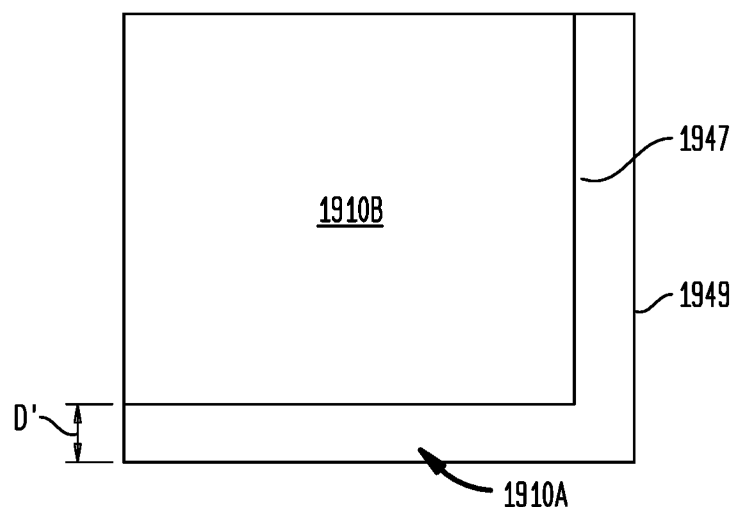
Figure 28D:
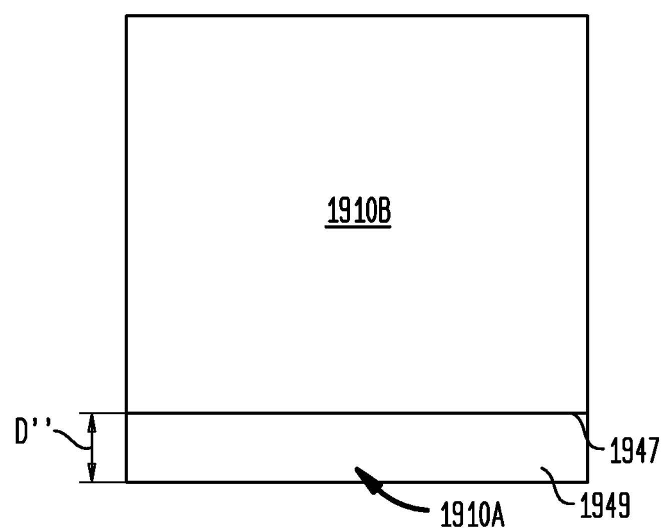

A package arrangement shown in FIGS. 28A-D can be implemented in one technique for making an underfill layer, and in particular a portion thereof that is disposed between confronting faces of packages 1910A and 1910B, such as surface 1944 of package 1910A and surface 1916 of substrate 1912 of package 1910B, the packages being joined by conductive masses 1952 disposed at end surfaces 1938 of wire bonds 1932. As shown in FIG. 28A, package 1910A can extend beyond an edge surface 1947 of package 1910B such that, for example, the surface 1944 of encapsulation layer 1942 has a portion thereof that is exposed outside of package 1910B. Such an area can be used as a dispensing area 1949 whereby a device can deposit an underfill material in a flowable state on the dispensing area from a vertical position relative thereto. In such an arrangement, the dispensing area 1949 can be sized such that the underfill material can be deposited in a mass on the surface without spilling off of the edge of the surface while reaching a sufficient volume to flow under package 1910B where it can be drawn by capillary into the area between the confronting surfaces of packages 1910A and 1910B, including around any joints therebetween, such as solder masses or the like. As the underfill material is drawn between confronting surfaces, additional material can be deposited on the dispensing area such that a continuous flow is achieved that does not significantly spill over the edge of package 1910A. As shown in FIG. 28B, the dispensing area 1949 can surround package 1910B and have a dimension 1D in an orthogonal direction away from a peripheral edge of package 1910B of about one millimeter (1 mm) on each side thereof. Such an arrangement can allow for dispensing on one side of package 1910B or more than one side, either sequentially or simultaneously. Alternative arrangements are shown in FIG. 28C, wherein the dispensing area 1949 extends along only two adjacent sides of package 1910B and have a dimension D' of about 1 mm in a direction orthogonally away from a peripheral edge of the second package, and FIG. 28D, wherein the dispensing area 1949 extends along a single side of package 1910B and may have a dimension D" in an orthogonal direction away from the peripheral edge of the package of, for example 1.5 mm to 2 mm.

Figure 29:
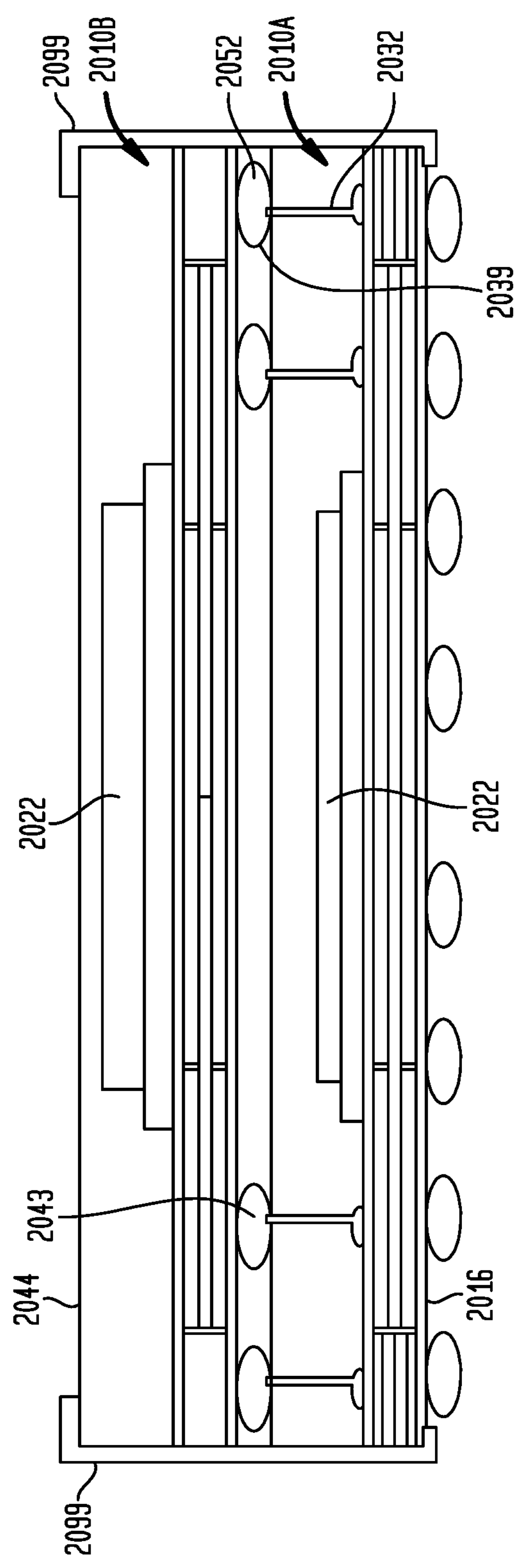
FIG. 29 shows another embodiment of microelectronic packages during steps of forming a microelectronic assembly according to an embodiment of the disclosure.

In an arrangement where microelectronic packages 2010A and 2010B are of similar sizes in a horizontal profile, a compliant bezel 2099 can be used to secure the packages 2010A and 2010B together during attachment by, for example, joining of terminals of the second package with the elements comprising the unencapsulated portions 2039 of the wire bonds 2032, e.g., by heating or curing of conductive masses 2052, e.g., reflowing of solder masses, to join the packages 2010A and 2010B together. Such an arrangement is shown in FIG. 29 in which package 2010B is assembled over package 2010A with conductive masses 2052, e.g., solder masses, for example, joined to terminals 2043 on package 2010B. The packages can be aligned so that the conductive masses 2052 align with unencapsulated portions 2039 of the wire bonds 2032 of package 2010A or with second conductive elements joined with the end surfaces of the wire bonds 2032, as described above. The bezel 2099 can then be assembled around packages 2010A and 2010B to maintain such alignment during a heating process in which the terminals of the second package are joined with the wire bonds 2032 or second conductive elements of the first package. For example, a heating process can be used to reflow conductive masses 2052 to bond the terminals of the second package with the wire bonds 2032 or second conductive elements. Bezel 2099 can also extend inward along portions of surface 2044 of package 2010B and along surface 2016 of package 2010A to maintain the contact between the packages before and during reflow. The bezel 2099 can be of a resiliently compliant material such as rubber, TPE, PTFE (polytetrafluoroethylene), silicone or the like and can be undersized relative to the size of the assembled packages such that a compressive force is applied by the bezel when in place. The bezel 2099 can also be left in place during the application of an underfill material and can include an opening to accommodate such application therethrough. The compliant bezel 2099 can be removed after package assembly.

Figure 30A:
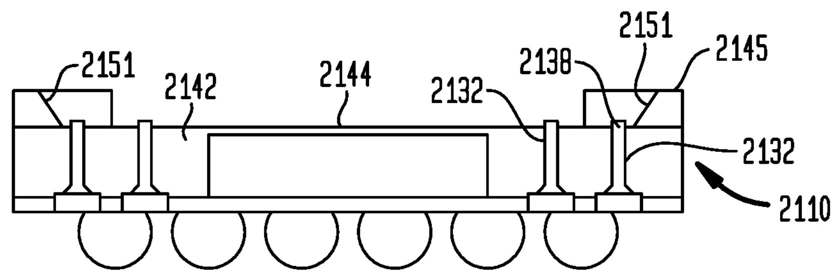
FIGS. 30 A-C show embodiments of microelectronic packages during steps of forming a microelectronic assembly according to another embodiment of the disclosure.
Figure 30B:
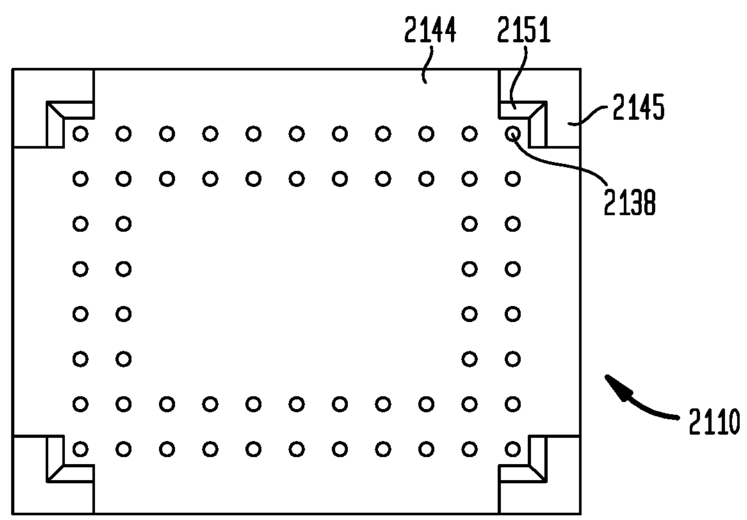
Figure 30C:
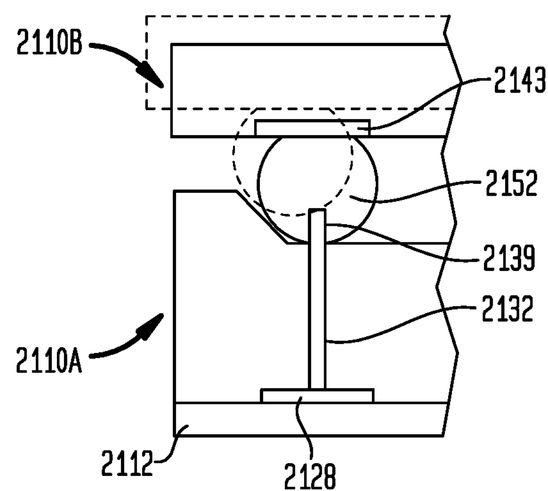

Additionally or alternatively, the assembly of microelectronic packages 2110A and 2110B, as shown in FIGS. 30A-30C, a lower package 2110A can include at least one alignment surface 2151. One example of this is shown in FIG. 30A in which alignment surfaces 2151 are included in encapsulation layer 2142 near the corners of the package 2110B. The alignment surfaces are sloped relative to the major surface and define an angle of between about 0° and up to and including 90° relative to major surface 2144 at some location therefrom, the alignment surfaces extending locations proximate the major surface 2144 and respective minor surfaces 2145 that are spaced above substrate 2112 at a greater distance than major surface 2144. The minor surfaces 2145 can be disposed adjacent the corners of package 2110A and can extend partially between intersecting sides thereof. As shown in FIG. 30B, the alignment surfaces can also form inside corners opposite the intersecting sides of the package 2110A and can be included in similar form along all corners, for example four corners, of package 2110A. As illustrated in FIG. 30C, the alignment surfaces 2151 can be positioned at an appropriate distance from unencapsulated portions of corresponding wire bonds 2132 extending from conductive elements 2128, such that when a second package 2110B having protrusions disposed at contacts 2143, e.g., electrically conductive protrusions such as conductive masses 2152 or solder balls joined thereto is stacked on top of package 2110A, the alignment surfaces 2151 will guide the solder balls into the proper position overlying the unencapsulated portions or end surfaces 2138 of the wire bonds 2132 that correspond with the alignment surfaces 2151. The solder balls can then be reflowed to join with the unencapsulated portions of the wire bonds 2132 of package 2110A.

Figure 31A:
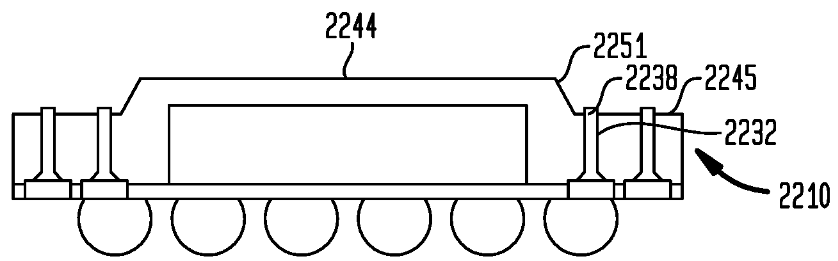
FIGS. 31 A-C show embodiments of microelectronic packages during steps of forming a microelectronic assembly according to another embodiment of the disclosure.
Figure 31B:
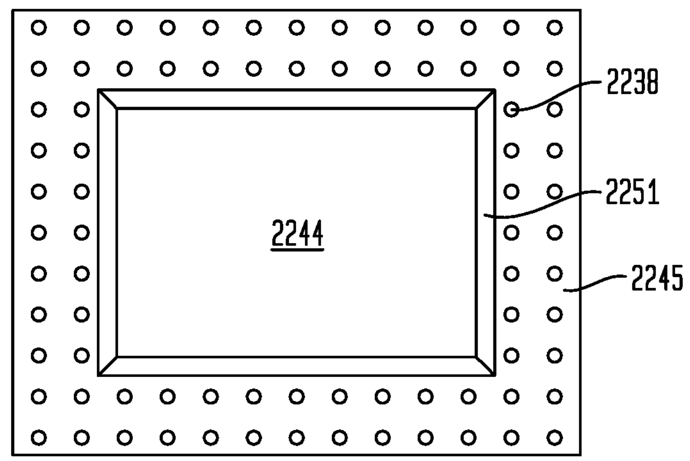
Figure 31C:
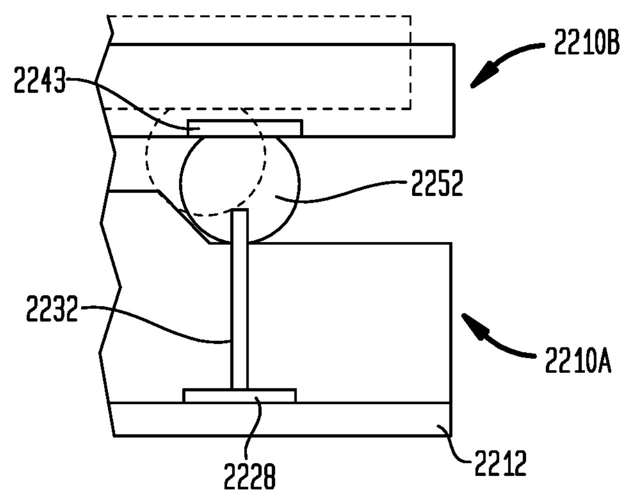

A further arrangement employing alignment surfaces 2251 is shown in FIGS. 31A-C, wherein the alignment surfaces 2251 extend between a raised inner surface 2244 to a lower outer surface 2245. In such an arrangement, inner surface 2244 can overlie microelectronic element 2222 and can be spaced above substrate 2212 accordingly. Outer surface 2245 can be spaced closer to substrate 2212 in a direction of the thickness of the substrate and can be positioned vertically between a surface of substrate 2212 of package 2210A bearing conductive elements 2228 and a surface of microelectronic package 2210B bearing conductive elements 2243. One or more unencapsulated portions or end surfaces 2238 of wire bonds 2232 can be positioned relative to the alignment surfaces 2251 to achieve alignment of solder balls 2252 or other conductive protrusion as described with respect to FIGS. 30A-C. As described above, such a stepped arrangement can be used with or without the described alignment functionality to achieve an overall lower assembly height given a certain bond mass size. Further, the incorporation of a raised inner surface 2244 can lead to increased resistance of package 2210A to warping.

Figure 12:
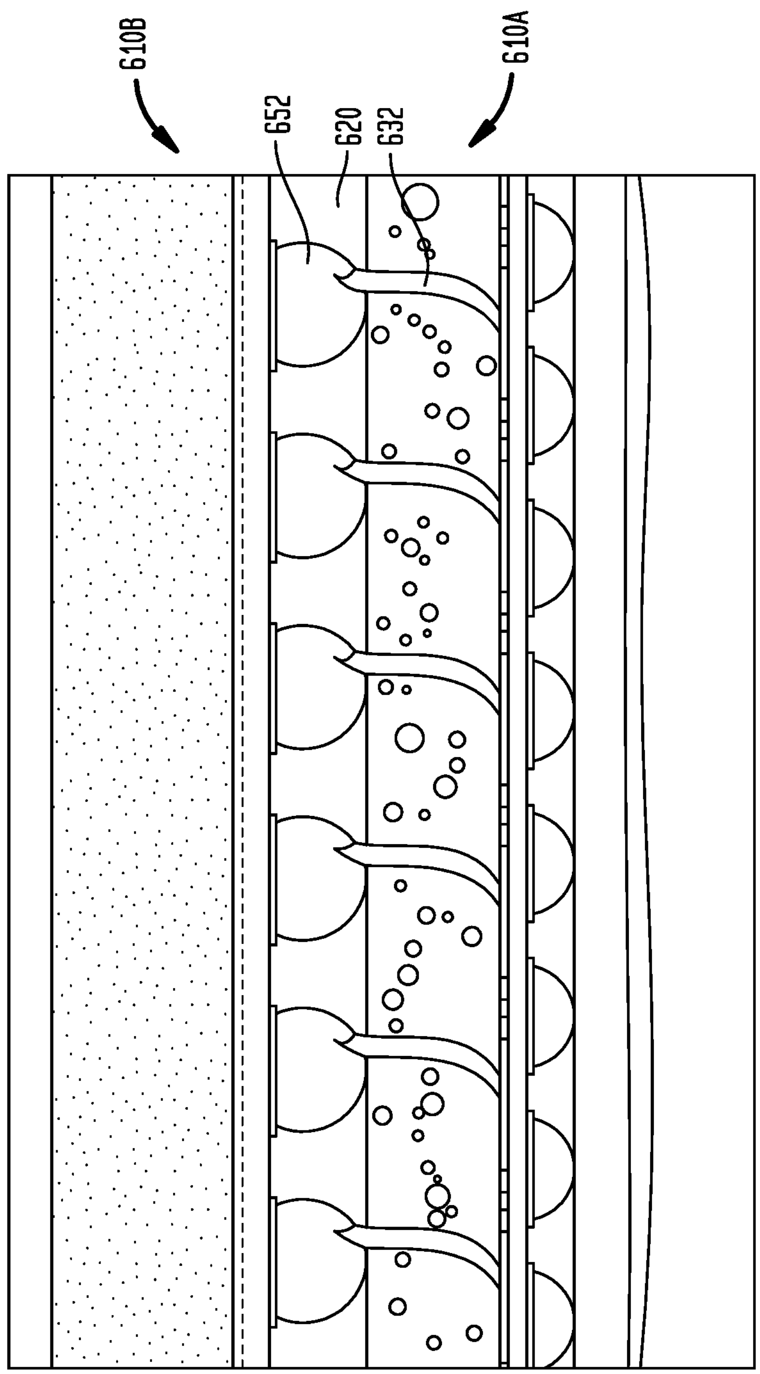
FIG. 12 is a photographic image representing an assembly having bonds between wire bonds of a first component and solder masses of a second component attached thereto.

FIG. 12 is a photographic image showing exemplary joints between the wire bonds 632 of a first package 610A and corresponding solder masses 652 of a second component such as a microelectronic package 610B. In FIG. 12, reference 620 indicates where an underfill can be disposed.

Figure 13C:
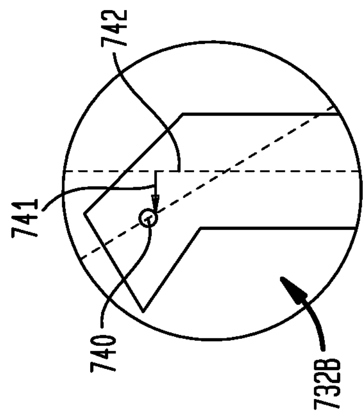
FIG. 13C is an enlarged fragmentary sectional view illustrating a wire bond via in a microelectronic package according to the embodiment shown in FIG. 13B.
Figure 13E:
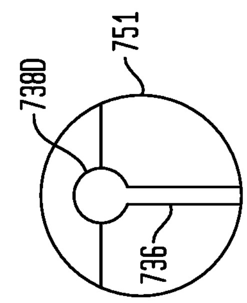
FIG. 13E is an enlarged fragmentary sectional view illustrating a wire bond via in a microelectronic package according to the embodiment shown in FIG. 13D.
Figure 13B:
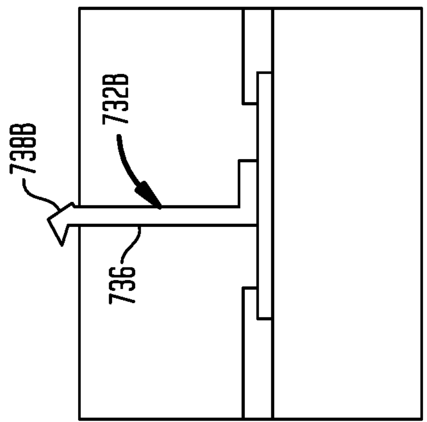
FIG. 13B is a fragmentary sectional view illustrating a wire bond via in a microelectronic package according to an embodiment of the invention.
Figure 13F:
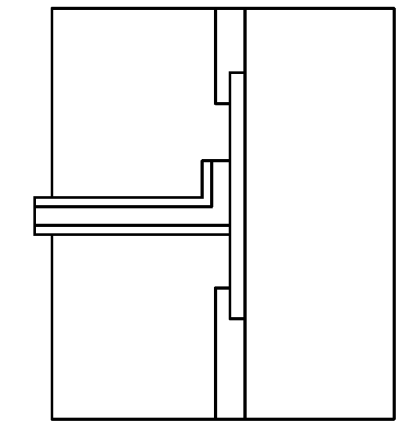
FIG. 13F is a fragmentary sectional view illustrating a wire bond via in a microelectronic package according to an embodiment of the invention.
Figure 13A:
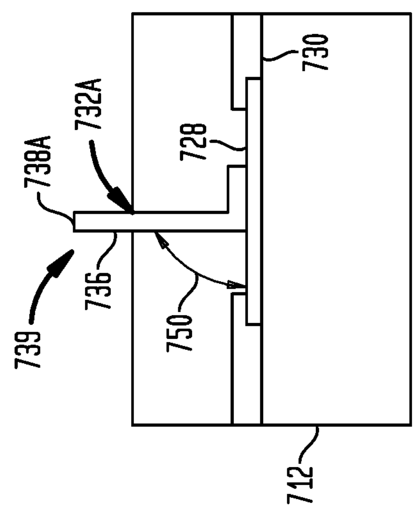
FIG. 13A is a fragmentary sectional view illustrating a wire bond via in a microelectronic package according to an embodiment of the invention.

FIGS. 13A, 13B, 13C, 13D, 13E and 13F illustrate some possible variations in the structure of the wire bonds 32 as described above relative to FIG. 1. For example, as seen in FIG. 13A, a wire bond 732A may have an upwardly extending portion 736 which terminates in an end 738A having the same radius as the radius of portion 736.

FIG. 13B illustrates a variation in which the ends are tips 738B which are tapered relative to portion 736. In addition, as seen in FIG. 13C, a tapered tip 738B of a wire bond 732B may have a centroid 740 which is offset in a radial direction 741 from an axis of a cylindrical portion of the wire bond integral therewith. Such shape may be a bonding tool mark resulting from a process of forming the wire bond as will be described further below. Alternatively, a bonding tool mark other than as shown at 738B may be present on the unencapsulated portion of the wire bond. As further seen in FIG. 13A, the unencapsulated portion 739 of a wire bond may project away from the substrate 712 at an angle 750 within 25 degrees of perpendicular to the surface 730 of the substrate on which the conductive elements 728 are disposed.

Figure 13D:
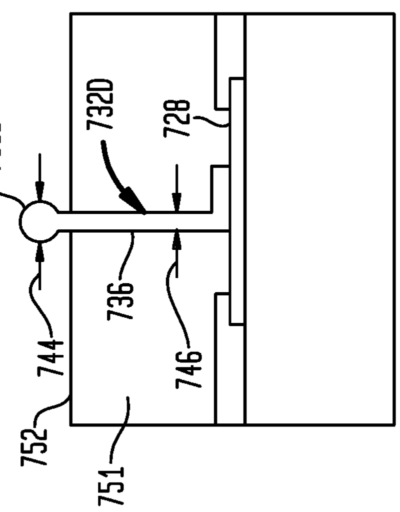
FIG. 13D is a fragmentary sectional view illustrating a wire bond via in a microelectronic package according to an embodiment of the invention.

FIG. 13D illustrates that an unencapsulated portion of a wire bond 732D can include a ball-shaped portion 738D. Some of all of the wire bonds on the package can have such structure. As seen in FIG. 13D, the ball-shaped portion 738D can be integral with a cylindrical portion 736 of the wire bond 732D, wherein the ball-shaped portion and at least a core of the cylindrical portion of the wire bond consist essentially of copper, copper alloy or gold. As will be described further below, the ball-shaped portion can be formed by melting a portion of the wire exposed at an opening of the capillary of the bonding tool during a pre-shaping process before stitch-bonding the wire bond to a conductive element 728 of the substrate. As seen in FIG. 13D, the diameter 744 of the ball-shaped portion 738D may be greater than the diameter 746 of the cylindrical wire bond portion 736 that is integral therewith. In a particular embodiment such as shown in FIG. 13D, the cylindrical portion of a wire bond 732D that is integral with the ball-shaped portion 738D can project beyond a surface 752 of the encapsulant layer 751 of the package. Alternatively, as seen in FIG. 13E, the cylindrical portion of a wire bond 732D may be fully covered by the encapsulant layer. In such case, as seen in FIG. 13E, the ball-shaped portion 738D of the wire bond 732D may in some cases be partly covered by the encapsulation layer 751.

FIG. 13F further illustrates a wire bond having a core of a primary metal and a metallic finish thereon which includes a second metal overlying the primary metal, such as the palladium clad copper wire or palladium clad gold wire as described above. In another example, an oxidation protection layer of a non-metallic material such as a commercially available "organic solderability preservative" (OSP) can be formed on the unencapsulated portion of a wire bond to avoid oxidation thereof until the unencapsulated portion of the wire bond is joined to a corresponding contact of another component.

Figure 14:
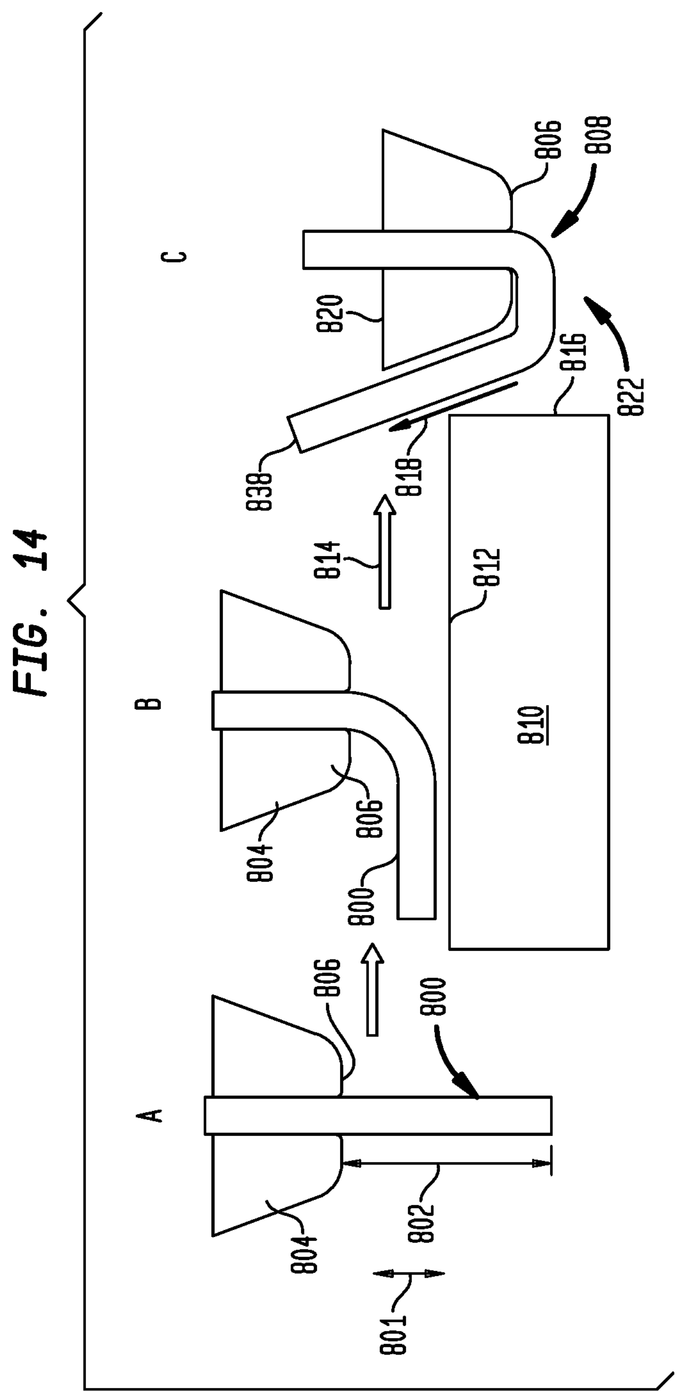
FIG. 14 illustrates stages in a method of forming a metal wire segment prior to bonding the wire segment to a conductive element according to an embodiment of the invention.

FIG. 14 illustrates a method by which wire bonds 32 (FIG. 1) as described herein can be shaped and then stitch-bonded to the conductive elements 28 on a substrate. As seen therein at stage A, a segment 800, i.e., an integral portion having a predetermined length 802, of a metal wire such as a gold or copper wire or composite wire as described above described above relative to FIG. 1 is fed out of a capillary 804 of a bonding tool. In order to ensure that a predetermined length of the metal wire is fed out from the capillary, the initial wire length can be zeroed or otherwise set to a known length by the bonding tool stitch-bonding the wire then extending from the capillary before beginning to feed the wire out for processing. At that time, the segment may extend in a straight direction 801 perpendicular to a face 806 of the capillary. As seen at stage B, the face 806 of the capillary 804 then is moved in at least a first direction 814 along, e.g., parallel to a first surface 812 of a forming unit 810 to bend the metal wire segment 800 away from the perpendicular direction. The forming unit 810 may be a specially designed tool having surfaces suitable to assist in the forming, i.e., shaping, of the metal wire segment prior to the metal wire segment being bonded to the conductive element of the substrate.

As seen at stage B during the pre-forming process, a portion of the segment 800 may then extend in a direction parallel to the surface 812. Thereafter, as seen at stage C, the capillary is moved over a second surface 816 which then causes at least a portion of the segment 800 to project upwardly in a direction 818 along an exterior wall 820 of the capillary. After pre-forming the metal wire segment 800 in this manner, the capillary of the bonding tool is now moved away from the forming unit 810 and moved towards the conductive element 28 (FIG. 1) of the substrate where it then stitch bonds a portion 822 of the metal wire segment adjacent to the capillary opening 808 and the capillary face 806 to the conductive element. As a result, an end surface 838 of the metal wire segment 800 remote from the capillary opening 808 becomes an end surface 38 (FIG. 1) of the wire bond remote from the conductive element 28.

Figure 15:
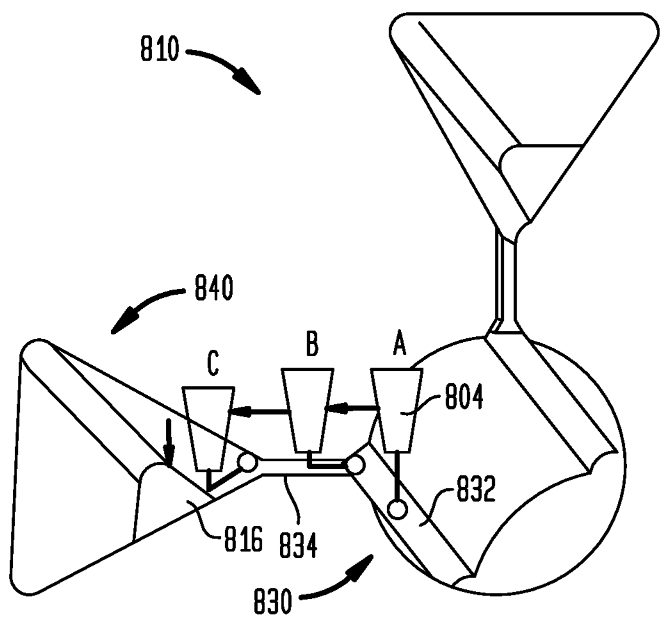
FIG. 15 further illustrates a method as depicted in FIG. 14 and a forming unit suitable for use in such method.

FIG. 15 further illustrates an example of movement of the capillary over surfaces of a forming unit 810 in a method according to an embodiment of the invention. As seen therein, the forming unit 810 may have a first depression 830 in which the capillary 804 is disposed when the segment 800 is fed out of the opening 808 of the capillary at stage A of the forming process. The depression may include a channel or groove 832 which can help guide the segment 800 onto a surface 812 at stage B. The forming unit may further include a channel 834 or groove for guiding the segment 800 in stage B of the process. As further shown in FIG. 15, the forming unit may include a further depression 840 having an interior surface 816 against which the capillary moves in stage C of the process to cause the metal wire segment to be bent in direction 818 against the exterior wall 820 of the capillary. The depression 840 in one example may have a triangular shape as seen in FIG. 15.

Figure 35:
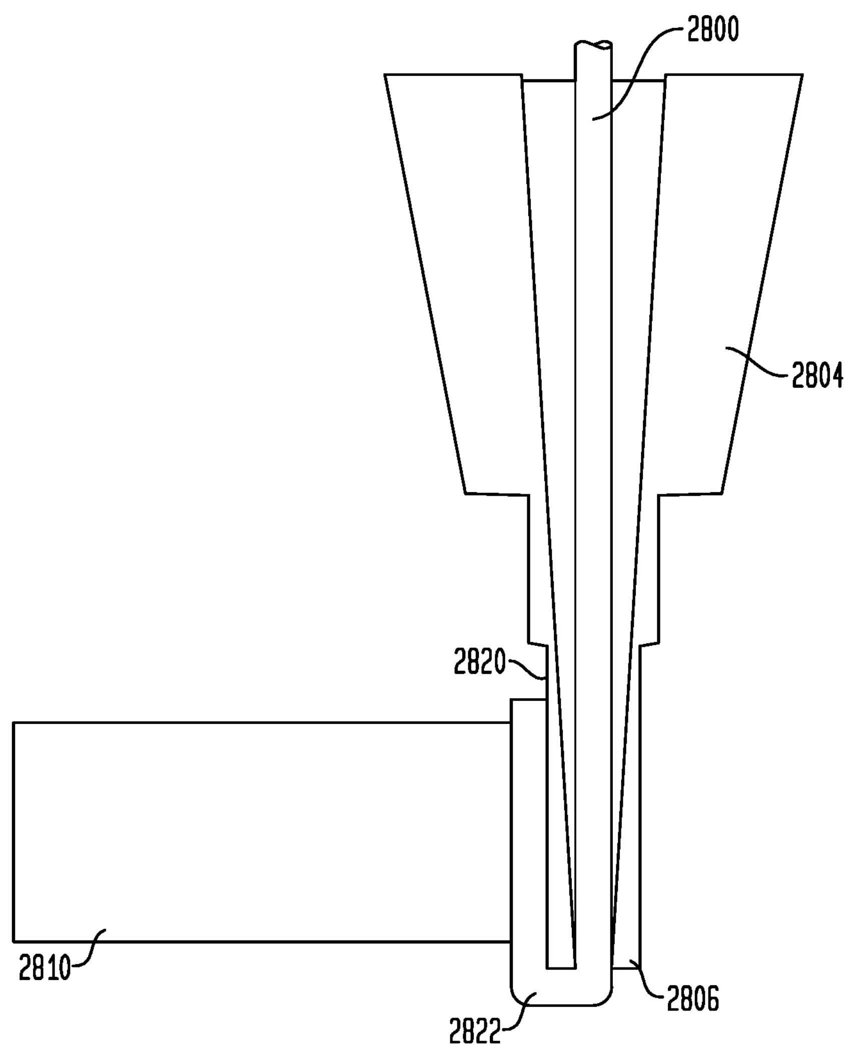
FIG. 35 shows a portion of a machine that can be used in forming various wire bond vias according in a method according to another embodiment of the present disclosure.

In an embodiment, a variation of the capillary shown in FIG. 14 can be used that incorporates a vertical or near-vertical side wall 2820. As shown in FIG. 35, the side wall 2820 of capillary 2804 can be substantially vertical or, in other words, parallel to the wire segment 2800 or perpendicular to the face 2806 of the capillary 2804. This can allow for formation of a wire bond (32 in FIG. 1) that is closer to vertical, i.e., closer to an angle of 90° away from the surface of the first surface of the substrate, than achieved by a side wall at an exterior of the capillary that defines an angle having a measure substantially less than 90°, such as the capillary shown in FIG. 14. For example, using a forming tool 2810, a wire bond can be achieved that is disposed at an angle from the first portion which extends between 25° and 90°, or between about 45° and 90° or between about 80° and 90° with respect to the first wire portion 2822.

Figure 36:
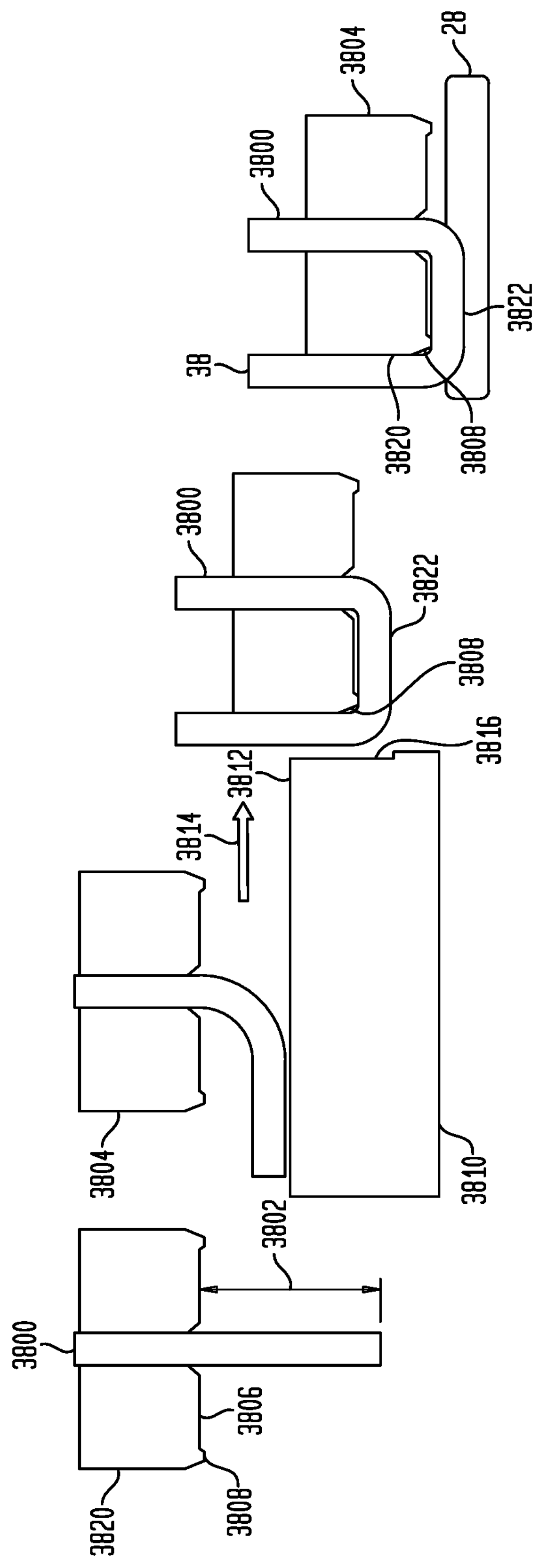
FIG. 36 shows a portion of a machine that can be used in forming various wire bond vias according in a method according to another embodiment of the present disclosure.

In another variation shown in FIG. 36, a capillary 3804 can include a surface 3808 that projects beyond the face 3806 thereof. This surface 3808 can be included, for example over the edge of the side wall 3820. In the method for forming a wire bond (32 in FIG. 1, for example), the capillary 3804 can be pressed against the first portion 3822 of the wire segment 3800 during forming of wire segment, e.g., when the capillary moves in a direction along a forming surface 3816 which extends in a direction 3814 away from surface 3812. In this example, surface 3808 presses into the first portion 3822 at a location near the bend from which the remaining wire segment 3800 extends. This can cause deformation of the wire segment 3800 such that it may press against the wall 3820 of the capillary 3804 and move to a somewhat more vertical position once the capillary 3804 is removed. In other instances, the deformation from the surface 3808 can be such that a position of the wire segment 3800 can be substantially retained when the capillary 3804 is removed.

Figure 16:
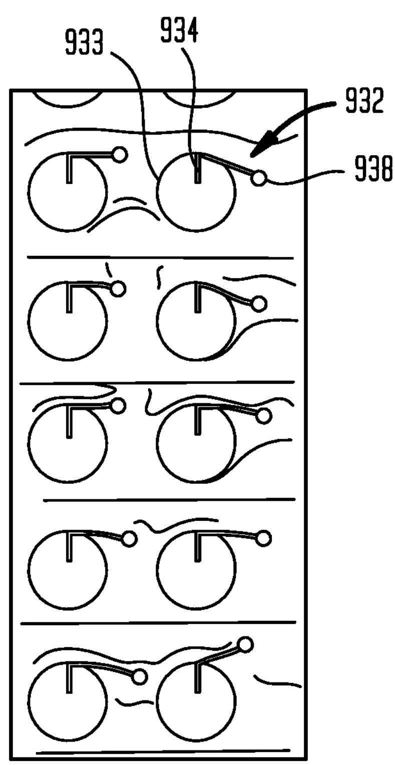
FIG. 16 is a top elevation view illustrating wire bonds formed according to an embodiment of the invention.

FIG. 16 is a photographic image showing that wire bonds 932 formed according to one or more of the methods described herein can have ends 938 which are offset from their respective bases 934. In one example, an end 938 of a wire bond can be displaced from its respective base such that the end 938 is displaced in a direction parallel to the surface of the substrate beyond a periphery of the conductive element to which it is connected. In another example, an end 938 of a wire bond can be displaced from its respective base 934 such that the end 938 is displaced in a direction parallel to the surface of the substrate beyond a periphery 933 of the conductive element to which it is connected.

Figure 17:
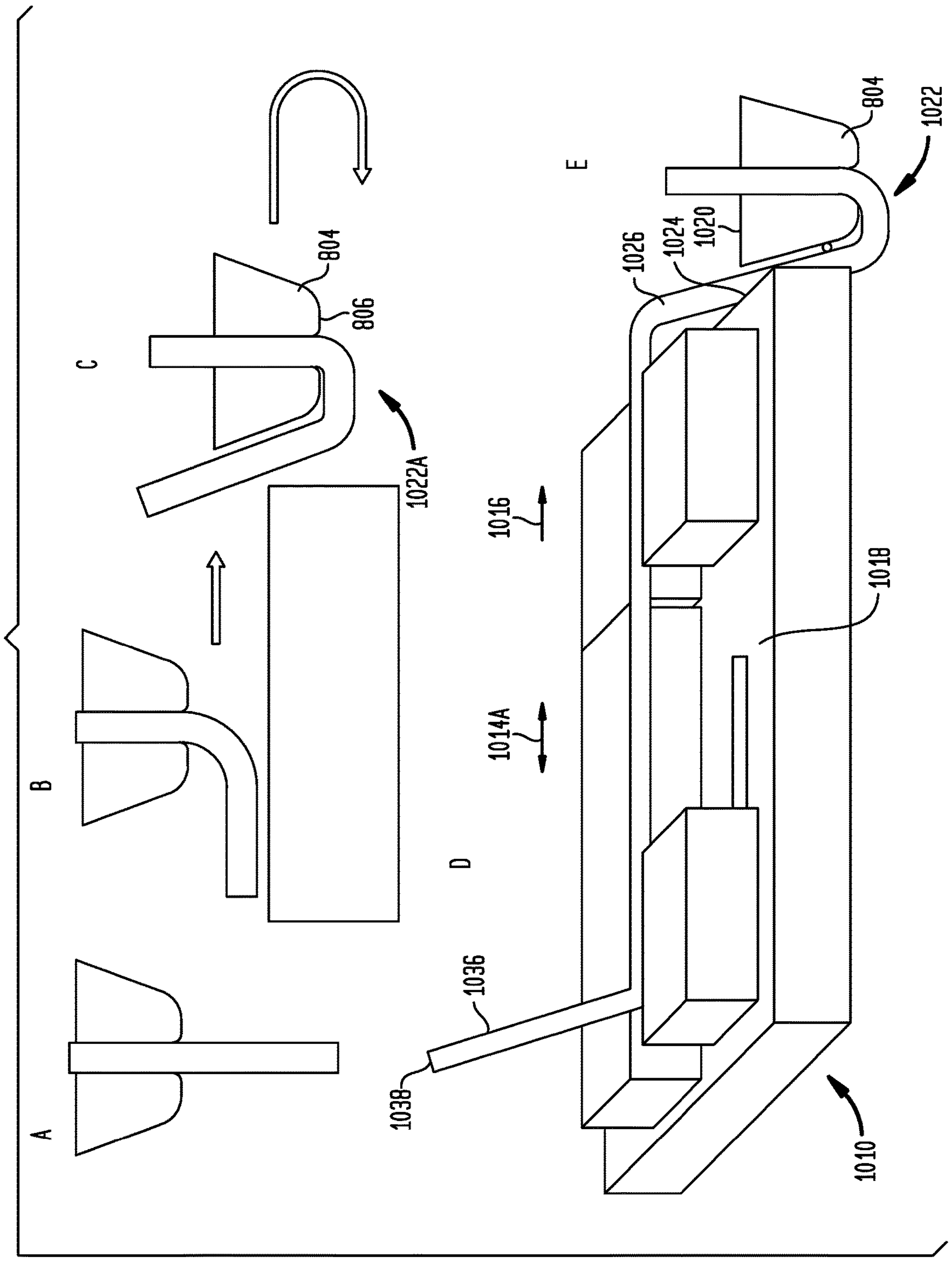
FIG. 17 illustrates stages in a method of forming a metal wire segment prior to bonding the wire segment to a conductive element according to an embodiment of the invention.

FIG. 17 illustrates a variation of the above described pre-forming process which can be used to form wire bonds 332Cii (FIG. 5) having a bend and which have ends 1038 displaced in a lateral direction 1014A from the portions 1022 which will be stitch bonded to the conductive elements as bases of the wire bonds.

As seen in FIG. 17, the first three stages A, B, and C of the process can be the same as described above with reference to FIG. 14. Then, referring to stages C and D therein, a portion 1022A of the wire bond adjacent the face 806 of the capillary 804 is clamped by a tool which can be integrated with the forming unit. The clamping may be performed actively or passively as a result of the motion of the capillary over the forming unit. In one example, the clamping can be performed by pressing a plate having a non-slip surface thereon onto the metal wire segment 800 to preclude movement of the metal wire segment.

While the metal wire segment 800 is clamped in this manner, at stage D shown in FIG. 17, the capillary tool moves in a direction 1016 along a third surface 1018 of the forming unit 1010 and feeds out a length of wire equivalent to the distance moved along surface 1018. Thereafter, at stage E, the capillary is moved downwardly along a third surface 1024 of the forming unit to cause a portion of the wire to be bent upwardly along an exterior surface 1020 of the capillary 804. In such way, an upwardly projecting portion 1026 of the wire can be connected to another upwardly projecting portion 1036 by a third portion of the metal wire.

After formation of the wire segment and bonding thereof to a conductive element to form a wire bond, particularly of the ball bond type discussed above, the wire bond (32 in FIG. 1, for example) is then separated from a remaining portion of the wire within the capillary (such as 804 in FIG. 14). This can be done at any location remote from the base 34 of the wire bond 32 and is preferably done at a location remote from the base 34 by a distance at least sufficient to define the desired height of the wire bond 32. Such separation can be carried out by a mechanism disposed within the capillary 804 or disposed outside of the capillary 804, between the face 806 and the base 34 of the wire bond 32. In one method, the wire segment 800 can be separated by effectively burning through the wire segment 800 at the desired separation point, which can be done by application of a spark or flame thereto. To achieve greater accuracy in wire bond height, different forms of cutting the wire segment 800 can be implemented. As described herein, cutting can be used to describe a partial cut that can weaken the wire at a desired location or cutting completely through the wire for total separation of the wire bond 32 from the remaining wire segment 800.

Figure 32A:
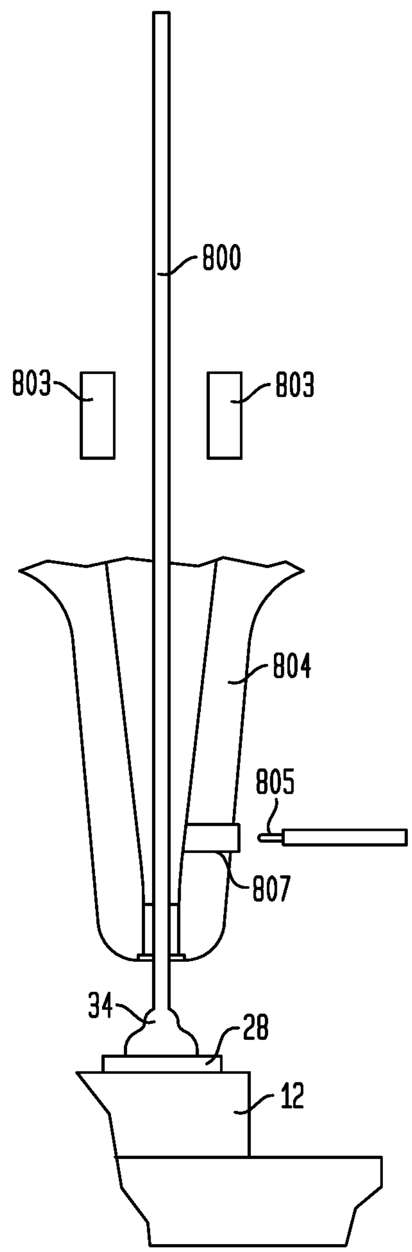
FIGS. 32A and 32B show a portion of a machine that can be used in forming various wire bond vias in various stages of a method according to another embodiment of the present disclosure.
Figure 32B:
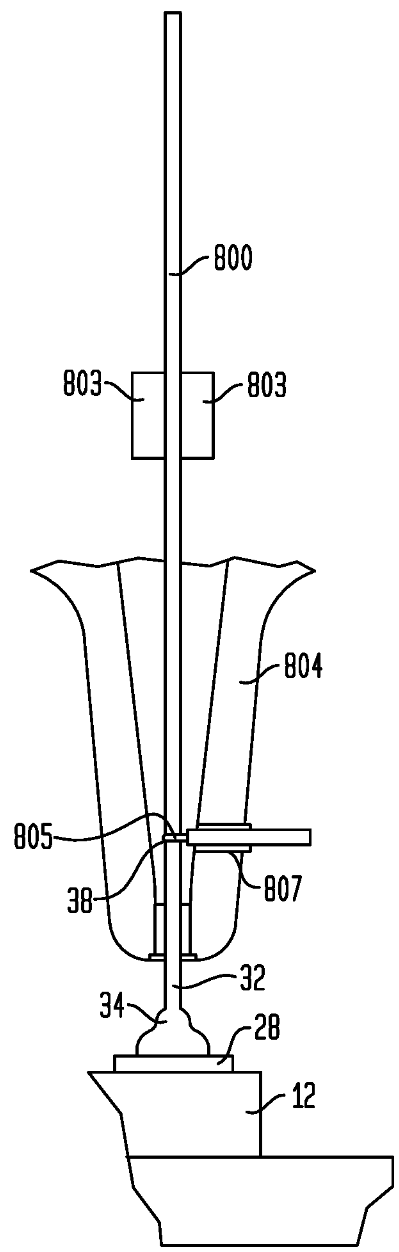

In one example shown in FIG. 32, a cutting blade 805 can be integrated into the bond head assembly, such as within capillary 804. As shown, an opening 807 can be included in the side wall 820 of the capillary 804 through which cutting blade 805 can extend. The cutting blade 805 can be moveable in and out of the interior of the capillary 804 so that it can alternately allow the wire segment 800 to freely pass therethrough or engage the wire segment 800. Accordingly, the wire segment 800 can be drawn out and the wire bond 32 formed and bonded to a conductive element 28 with the cutting blade 805 in a position outside of the capillary interior. After bond formation, the wire segment 800 can be clamped using a clamp 803 integrated in the bond head assembly to secure the position of the wire. The cutting blade 805 can then be moved into the wire segment to either fully cut the wire or to partially cut or weaken the wire. A full cut can form end surface 38 of the wire bond 32 at which point the capillary 804 can be moved away from the wire bond 32 to, for example, form another wire bond. Similarly, if the wire segment 800 is weakened by the cutting blade 805, movement of the bond head unit with the wire still held by the wire clamp 803 can cause separation by breaking the wire segment 800 at the area weakened by the partial cut.

The movement of the cutting blade 805 can be actuated by pneumatics or by a servo motor using an offset cam. In other examples the cutting blade 805 movement can be actuated by a spring or a diaphragm. The triggering signal for the cutting blade 805 actuation can be based on a time delay that counts down from formation of the ball bond or can be actuated by movement of the capillary 804 to a predetermined height above the wire bond base 34. Such a signal can be linked to other software that operates the bonding machine so that the cutting blade 805 position can be reset prior to any subsequent bond formation. The cutting mechanism can also include a second blade (not shown) at a location juxtaposed with blade 805 with the wire therebetween, so as to cut the wire by movement of one or more of the first and second blades relative to the other of the first and second blades, such as in one example, from opposite sides of the wire.

Figure 33:
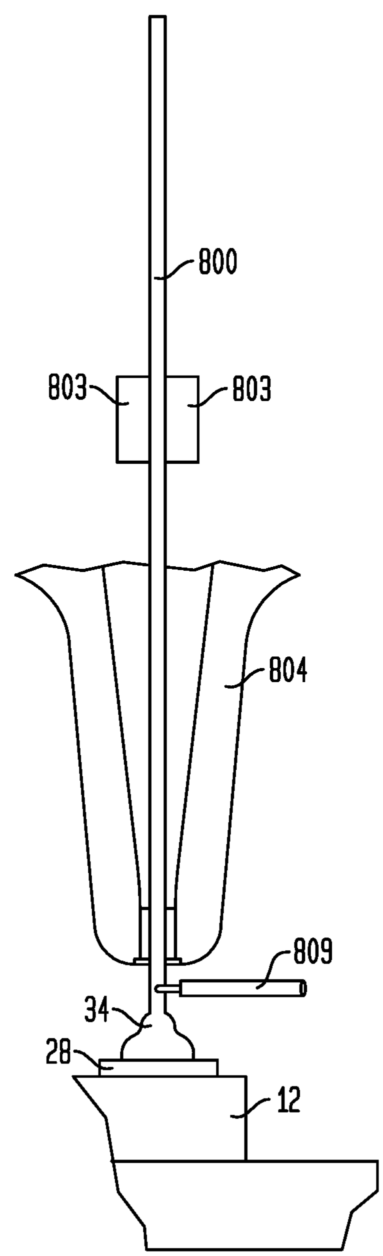
FIG. 33 shows a portion of a machine that can be used in forming various wire bond vias according in a method according to another embodiment of the present disclosure.

In another example, a laser head 809 can be assembled with the bond head unit and positioned to cut the wire. As shown in FIG. 33, a laser head 809 can be positioned outside of capillary 804 such as by mounting thereto or to another point on the bond head unit that includes capillary 804. The laser can be actuated at a desired time, such as those discussed above with respect to the cutting blade 805 in FIG.

32, to cut the wire segment 800, forming end surface 38 of the wire bond 32 at a desired height above the base 34. In other implementations, the laser head 809 can be positioned to direct the cutting beam through or into the capillary 804 itself and can be internal to the bond head unit. In an example, a carbon dioxide laser can be used or, as an alternative, a Nd:YAG or a Cu vapor laser could be used.

Figure 34A:
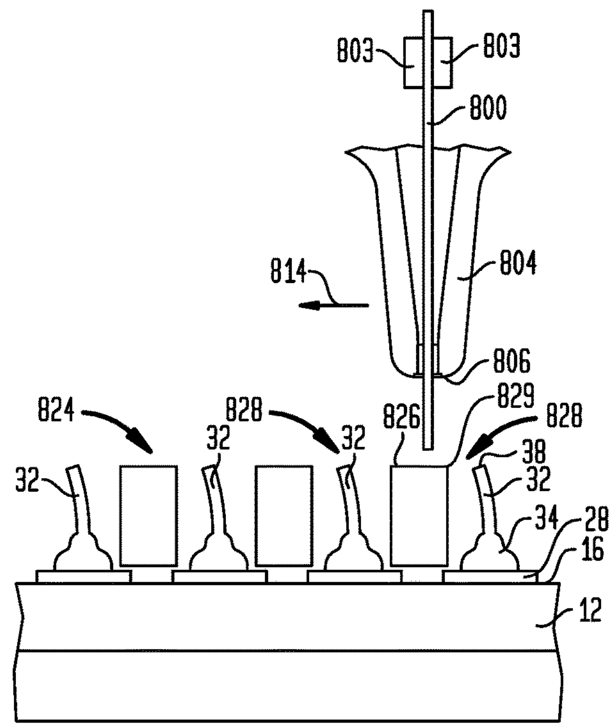
FIGS. 34A-C show various forms of an instrument that can be used in a method for making wire bonds according to an embodiment of the present disclosure.
Figure 34B:
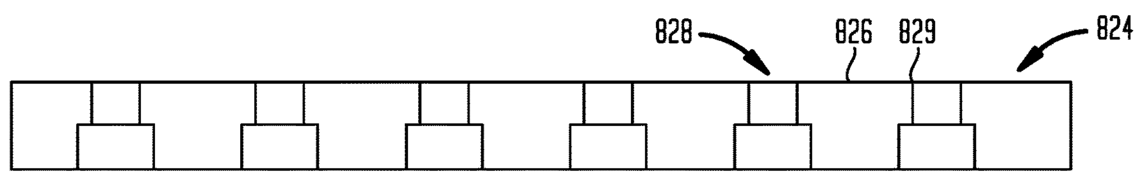
Figure 34C:
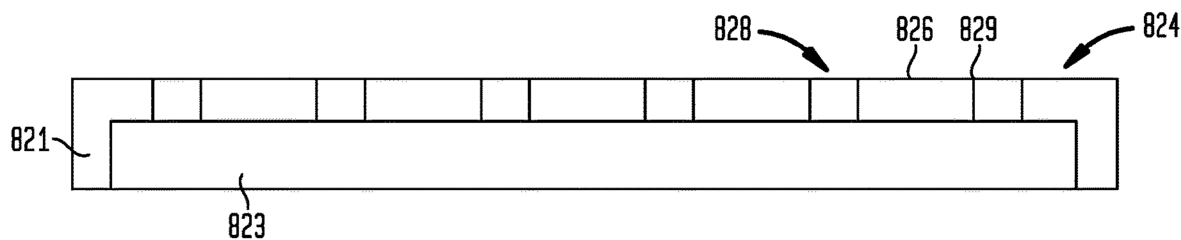

In another embodiment a stencil unit 824 as shown in FIGS. 34A-C can be used to separate the wire bonds 32 from the remaining wire segment 800. As shown in FIG. 34A, the stencil 824 can be a structure having a body that defines an upper surface 826 at or near the desired height of the wire bonds 32. The stencil 824 can be configured to contact the conductive elements 28 or any portions of the substrate 12 or package structure connected thereto between the conductive elements 28. The stencil includes a plurality of holes 828 that can correspond to the desired locations for the wire bonds 32, such as over conductive elements 28. The holes 828 can be sized to accept the capillary 804 of the bond head unit therein so that the capillary can extend into the hole to a position relative to the conductive element 28 to bond the wire segment 800 to the conductive element, 28 to form the base 34, such as by ball bonding or the like. In one example, the stencil can have holes through which individual ones of the conductive elements are exposed. In another example, a plurality of the conductive elements can be exposed by a single hole of the stencil. For example, a hole can be a channel shaped opening or recess in the stencil through which a row or column of the conductive elements are exposed at a upper surface 826 of the stencil.

The capillary 804 can then be moved vertically out of the hole 828 while drawing out the wire segment to a desired length. Once cleared from the hole 828, the wire segment can be clamped within the bond head unit, such as by clamp 803, and the capillary 804 can be moved in a lateral direction (such as parallel to the surface 826 of stencil 824) to move the wire segment 800 into contact with an edge 829 of the stencil 824 defined by the intersection of the surface of the hole 828 and the upper surface 826 of the stencil 824. Such movement can cause separation of the wire bond 32 from a remaining portion of the wire segment 800 that is still held within the capillary 804. This process can be repeated to form the desired number of wire bonds 32 in the desired locations. In an implementation, the capillary can be moved vertically prior to wire separation such that the remaining wire segment projects beyond the face 806 of the capillary 804 by a length 802 sufficient to form a subsequent ball bond. FIG. 34B shows a variation of stencil 824 in which the holes 828 can be tapered such that they have a diameter that increases from a first diameter at surface 826 to a greater diameter away from surface 826. In another variation, as shown in FIG. 34C, the stencil can be formed having an outer frame 821 having a thickness sufficient to space apart surface 826 at the desired distance from substrate 12. Frame 821 can at least partially surround a cavity 823 configured to be positioned adjacent substrate 12 with a thickness of the stencil 824 extending between the surface 826 and the cavity 823 such that the portion of stencil 824 that includes the holes 828 is spaced apart from the substrate 12 when positioned thereon.

Figure 20:
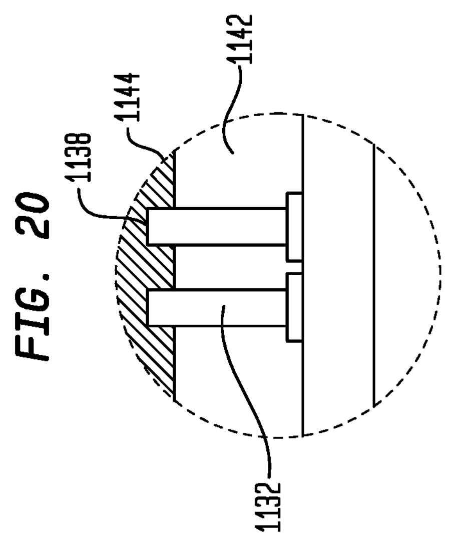
FIG. 20 is an enlarged sectional view further illustrating the stage corresponding to FIG. 19.
Figure 18:
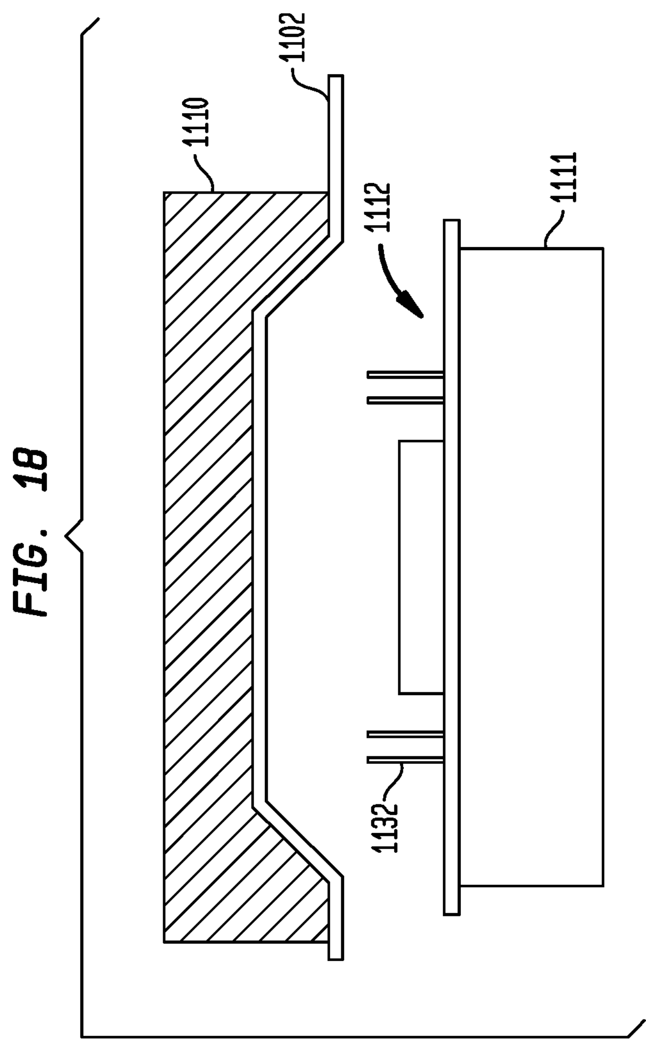
FIGS. 18 and 19 are sectional views illustrating one stage and another stage subsequent thereto in a method of forming an encapsulation layer of a microelectronic package according to an embodiment of the invention.
Figure 19:
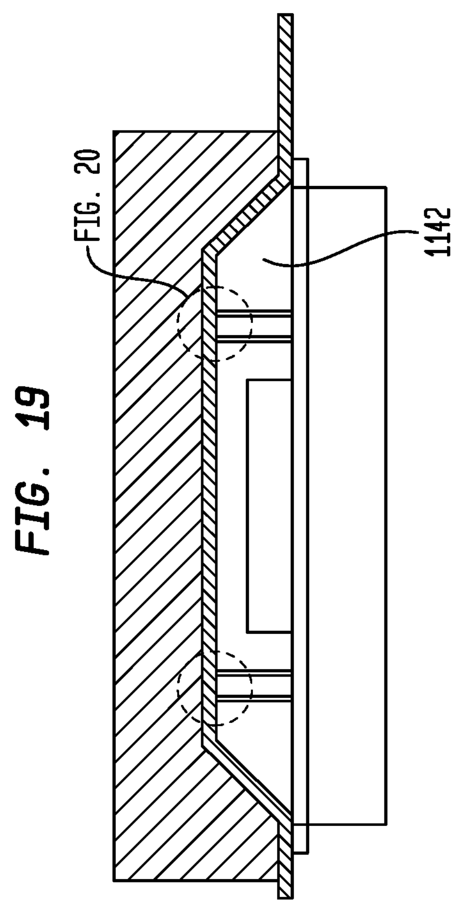

FIGS. 18, 19 and 20 illustrate one technique that can be used when forming the encapsulation layer by molding in order that unencapsulated portions 39 (FIG. 1) of the wire bonds project beyond a surface 44 of the encapsulation layer 42. Thus, as seen in FIG. 18, a film-assisted molding technique can be used by which a temporary film 1102 is placed between a plate 1110 of a mold and a cavity 1112 in which a subassembly including the substrate, wire bonds 1132 joined thereto, and a component such as a microelectronic element may be joined. FIG. 18 further shows a second plate 1111 of the mold which can be disposed opposite the first plate 1110.

Then, as seen in FIGS. 19-20, when the mold plates 1110, 1111 are brought together, the ends 1138 of wire bonds 1132 can project into the temporary film 1102. When a mold compound is flowed in the cavity 1112 to form encapsulation layer 1142, the mold compound does not contact the ends 1138 of the wire bonds because they are covered by the temporary film 1102. After this step, the mold plates 1110, 1111 are removed from the encapsulation layer 1142, the temporary film 1102 can now be removed from the surface 1144, which then leaves the ends 1138 of the wire bonds 1132 projecting beyond the surface 1144 of the encapsulation layer.

The film-assisted molding technique may be well adapted for mass production. For example, in one example of the process, a portion of a continuous sheet of the temporary film can be applied to the mold plate. Then the encapsulation layer can be formed in a cavity 1112 that is at least partially defined by the mold plate. Then, a current portion of the temporary film 1102 on the mold plate 1110 can be replaced by automated means with another portion of the continuous sheet of the temporary film.

In a variation of the film-assisted molding technique, instead of using a removable film as described above, a water-soluble film can be placed on an inner surface of the mold plate 1110 prior to forming the encapsulation layer. When the mold plates are removed, the water soluble film can be removed by washing it away so as to leave the ends of the wire bonds projecting beyond the surface 1144 of the encapsulation layer as described above.

Figure 37A:
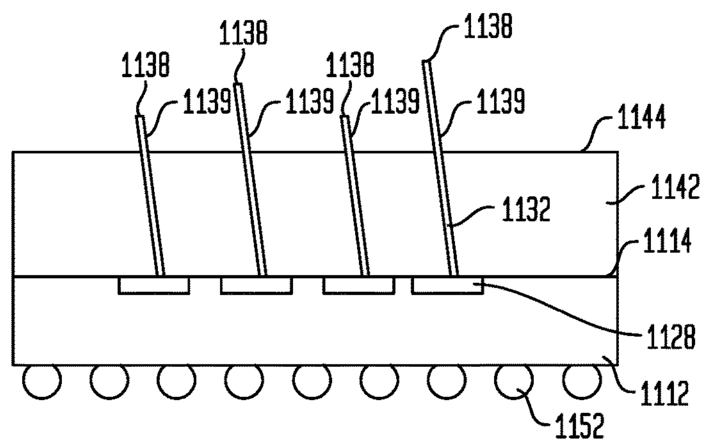
FIGS. 37 A-D show sectional views illustrating stages of fabricating a microelectronic package according to an embodiment of the present disclosure.
Figure 37B:
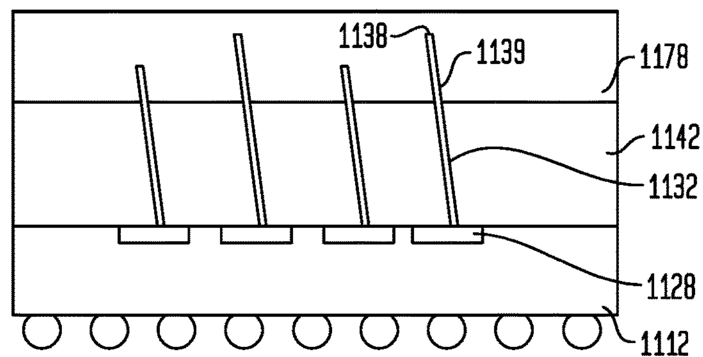
Figure 37C:
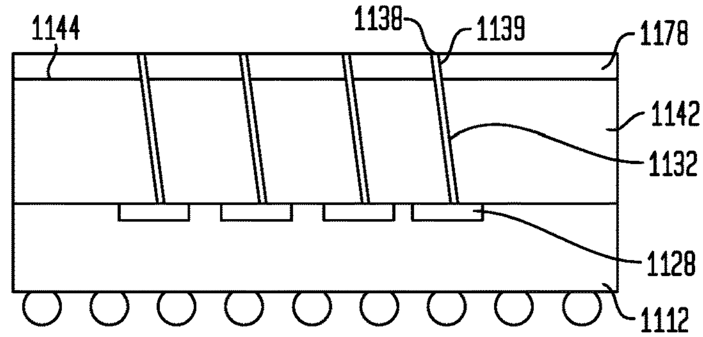
Figure 37D:
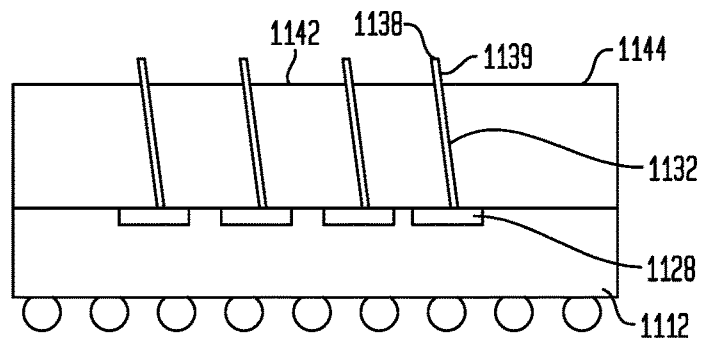

In an example of the method of FIGS. 18 and 19, the heights of the wire bonds 1132 above the surface 1144 of encapsulation layer 1142 can vary among the wire bonds 1132, as shown in FIG. 37A. A method for further processing the package such that the wire bonds 1132 project above surface 1144 by substantially uniform heights is shown in FIGS. 37B-D and utilizes a sacrificial material layer 1178 that can be formed to cover the unencapsulated portions of the wire bonds 1132 by application thereof over surface 1144. The sacrificial layer 1178 can then be planarized to reduce the height thereof to the desired height for wire bonds 1132, which can be done by lapping, grinding, or polishing or the like. As also illustrated in the Figures, the planarization of the sacrificial layer 1178 can begin by reducing the height thereof to a point where the wire bonds 1132 become exposed at the surface of the sacrificial layer 1178. The planarization process can then also planarize the wire bonds 1132 simultaneously with the sacrificial layer 1178 such that, as the height of the sacrificial layer 1178 is continued to be reduced, the heights of the wire bonds 1132 are also reduced. The planarization can be stopped once the desired height for the wire bonds 1132 is reached. It is noted that in such a process the wire bonds 1132 can be initially formed such that their heights, while being non-uniform, are all greater than the targeted uniform height. After planarization reduces the wire bonds 1132 to the desired height, the sacrificial layer 1178 can be removed such as by etching or the like. The sacrificial layer 1178 can be formed from a material that can allow for removal by etching using an etchant that will not significantly affect the encapsulant material. In one example, the sacrificial layer 1178 can be made from a water soluble plastic material.

Figure 21:
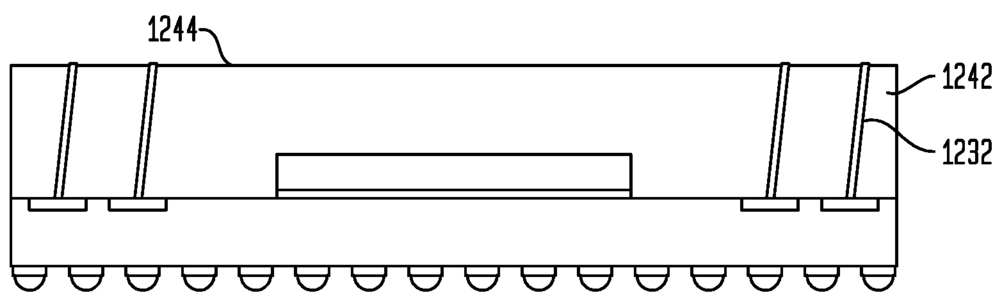
FIG. 21 is a sectional view illustrating a stage of fabricating an encapsulation layer of a microelectronic package according to an embodiment of the invention.
Figure 22:
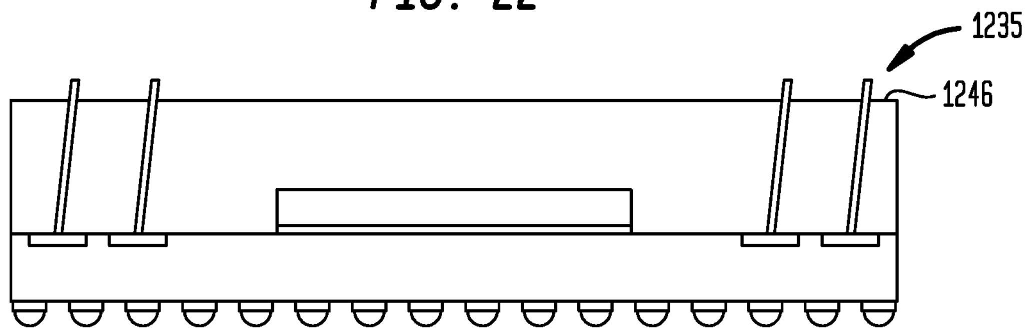
FIG. 22 is a sectional view illustrating a stage of fabricating an encapsulation layer of a microelectronic package subsequent to the stage shown in FIG. 21.

FIGS. 21 and 22 illustrate another method by which unencapsulated portions of the wire bonds can be formed which project beyond a surface of the encapsulation layer. Thus, in the example seen in FIG. 21, initially wire bonds 1232 may be flush with or may not even be exposed at a surface 1244 of the encapsulation layer 1242. Then, as shown in FIG. 22, a portion of the encapsulation layer, e.g., a molded encapsulation layer, can be removed to cause the ends 1235 of the wire bonds to project beyond the modified encapsulation layer surface 1246. Thus, in one example, laser ablation can be used to recess the encapsulation layer uniformly to form a planar recessed surface 1246. Alternatively, laser ablation can be performed selectively in areas of the encapsulation layer adjoining individual wire bonds.

Among other techniques that can be used to remove at least portions of the encapsulation layer selectively to the wire bonds include "wet blasting" techniques. In wet blasting, a stream of abrasive particles carried by a liquid medium is directed towards a target to remove material from the surface of the target. The stream of particles may sometimes be combined with a chemical etchant which may facilitate or accelerate the removal of material selectively to other structure such as the wire bonds which are to remain after wet blasting.

Figure 38A:
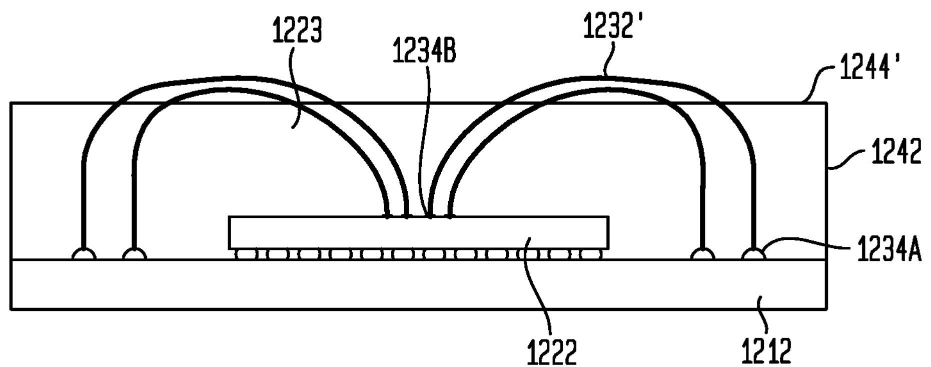
FIGS. 38A and 38B show sectional views illustrating stages of fabricating a microelectronic package according to another embodiment of the present disclosure.
Figure 38B:
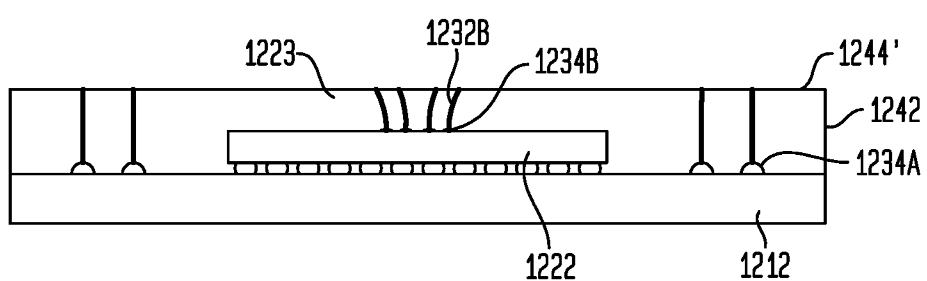

In the example shown in FIGS. 38A and 38B, in a variation of the method shown in FIGS. 21 and 22, wire bond loops 1232' can be formed that have bases 1234A on conductive elements 1228 at one end and are attached to a surface of the microelectronic element 1222 at the other end 1234B. For attachment of the wire bond loops 1232' to the microelectronic element 1222, the surface of the microelectronic element can be metalized such as by sputtering, chemical vapor deposition, plating or the like. The bases 1234A can be ball bonded, as shown, or edge bonded, as can the ends 1234B joined to the microelectronic element 1222. As further shown in FIG. 38A, the dielectric encapsulation layer 1242 can be formed over substrate 1212 to cover the wire bond loops 1232'. The encapsulation layer 1242 can then be planarized, such as by grinding of the initial surface 1244', lapping, polishing, or the like, to reduce the height thereof and to separate the wire bond loops 1232' into connection wire bonds 1232A that are available for joining to at least the end surfaces 1238 thereof for electrical connection to the conductive elements 1228 and thermal dissipation bonds 1232B that are joined to the microelectronic element 1222. The thermal dissipation bonds can be such that they are not electrically connected to any of the circuitry of the microelectronic element 1222 but are positioned to thermally conduct heat away from the microelectronic element 1222 to the surface 1244 of the encapsulation layer 1242. Additional processing methods can be applied to the resulting package 1210', as described elsewhere herein.

Figure 39A:
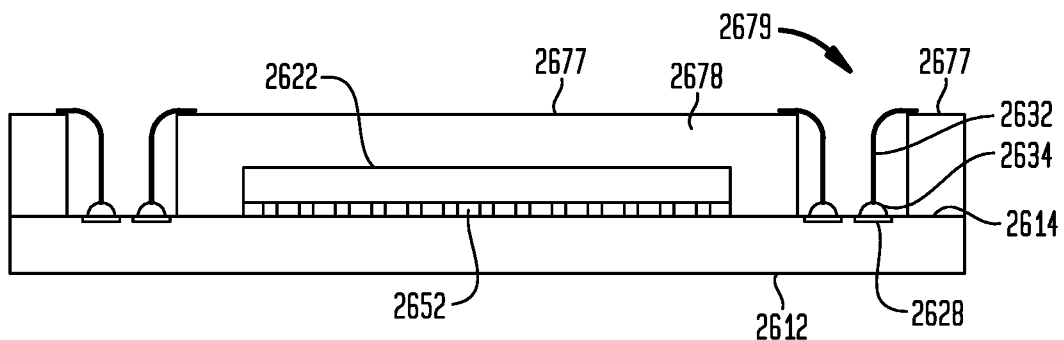
FIGS. 39A-C show sectional views illustrating stages of fabricating a microelectronic package according to another embodiment of the present disclosure.
Figure 39B:
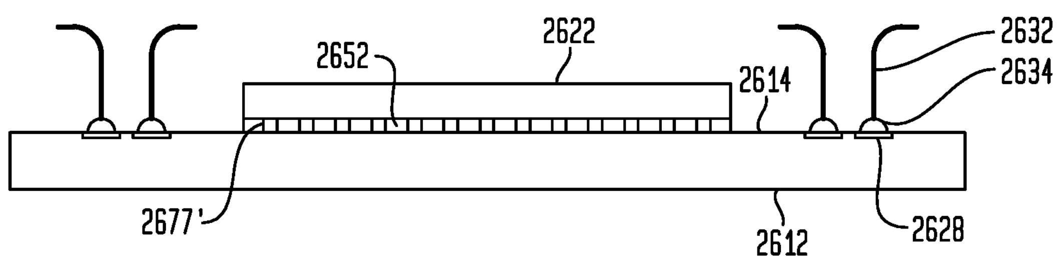
Figure 39C:
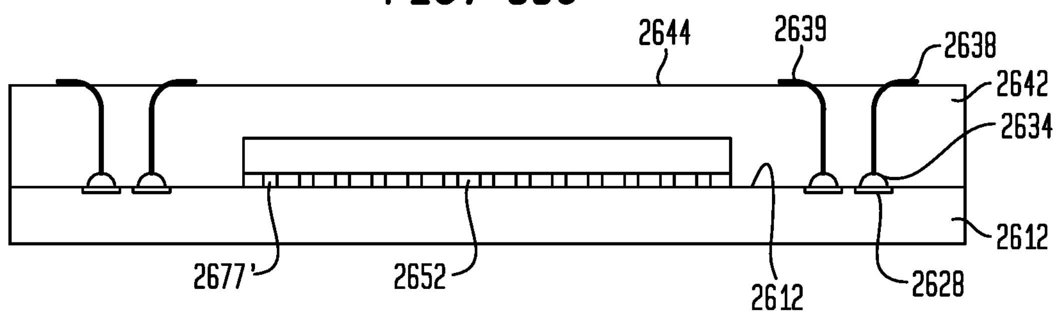

Another method for forming wire bonds 2632 to a predetermined height is shown in FIGS. 39A-C. In such a method a sacrificial encapsulation layer 2678 can be formed over the surface 2614 of substrate 2612, at least in a peripheral region thereof. The sacrificial layer 2678 can also be formed over a central region of the substrate 2612 to cover the microelectronic element 2622 in a similar manner to the encapsulation layers described with respect to FIG. 1, above. The sacrificial layer 2678 includes at least one opening 2679 and in some embodiments a plurality of openings 2679 to expose the conductive elements 2628. The openings 2679 can be formed during molding of the sacrificial layer 2678 or after molding by etching, drilling, or the like. In one embodiment, a large opening 2679 can be formed to expose all of the conductive elements 2628, while in other embodiments a plurality of large openings 2679 can be formed to expose respective groups of conductive elements 2628. In further embodiments, openings 2679 can be formed that correspond to individual conductive elements 2628. The sacrificial layer 2678 is formed having a surface 2677 at a desired height for the wire bonds 2632 such that the wire bonds 2632 can be formed by bonding bases 2634 thereof to the conductive elements 2628 and then drawing out the wire to reach the surface 2677 of the sacrificial layer 2678. Then, the wire bonds can be drawn laterally of the opening to overlie portions of the surface 2677 of the sacrificial layer 2678. The capillary of the bond forming instrument (such as capillary 804 as shown in FIG. 14) can be moved to press the wire segment into contact with the surface 2677 such that the pressure on the wire between the surface 2677 and the capillary causes the wire to sever on surface 2677, as shown in FIG. 39A.

The sacrificial layer 2678 can then be removed by etching or another similar process. In an example, the sacrificial layer 2678 can be formed from a water soluble plastic material such that it can be removed by exposure to water without affecting the other components of the in-process unit. In another embodiment, sacrificial layer 2678 can be made from a photoimageable material such as a photoresist such that it can be removed by exposure to a light source. A portion of sacrificial layer 2678 can remain between microelectronic element 2622 and surface 2614 of substrate 2612 that can act as an underfill surrounding solder balls 2652. After removal of the sacrificial layer 2678 an encapsulation layer 2642 is formed over the in-process unit to form package. The encapsulation layer 2642 can be similar to those described above and can substantially cover surface 2614 of substrate 2612 and microelectronic element 2622. Encapsulation layer 2642 can further support and separate the wire bonds 2632. In the package shown in FIG. 29C, the wire bonds include portions of the edge surfaces 2639 thereof that are exposed at surface 2644 of the encapsulation layer 2642 and extend substantially parallel thereto. In other embodiments, the wire bonds 2632 and the encapsulation layer 2642 can be planarized to form a surface 2644 with wire bonds that have end surfaces exposed thereon and substantially flush therewith.

The above-described embodiments and variations of the invention can be combined in ways other than as specifically described above. It is intended to cover all such variations which lie within the scope and spirit of the invention.

The invention claimed is:

1. A method comprising:

providing a substrate having a surface having a first region and a second region that at least partially surrounds the first region, the substrate surface having an electrically conductive element in the second region;

disposing a microelectronic element overlying the substrate surface within the first region;

joining a plurality of metal wires to the electrically conductive element;

feeding the metal wires out of a capillary of a bonding tool;

moving the capillary relative to the substrate so that portions of the metal wires extend upward from the substrate;

forming a dielectric encapsulation layer above the substrate surface, wherein the encapsulation layer covers the metal wires and the metal wires are spaced from one another by the encapsulation layer;

removing a portion of the encapsulation layer to expose unencapsulated portions of the metal wires;

providing an electrically conductive material on the dielectric encapsulation layer in electrical connection with the unencapsulated portions of the metal wires.

2. The method of claim 1, wherein the plurality of metal wires are a first plurality of metal wires, the method further comprising joining additional metal wires to the substrate surface such that the plurality of metal wires and the additional metal wires together at least partially surround the microelectronic element.

3. The method of claim 2, wherein the plurality of metal wires and the additional metal wires together substantially surround the microelectronic element.

4. The method of claim 1, wherein the removing of the portion of the encapsulation layer includes forming one or more recesses in which the unencapsulated portions of the metal wires are exposed.

5. The method of claim 4, further comprising filling the one or more recesses with the electrically conductive material.

6. The method of claim 4, further comprising partially filling the one or more recesses with the electrically conductive material.

7. The method of claim 1, wherein the encapsulation layer defines a first surface portion at a first height above the substrate surface in an area overlying the first region of the substrate.

8. The method of claim 7, wherein the removing of the portion of the encapsulation layer includes defining a second surface portion at a second height above the substrate surface in an area overlying the second region of the substrate.

9. The method of claim 8, wherein the second height is less than the first height.

10. The method of claim 1, wherein each of the plurality of metal wires has a thickness in a dimension transverse to a length direction of the metal wire of between about 15 μm and 150 μm.

11. The method of claim 1, wherein each of the plurality of metal wires has a primary metal core of copper, copper alloy, or gold, and a metallic coating that includes palladium.

12. The method of claim 1, further comprising electrically interconnecting the microelectronic element with the electrically conductive element.

13. The method of claim 1, wherein the joining of the metal wires to the electrically conductive elements is performed by ball-bonding.

14. The method of claim 1, wherein each of the metal wires has an edge surface extending between a base and an end thereof, and the unencapsulated portions of the wire bonds are defined by the ends of the wire bonds and portions of edge surfaces adjacent the ends that are uncovered by the dielectric encapsulation layer.

15. The method of claim 1, wherein an end of at least one of the metal wires is displaced in a direction parallel to the surface of the substrate from a base thereof by at least a distance of 100 microns.

16. The method of claim 1, wherein an end of at least one of the metal wires is displaced in a direction parallel to the surface of the substrate from a base thereof by at least a distance of 100 microns.

17. The method of claim 1, further comprising severing each of the metal wires at least by pressing the metal wires into contact with a secondary surface using the capillary so as to form an end of each metal wire remote from a base thereof, an edge surface of each of the metal wires extending between a base and the end.

18. The method of claim 17, wherein formation of at least some of the metal wires includes forming a bend in the metal wire before the severing step.

19. The method of claim 17, wherein the severing step forms tips of the metal wires on which the ends are defined, the metal wires defining a first diameter between the bases and the tips, and the tips having at least one dimension that is smaller than the respective first diameters.

20. The method of claim 19, wherein at least some of the tips of the metal wires further define respective centroids which are offset in a radial direction from axes of cylindrical portions of the respective metal wires.

* * * * *